United States Patent
Shin et al.

(10) Patent No.: US 12,033,628 B2
(45) Date of Patent: Jul. 9, 2024

(54) METHOD FOR CONTROLLING AMBIENT SOUND AND ELECTRONIC DEVICE THEREFOR

(71) Applicant: Samsung Electronics Co., Ltd., Suwon-si (KR)

(72) Inventors: Hoseon Shin, Suwon-si (KR); Chulmin Lee, Suwon-si (KR); Youngwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 323 days.

(21) Appl. No.: 17/545,257

(22) Filed: Dec. 8, 2021

(65) Prior Publication Data
US 2022/0189477 A1    Jun. 16, 2022

Related U.S. Application Data

(63) Continuation of application No. PCT/KR2021/015767, filed on Nov. 3, 2021.

(30) Foreign Application Priority Data

Dec. 14, 2020 (KR) .................. 10-2020-0174848

(51) Int. Cl.
*G10L 15/22* (2006.01)
*G10L 25/87* (2013.01)
*H04R 3/00* (2006.01)

(52) U.S. Cl.
CPC .............. *G10L 15/22* (2013.01); *G10L 25/87* (2013.01); *H04R 3/00* (2013.01); *H04R 2420/07* (2013.01)

(58) Field of Classification Search
CPC .......... G10L 15/22; G10L 25/87; H04R 3/00; H04R 2420/07
See application file for complete search history.

(56) References Cited

U.S. PATENT DOCUMENTS 9,313,572 B2    4/2016    Dusan et al.
9,330,652 B2    5/2016    Jensen et al.
(Continued)

FOREIGN PATENT DOCUMENTS

KR    10-2015-0003528 A    1/2015
KR    1647974 B1    8/2016
(Continued)

OTHER PUBLICATIONS

International Search Report dated Mar. 2, 2022, issued in an International Application No. PCT/KR2021/015767.

*Primary Examiner* — Fan S Tsang
*Assistant Examiner* — David Siegel
(74) *Attorney, Agent, or Firm* — Jefferson IP Law, LLP

(57) ABSTRACT

A wireless audio device is provided. The wireless audio device includes an audio receiving circuit, an audio output circuit, an acceleration sensor, a communication circuit, a processor, and a memory. The memory may store instructions that, when executed by the processor, cause the wireless audio device to detect an utterance of a user of the wireless audio device by using the acceleration sensor, enter a dialog mode in which at least some of ambient sounds received by the audio receiving circuit are output through the audio output circuit, in response to detecting the utterance of the user, and end the dialog mode if no voice is detected for a specified time or longer by using the audio receiving circuit in the dialog mode.

20 Claims, 26 Drawing Sheets

(56) References Cited

U.S. PATENT DOCUMENTS

| | | |
|---|---|---|
| 9,374,647 B2 | 6/2016 | Han et al. |
| 9,438,985 B2 | 9/2016 | Dusan et al. |
| 9,706,284 B2 | 7/2017 | Lott |
| 9,992,567 B2 | 6/2018 | Lott |
| 10,074,355 B2 | 9/2018 | Goldman |
| 10,397,687 B2 | 8/2019 | Watts et al. |
| 10,542,357 B2 | 1/2020 | Lee et al. |
| 11,134,330 B2 | 9/2021 | Watts et al. |
| 2014/0086425 A1 | 3/2014 | Jensen et al. |
| 2014/0093091 A1 | 4/2014 | Dusan et al. |
| 2015/0003651 A1 | 1/2015 | Han et al. |
| 2015/0215701 A1* | 7/2015 | Usher .................. H04R 1/1041 381/71.6 |
| 2017/0193978 A1 | 7/2017 | Goldman |
| 2017/0318377 A1* | 11/2017 | Lott .................... H04R 1/1041 |
| 2017/0365249 A1 | 12/2017 | Dusan et al. |
| 2018/0241863 A1 | 8/2018 | Lee et al. |
| 2020/0396533 A1* | 12/2020 | Meiyappan ............. G10L 15/22 |
| 2021/0125609 A1* | 4/2021 | Dusan ..................... G10L 25/21 |
| 2021/0329361 A1 | 10/2021 | Kim |
| 2021/0329369 A1 | 10/2021 | Kim |
| 2021/0329370 A1 | 10/2021 | Kim |
| 2022/0070585 A1* | 3/2022 | Chen ................... H04R 1/1041 |

FOREIGN PATENT DOCUMENTS

| | | |
|---|---|---|
| KR | 10-2017-0025840 A | 3/2017 |
| KR | 1802764 B1 | 11/2017 |
| KR | 1861357 B1 | 5/2018 |
| KR | 10-2020-0019954 A | 2/2020 |
| KR | 10-2020-0056329 A | 5/2020 |
| KR | 10-2190283 B1 | 12/2020 |
| KR | 10-2369589 B1 | 3/2022 |

* cited by examiner

METHOD FOR CONTROLLING AMBIENT SOUND AND ELECTRONIC DEVICE THEREFOR

CROSS-REFERENCE TO RELATED APPLICATION(S)

This application is a continuation application, claiming priority under § 365(c), of an International application No. PCT/KR2021/015767, filed on Nov. 3, 2021, which was based on and claimed the benefit of a Korean patent application number 10-2020-0174848, filed on Dec. 14, 2020, in the Korean Intellectual Property Office, the disclosure of which is incorporated by reference herein in its entirety.

TECHNICAL FIELD

The disclosure relates to a method for controlling an ambient sound and an electronic device therefor.

BACKGROUND ART

Wireless audio devices such as earbuds are widely used. The wireless audio device may be wirelessly connected to an electronic device, such as mobile phones, to output audio data received from the mobile phones. Since the wireless audio device is wirelessly connected to the electronic device, user convenience may be increased. The increase in convenience may lead to an increase in the wearing time of the wireless audio device of a user.

The wireless audio device may be worn on the ears of the user. The user who is wearing the wireless audio device may be difficult to hear external sounds. To allow a wearer of the wireless audio device to hear external sounds, the wireless audio device may output an ambient sound. For example, the wireless audio device may output a sound received by a microphone of the wireless audio device in real time, thereby providing an ambient sound to the user.

The above information is presented as background information only to assist with an understanding of the disclosure. No determination has been made, and no assertion is made, as to whether any of the above might be applicable as prior art with regard to the disclosure.

DISCLOSURE

Technical Problem

To allow a user to hear ambient sounds, the user may configure the wireless audio device so as to provide the ambient sound. For example, a user may change settings of the wireless audio device by using an electronic device connected to the wireless audio device. However, when a user listens to music by using the wireless audio device, the user may be disturbed from listening to music due to ambient sound. Accordingly, the user may tend to deactivate an ambient sound providing function.

Another person may talk to the user while the user has deactivated the ambient sound providing function. For a conversation with another person, for example, the user may need to pull out an electronic device from a pocket and activate the ambient sound providing function. Due to the complexity of the operation of the electronic device, the user may prefer to simply stop using the wireless audio device rather than to activate the ambient sound providing function. For example, the user may stop wearing the wireless audio device. This may lead to deterioration in the user's experience of the wireless audio device.

Various embodiments disclosed in the disclosure may provide an electronic device and a method for solving the above-described problems.

Technical Solution

Aspects of the disclosure are to address at least the above-mentioned problems and/or disadvantages and to provide at least the advantages described below. Accordingly, an aspect of the disclosure is to provide a wireless audio device including an audio receiving circuit, an audio output circuit, an acceleration sensor, a communication circuit, a processor, and a memory, in which the memory stores instructions that, when executed by the processor, cause the wireless audio device to detect an utterance of a user of the wireless audio device by using the acceleration sensor enter a dialog mode in which at least some of ambient sounds received by the audio receiving circuit are output through the audio output circuit, in response to detecting the utterance of the user, and end the dialog mode if no voice is detected for a specified time or longer by using the audio receiving circuit in the dialog mode.

Another aspect of the disclosure is to provide a method for controlling a dialog mode of a wireless audio device, the method including detecting an utterance of a user of the wireless audio device based on an acceleration of the wireless audio device, entering a dialog mode for outputting at least some of ambient sounds, in response to detecting the utterance of the user, and ending the dialog mode if no voice is detected for a specified time or longer in the dialog mode.

Another aspect of the disclosure is to provide a wireless audio device including at least one internal microphone facing a user when the wireless audio device is worn, at least one external microphone exposed to an outside when the wireless audio device is worn, an audio output circuit, an acceleration sensor, a communication circuit, a processor, and a memory, in which the memory stores instructions that, when executed by the processor, cause the wireless audio device to detect an utterance of a user of the wireless audio device by using the at least one internal microphone and the acceleration sensor, determine whether the utterance of the user corresponds to an utterance for calling a voice agent, enter a dialog mode in which at least some of ambient sounds received by the at least one external microphone are output through the audio output circuit, if the utterance of the user does not correspond to the utterance for calling the voice agent, and end the dialog mode if no voice is detected for a specified time or longer through the at least one external microphone in the dialog mode.

Additional aspects will be set forth in part in the description which follows and, in part, will be apparent from the description, or may be learned by practice of the presented embodiments.

Advantageous Effects

The electronic device according to an embodiment disclosed in the disclosure may improve the function of the wireless audio device by providing ambient sound based on the utterance of the wearer.

The electronic device according to an embodiment disclosed in the disclosure may improve sound quality by providing sound in consideration of the surrounding environment.

The electronic device according to an embodiment disclosed in the disclosure may improve the user experience by controlling the dialog mode based on the utterance of the wearer and the utterance of another person.

The electronic device according to an embodiment disclosed in the disclosure may provide a function that meets the intention of the user by controlling the dialog mode in consideration of the voice agent call operation.

Besides, various effects may be provided that are directly or indirectly identified through the disclosure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

MODE FOR CARRYING OUT THE DISCLOSURE

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
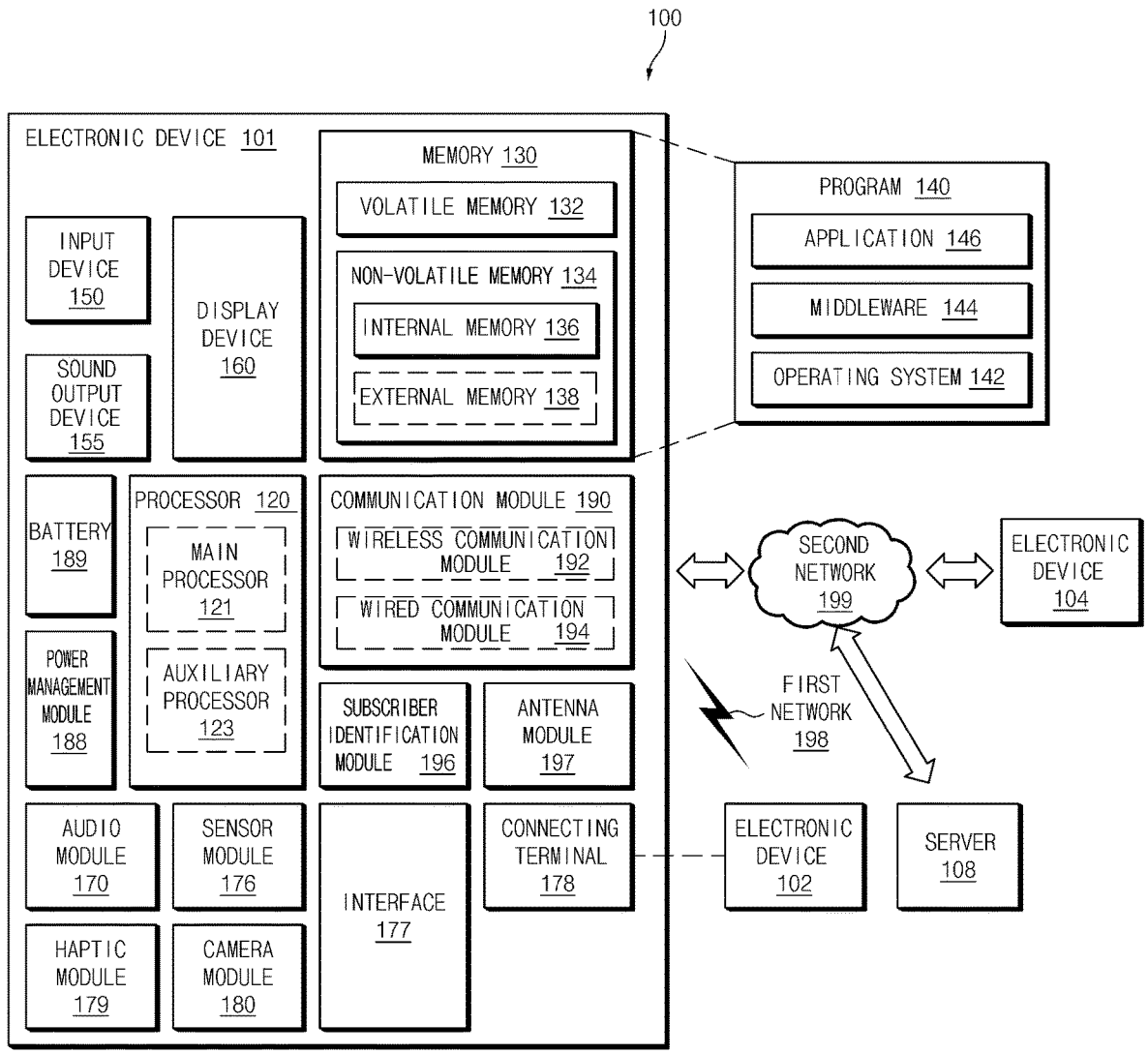
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
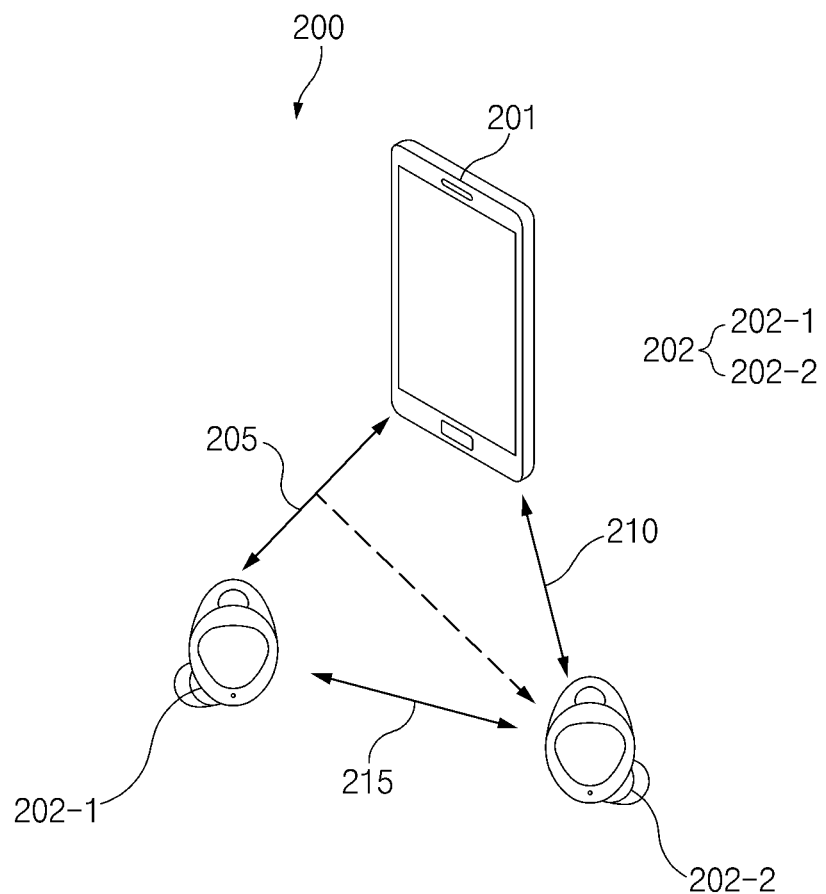
FIG. 2 illustrates a communication environment between a wireless audio device and an electronic device according to an embodiment of the disclosure.

FIG. 2 illustrates a communication environment between a wireless audio device and an electronic device according to an embodiment of the disclosure.

Referring to FIG. 2, an electronic device 201 and a wireless audio device 202 (e.g., a first wireless audio device 202-1 and/or a second wireless audio device 202-2) may include the same or similar components as at least a part of the electronic device 101 illustrated in FIG. 1, and may perform, at least partially, the same or similar functions. Hereinafter, the term "wireless audio device 202" may be referred to as the first wireless audio device 202-1, the second wireless audio device 202-2, or first and second wireless audio devices 202-1 and 202-2, unless otherwise described. The electronic device 201 may include, for example, a user terminal such as a smartphone, tablet, desktop computer, or laptop computer. The wireless audio device 202 may include, but is not limited to, a wireless earphone, a headset, earbuds, or a speaker. The wireless audio device 202 may include various types of devices (e.g., a hearing aid or a portable sound device) that receive an audio signal and output the received audio signal. The term "wireless audio device" is used to distinguish it from the electronic device 201, and the "wireless audio device" may be referred to as an electronic device, a wireless earphone, an earbud, a true wireless stereo (TWS), or an ear set.

For example, the electronic device 201 and the wireless audio device 202 may perform wireless communication in a short range through a Bluetooth network defined by a Bluetooth™ special interest group (SIG). The Bluetooth network may include, for example, a Bluetooth legacy network or a Bluetooth low energy (BLE) network. According to an embodiment, the electronic device 201 and the wireless audio device 202 may perform wireless communication through one of the Bluetooth legacy network and the BLE network, or may perform wireless communication through two networks.

According to an embodiment, the electronic device 201 may serve as a primary device (e.g., a master device), and the wireless audio device 202 may serve as a secondary device (e.g., a slave device). The number of devices serving as the secondary device is not limited to the example illustrated in FIG. 2. According to an embodiment, determination may be made as to which device serves as the primary device or the secondary device in an operation in which a link (e.g., 205, 210, and/or 215) between devices is created. According to another embodiment, one of the first wireless audio device 202-1 and the second wireless audio device 202-2 (e.g., the first wireless audio device 202-1) may serve as the primary device, and the other may serve as the secondary device.

According to an embodiment, the electronic device 201 may transmit, to the wireless audio device 202, a data packet including content such as text, audio, image, or video. At least one of the wireless audio devices 202 may also transmit the data packet to the electronic device 201. For example, if music is played on the electronic device 201, the electronic device 201 may transmit a data packet including contents (e.g., music data) to the wireless audio device 202 through a created link (e.g., the first link 205 and/or the second link 210). For example, at least one of the wireless audio devices 202 may transmit a data packet including contents (e.g., audio data) to the electronic device 201 through the created link. When the electronic device 201 transmits a data packet, the electronic device 201 may be referred to as a source device, and the wireless audio device 202 may be referred to as a sink device.

The electronic device 201 may create or establish a link with at least one device 202-1 and/or 202-2 among the wireless audio devices 202 in order to transmit a data packet. For example, the electronic device 201 may create the first link 205 with the first wireless audio device 202-1 and/or the second link 210 with the second wireless audio device 202-2 based on a Bluetooth or BLE protocol. In an embodiment, the electronic device 201 may communicate with the first wireless audio device 202-1 through the first link 205 with the first wireless audio device 202-1. In this case, for example, the second wireless audio device 202-2 may be configured to monitor the first link 205. For example, the second wireless audio device 202-2 may receive data transmitted by the electronic device 201 through the first link 205 by monitoring the first link 205.

According to an embodiment, the second wireless audio device 202-2 may monitor the first link 205 using information associated with the first link 205. The information associated with the first link 205 may include address information (e.g., the Bluetooth address of the primary device of the first link 205, the Bluetooth address of the electronic device 201, and/or the Bluetooth address of the first wireless audio device 202-1), piconet (e.g., a topology 200) clock information (e.g., clock native (CLKN) of the primary device of the first link 205), logical transport (LT) address information (e.g., information allocated by the primary device of the first link 205), used channel map information, link key information, service discovery protocol (SDP) information (e.g., service and/or profile information associated with the first link 205), and/or supported feature information.

Figure 3:
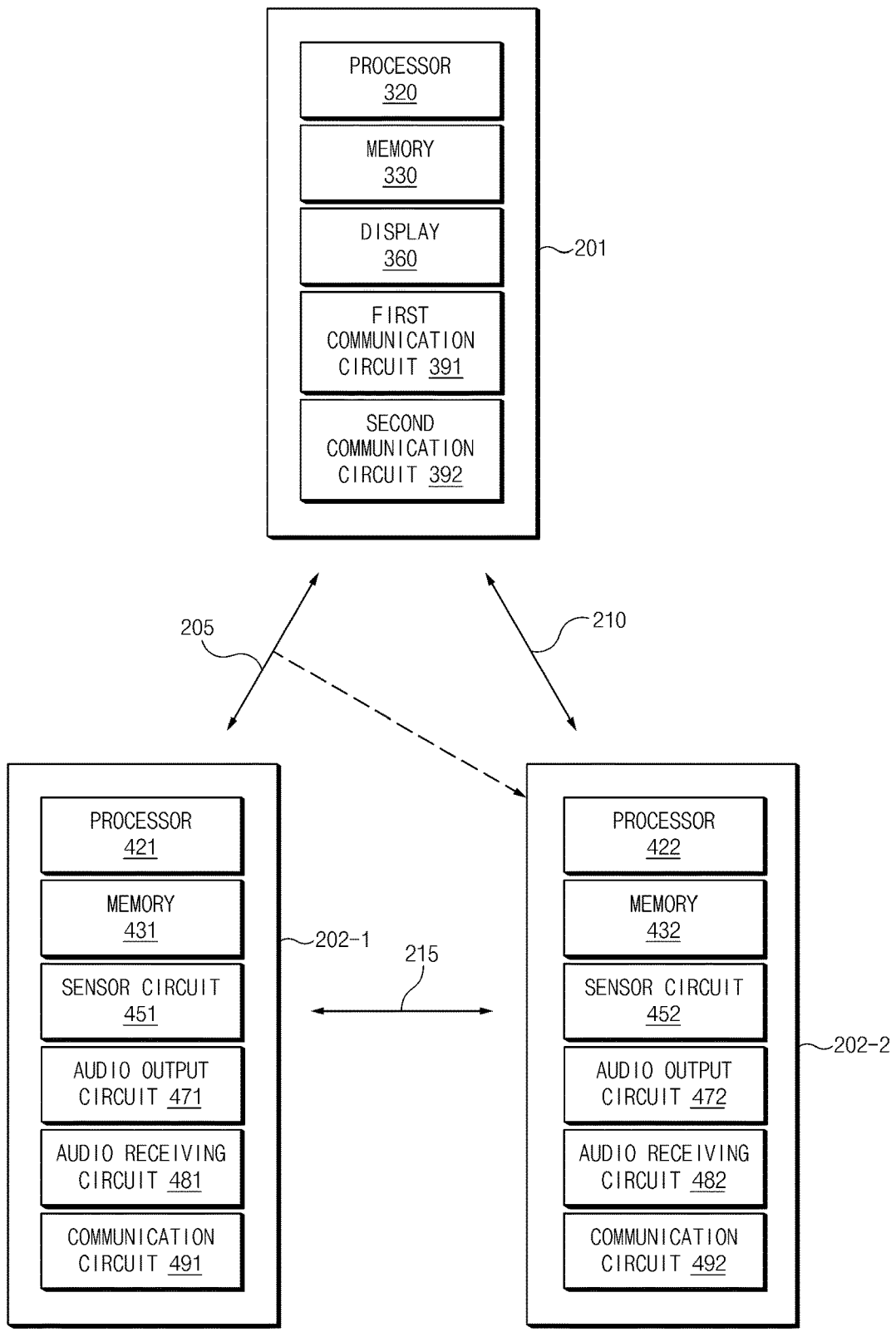
FIG. 3 illustrates a block diagram of the electronic device and wireless audio devices according to an embodiment of the disclosure.

FIG. 3 illustrates a block diagram of the electronic device and wireless audio devices according to an embodiment of the disclosure.

Referring to FIG. 3, according to an embodiment, the electronic device 201 may include a processor 320 (e.g., the processor 120 of FIG. 1), a memory 330 (e.g., the memory 130 of FIG. 1), a first communication circuit 391 (e.g., the communication module 190 of FIG. 1), a display 360 (e.g., the display module 160 of FIG. 1), and/or a second communication circuit 392 (e.g., the communication module 190 of FIG. 1). The processor 320 may be operatively connected to the memory 330, the display 360, the first communication circuit 391, and the second communication circuit 392. The memory 330 may store one or more instructions that, when executed, cause the processor 320 to perform various operations of the electronic device 201. The communication circuit 390 may be configured to support wireless communication based on a Bluetooth protocol (e.g., Bluetooth legacy and/or BLE). The first communication circuit 391 may be configured to support communication based on a wireless communication standard (e.g., cellular and/or Wi-Fi) excluding the Bluetooth protocol. The electronic device 201 may further include a component not illustrated in FIG. 3. For example, the electronic device 201 may further include an audio input/output device (e.g., the audio module 170 of FIG. 1), and/or a housing.

The electronic device 201 may be connected to the first wireless audio device 202-1 through the first link 205. For example, the electronic device 201 and the first wireless audio device 202-1 may communicate with each other using a time slot set based on the clock of the primary device of the first link 205 as a unit. The electronic device 201 may be connected to the second wireless audio device 202-2 through the second link 210. For example, the electronic device 201 may establish the second link 210 after the connection with the first wireless audio device 202-1. In an example, the second link 210 may be omitted.

According to an embodiment, the first wireless audio device 202-1 may include a processor 421 (e.g., the processor 120 of FIG. 1), a memory 431 (e.g., the memory 130 of FIG. 1), a sensor circuit 451 (e.g., the sensor module 176 of FIG. 1), an audio output circuit 471 (e.g., the audio module 170 of FIG. 1), an audio receiving circuit 481 (e.g., the audio module 170 of FIG. 1), and/or a communication circuit 491 (e.g., the communication module 190 of FIG. 1).

The processor 421 may be operatively or electrically connected to the sensor circuit 451, the communication circuit 491, the audio output circuit 471, the audio receiving circuit 481, and the memory 431.

The sensor circuit 451 may include at least one sensor. The sensor circuit 451 may detect information on a wearing state of the first wireless audio device 202-1, biometric information of the wearer, and/or motion. For example, the sensor circuit 451 may include a proximity sensor for detecting a wearing state, a biometric sensor (e.g., a heart rate sensor) for detecting biometric information, and/or a motion sensor (e.g., an acceleration sensor) for detecting motion. In an example, the sensor circuit 451 may further include at least one of a bone conduction sensor and an acceleration sensor. In another embodiment, the acceleration sensor may be disposed close to the skin to detect bone conduction. For example, the acceleration sensor may be configured to detect vibration information in kHz units by using sampling in kHz units, which is relatively higher than general motion sampling. The processor 421 may use a vibration about a significant axis (at least one of the x, y, and z axes) in the vibration information of the acceleration sensor to perform voice identification, voice detection, tap detection, and/or wear detection in a noisy environment.

The audio output circuit 471 may be configured to output sound. The audio receiving circuit 481 may include one or a plurality of microphones. The audio receiving circuit 481 may be configured to obtain an audio signal by using one or a plurality of microphones. In an embodiment, each of the plurality of microphones may correspond to a different audio reception path. For example, if the audio receiving circuit 481 includes a first microphone and a second microphone, the audio signal acquired by the first microphone and the audio signal obtained by the second microphone may be referred to as different audio channels. The processor 421 may obtain audio data by using at least one of the plurality of microphones connected to the audio receiving circuit 481. The processor 421 may, for example, dynamically select or determine at least one microphone for obtaining audio data from among the plurality of microphones. The processor 421 may obtain audio data by performing beamforming using the plurality of microphones. The memory 431 may store one or more instructions that, when executed, cause the processor 421 to perform various operations of the first wireless audio device 202-1.

According to an embodiment, the processor 421 may obtain audio data by using at least one of the audio receiving circuit 481 and the sensor circuit 451. For example, the processor 421 may obtain audio data by using one or more microphones connected to the audio receiving circuit 481. The processor 421 may obtain audio data by detecting a vibration corresponding to the audio signal by using the sensor circuit 451. For example, the processor 421 may obtain audio data by using at least one of a motion sensor, a bone conduction sensor, and an acceleration sensor. The processor 421 may be configured to process (e.g., noise suppression, noise cancellation, or echo cancellation) audio data obtained through various paths (e.g., at least one of the audio receiving circuit 481 or the sensor circuit 451).

The first wireless audio device 202-1 may further include a configuration not illustrated in FIG. 3. For example, the first wireless audio device 202-1 may further include an indicator (e.g., the display module 160 of FIG. 1), an input interface (e.g., the interface 177 of FIG. 1), and/or a housing.

According to an embodiment, the second wireless audio device 202-2 may include a processor 422 (e.g., the processor 120 of FIG. 1), a memory 432 (e.g., the memory 130 of FIG. 1), a sensor circuit 452 (e.g., the sensor module 176 of FIG. 1), an audio output circuit 472 (e.g., the audio module 170 of FIG. 1), an audio receiving circuit 482, and/or a communication circuit 492 (e.g., the communication module 190 of FIG. 1).

The processor 422 may be operatively connected to communication circuit 492, the audio output circuit 472, the audio receiving circuit 482, and the memory 432.

The sensor circuit 452 may detect information on a wearing state of the second wireless audio device 202-2, biometric information of the wearer, and/or motion information. For example, the sensor circuit 452 may include a proximity sensor for detecting a wearing state, a biometric sensor (e.g., a heart rate sensor) for detecting biometric information, and/or a motion sensor (e.g., an acceleration sensor) for detecting motion. In an example, the sensor circuit 452 may further include at least one of a bone conduction sensor and an acceleration sensor. In another embodiment, the acceleration sensor may be disposed close to the skin to detect bone conduction. For example, the acceleration sensor may be configured to detect vibration information in kHz units by using sampling in kHz units, which is relatively higher than general motion sampling. The processor 422 may use a vibration around a significant axis (at least one of the x, y, and z axes) in the vibration information of the acceleration sensor to perform voice identification, voice detection, tap detection, and/or wear detection in a noisy environment.

The audio output circuit 472 may be configured to output sound. The audio receiving circuit 482 may include one or a plurality of microphones. The audio receiving circuit 482 may be configured to obtain an audio signal by using one or a plurality of microphones. In an embodiment, each of the plurality of microphones may correspond to a different audio reception path. For example, if the audio receiving circuit 482 includes a first microphone and a second microphone, the audio signal obtained by the first microphone and the audio signal acquired by the second microphone may be referred to as different audio channels. The processor 422 may obtain audio data by performing beamforming using the plurality of microphones.

The memory 432 may store one or more instructions that, when executed, cause the processor 422 to perform various operations of the second wireless audio device 202-2.

According to an embodiment, the processor 422 may obtain audio data by using at least one of the audio receiving circuit 482 and the sensor circuit 452. For example, the processor 422 may obtain audio data by using one or more microphones connected to the audio receiving circuit 482. The processor 422 may obtain audio data by detecting a vibration corresponding to the audio signal by using the sensor circuit 452. For example, the processor 422 may obtain audio data by using at least one of a motion sensor, a bone conduction sensor, and an acceleration sensor. The processor 422 may be configured to process (e.g., noise suppression, noise cancellation, or echo cancellation) audio data obtained through various paths (e.g., at least one of the audio receiving circuit 482 or the sensor circuit 452).

The second wireless audio device 202-2 may further include a configuration not illustrated in FIG. 3. For example, the second wireless audio device 202-2 may further include an indicator (e.g., the display module 160 of FIG. 1), an audio input device (e.g., the audio module 170 of FIG. 1), an input interface (e.g., the interface 177 of FIG. 1), and/or a housing.

Figure 4:
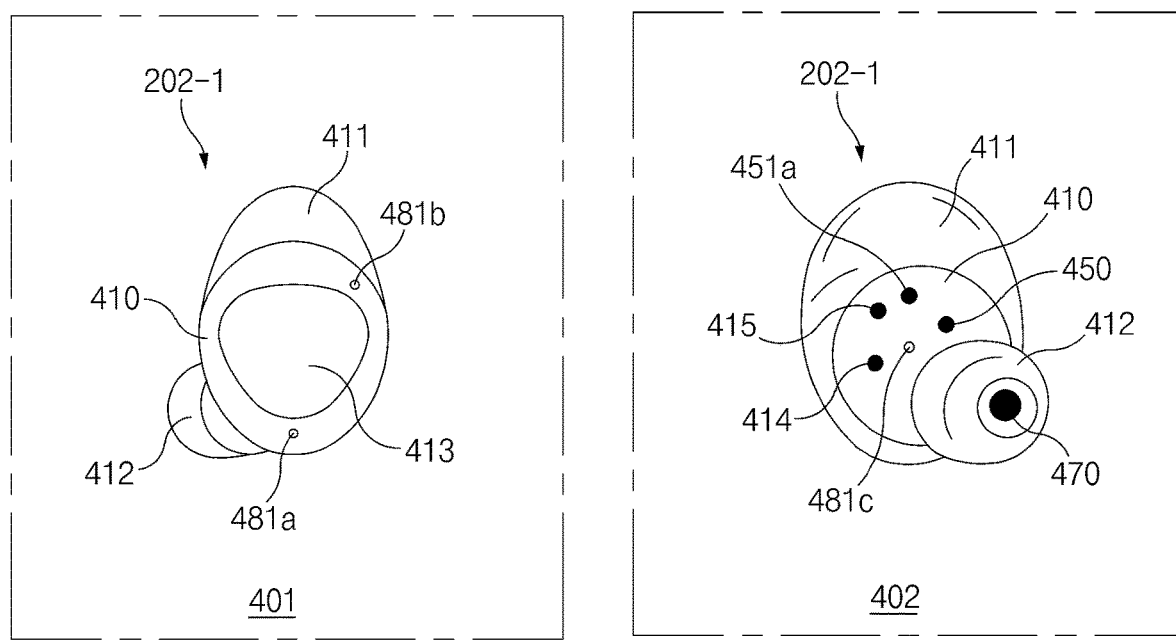
FIG. 4 illustrates a front view and a rear view of a first wireless audio device according to an embodiment of the disclosure.

FIG. 4 illustrates a front view and a rear view of the first wireless audio device according to an embodiment of the disclosure.

Referring to FIG. 4, a structure of the first wireless audio device 202-1 will be described. Although duplicate descriptions are omitted for convenience of description, the second wireless audio device 202-2 may also have the same or similar structure as the first wireless audio device 202-1.

Reference numeral 401 illustrates a front view of the first wireless audio device 202-1. The first wireless audio device 202-1 may include a housing 410. The housing 410 may form at least a part of the exterior of the first wireless audio device 202-1. The housing 410 may include a button 413 and a plurality of microphones 481a and 481b, which are disposed on a first surface (e.g., the surface facing the outside when worn) thereof. The button 413 may be configured to receive a user input (e.g., a touch input or a push input). A first microphone 481a and a second microphone 481b may be included in the audio receiving circuit 481 of FIG. 3. The first microphone 481a and the second microphone 481b may be disposed to detect sound in a direction facing the outside of the user when the first wireless audio device 202-1 is worn. The first microphone 481a and the second microphone 481b may be referred to as external microphones. The first microphone 481a and the second microphone 481b may detect sound outside the housing 410. For example, the first microphone 481a and the second microphone 481b may detect a sound generated in the vicinity of the first wireless audio device 202-1. The sound of the surrounding environment that is detected by the first wireless audio device 202-1 may be output by the speaker 470. In an embodiment, the first microphone 481a and the second microphone 481b may be sound pickup microphones for a noise canceling function (e.g., active noise cancellation (ANC)) of the first wireless audio device 202-1. In addition, the first microphone 481a and the second microphone 481b may be sound pickup microphones for an ambient sound listening function (e.g., a transparency function or an ambient aware function) of the first wireless audio device 202-1. For example, the first microphone 481a and the second microphone 481b may include various types of microphones including an electronic condenser microphone (ECM) and a micro electro mechanical system (MEMS) microphone. A wing tip 411 may be coupled to the circumference of the housing 410. The wing tip 411 may be formed of an elastic material. The wing tip 411 may be detached from the housing 410 or attached to the housing 410. The wing tip 411 may improve the wearability of the first wireless audio device 202-1.

Reference numeral 402 shows a rear view of the first wireless audio device 202-1. The first wire audio device 202-1 may include a first electrode 414, a second electrode 415, a proximity sensor 450, a third microphone 481c, and a speaker 470, which are disposed on a second surface (e.g., the surface facing the user when worn) of the housing 410. The speaker 470 may be included in the audio output circuit 471 of FIG. 3. The speaker 470 may convert an electrical signal into a sound signal. The speaker 470 may output a sound to the outside of the first wireless audio device 202-1. For example, the speaker 470 may convert an electrical signal into a sound that the user may audibly recognize and output the sound. At least a portion of the speaker 470 may be disposed inside the housing 410. The speaker 470 may be coupled to the ear tip 412 through one end of the housing 410. The ear tip 412 may be formed in a cylindrical shape with a hollow formed therein. For example, if the ear tip 412 is coupled to the housing 410, the sound (audio) output from the speaker 470 may be transmitted to an external object (e.g., a user) through the hollow of the ear tip 412.

According to an embodiment, the first wireless audio device 202-1 may include a sensor 451a (e.g., an acceleration sensor, a bone conduction sensor, and/or a gyro sensor) disposed on the second surface of the housing 410. The position and shape of the sensor 451a illustrated in FIG. 4 are exemplary, and embodiments of the disclosure are not limited thereto. For example, the sensor 451a may be disposed inside the housing 410 so as not to be exposed to the outside. The sensor 451a may be located at a position that may contact with the ear of the wearer or at a portion of the housing 410 that contacts the ear of the wearer, when worn.

The ear tip 412 may be formed of an elastic material (or a flexible material). The ear tip 412 may assist the first wireless audio device 202-1 to be inserted in close contact with the ear of the user. For example, the ear tip 412 may be formed of a silicon material. At least one region of the ear tip 412 may be deformed conforming to the shape of the external object (e.g., the shape of the ear kernel). According to various embodiments of the disclosure, the ear tip 412 may be formed of a combination of at least two of silicone, foam, and plastic material. For example, a region of the ear tip 412 which is inserted into the ear of the user and abuts against it may be formed of a silicone material, and a region into which the housing 410 is inserted may be formed of a plastic material. The ear tip 412 may be detached from the housing 410 or attached to the housing 410. The first electrode 414 and the second electrode 415 may be connected to an external power source (e.g., a case) and receive an electrical signal from the external power source. The proximity sensor 450 may be used to detect a wear state of the user. The proximity sensor 450 may be disposed inside the housing 410. The proximity sensor 450 may be disposed such that at least a portion thereof is exposed as the exterior of the first wireless audio device 202-1. The first wireless audio device 202-1 may determine whether the first wireless audio device 202-1 is worn by the user based on data measured by the proximity sensor 450. For example, the proximity sensor 450 may include an IR sensor. The IR sensor may detect whether or not the housing 410 is in contact with the body of the user, and the first wireless audio device 202-1 may determine whether the first wireless audio device 202-1 is worn based on the detection of the IR sensor. The proximity sensor 450 is not limited to the IR sensor, and may be implemented by using various types of sensors (e.g., an acceleration sensor or a gyro sensor). The third microphone 481c may be disposed to detect a sound in a direction toward the user when the first wireless audio device 202-1 is worn. The third microphone 481c may be referred to as an internal microphone.

Figure 5:
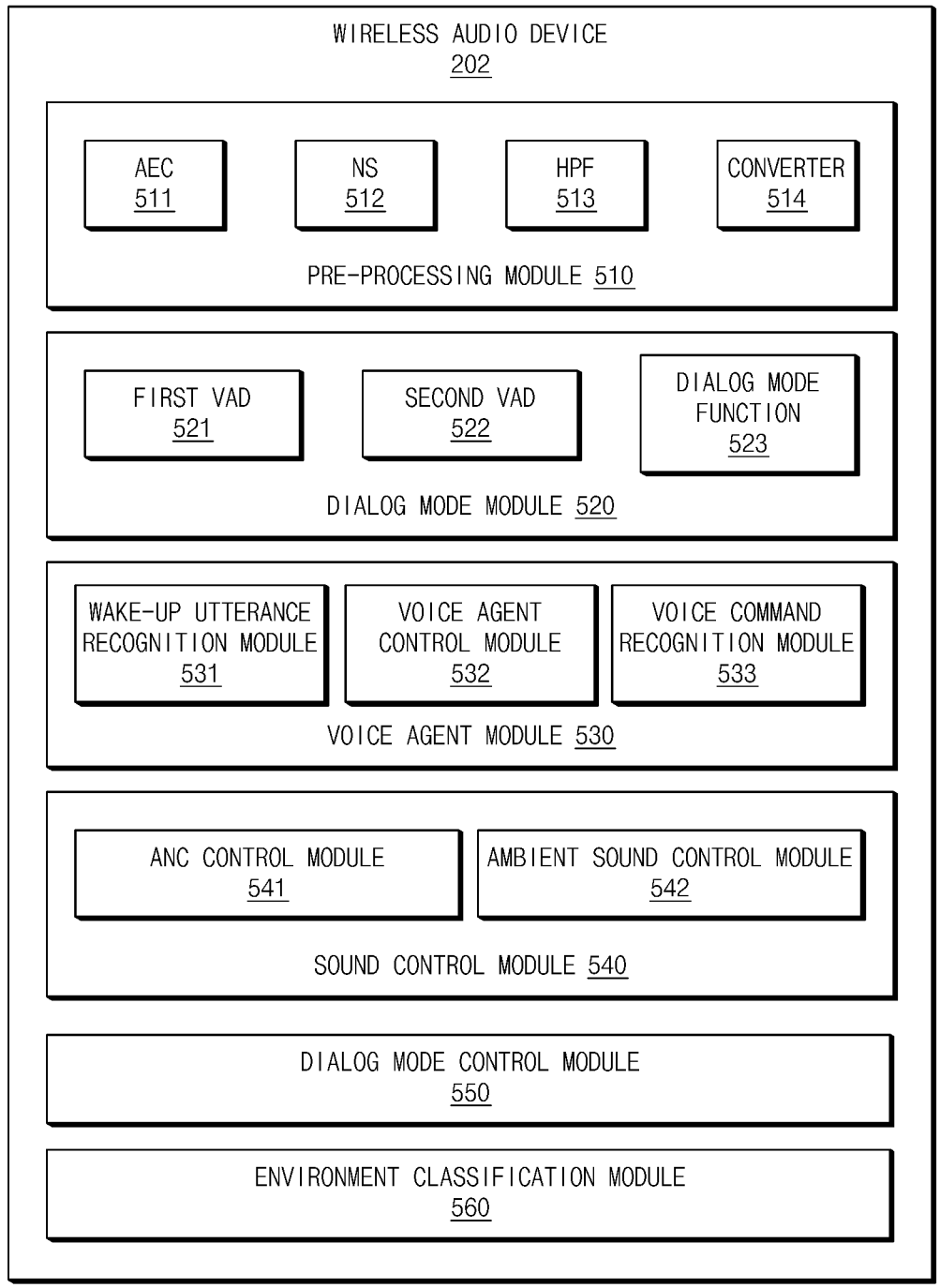
FIG. 5 illustrates a block diagram of the wireless audio device according to an embodiment of the disclosure.

FIG. 5 illustrates a block diagram of the wireless audio device according to an embodiment of the disclosure.

Referring to FIG. 5, components of the wireless audio device 202 may include example software modules. For example, the components may be implemented by the first wireless audio device 202-1 or the second wireless audio device 202-2. At least some of the components may be omitted. At least some of the components may be implemented as one software module. The separation of the components is logical, and any program, thread, application, or code performing the same function may correspond to the components.

A pre-processing module 510 may perform pre-processing on an audio (or audio signal) received by using an audio receiving circuit (e.g., the audio receiving circuit 481 or 482 of FIG. 3). For example, the pre-processing module 510 may cancel an echo of an audio signal obtained by using an acoustic echo canceller (AEC) 511. The pre-processing module 510 may reduce noise of an audio signal obtained by using noise suppression (NS) 512. The pre-processing module 510 may reduce a signal of a specified band of an audio signal obtained by using a high pass filter (HPF) 513. The pre-processing module 510 may change a sampling rate of the audio input signal by using a converter 514. For example, the converter 514 may be configured to perform down-sampling or up-sampling on the audio input signal. The pre-processing module 510 may selectively apply at least one of the AEC 511, the NS 512, the HPF 513, and the converter 514 to the audio signal.

A dialog mode module 520 may determine the start and end of the dialog mode. For example, the dialog mode module 520 may detect the utterance of a wearer (e.g., a user) of the wireless audio device 202 by using a first voice activity detection (VAD) 521. The dialog mode module 520 may use the second VAD 522 to detect the utterance of the wearer and the utterance of an outsider. The dialog mode module 520 may identify and/or specify an utterance section of the wearer through the first VAD 521. The dialog mode module 520 may identify and/or specify an utterance section of the wearer through the first VAD 521 and the second VAD 522. For example, the dialog mode module 520 may identify and/or specify the utterance section of an outsider by excluding the section in which the utterance of the wearer is identified through the first VAD 521, among the sections in which the utterance is identified through the second VAD 522. The dialog mode module 520 may determine whether to execute and end the voice agent by using the first VAD 521, the second VAD 522, and a dialog mode function 523.

According to an embodiment, the dialog mode module 520 may detect utterance of the user and the utterance of the outsider by using the first VAD 521 and the second VAD 522. In an example, the dialog mode module 520 may perform at least one of the first VAD 521 or the second VAD 522 by using the audio signal which has been pre-processed by the pre-processing module 510 or the audio signal which has not been pre-processed by the pre-processing module 510. Referring to FIG. 3, the wireless audio device 202 may receive audio signals by using audio receiving circuits 481 and 482. The wireless audio device 202 may detect the motion of the wireless audio device 202 by using the sensor circuits 451 and 452 (e.g., a motion sensor, an acceleration sensor, and/or a gyro sensor). For example, if an audio signal (e.g., a voice signal) of a specified size or larger is detected in a specified band (e.g., a human voice range), the wireless audio device 202 may detect the voice signal from the audio signal. If a specified motion is detected simultaneously or substantially simultaneously while the voice signal is detected, the wireless audio device 202 may detect the utterance of the user (e.g., the utterance of the wearer) based on the voice signal. For example, the specified motion may be a motion detected by the wireless audio device 202 from the utterance of the wearer of the wireless audio device 202. For example, the motion from the utterance of the wearer may be transmitted to a motion sensor, an acceleration sensor, and/or a gyro sensor in the form of motion or vibration. The motion from the utterance of the wearer may be introduced into the motion sensor, the acceleration sensor, and/or the gyro sensor in a form similar to the input of the bone conduction microphone. The wireless audio device 202 may obtain information on the start time and end time of the utterance of the wearer based on the specified motion and voice signal. If the specified motion is not detected simultaneously or substantially simultaneously while the voice signal is detected, the wireless audio device 202 may detect the utterance of an outsider (e.g., the utterance of a person other than the wearer (e.g., outside or the other person)) based on the voice signal. The wireless audio device 202 may obtain information on the start time and end time of the utterance of the outsider based on the specified motion and voice signal. The dialog mode module 520 may store information on the start and end times of the utterance of the user or outsider in the memory 431 or 432, and determine the start or end of the dialog mode based on the information stored in the memory 431 or 432.

For example, the first VAD 521 and the second VAD 522 may be serial processes. If a voice signal is detected by using the second VAD 522, the wireless audio device 202 detects a motion by using a motion sensor (e.g., an acceleration sensor and/or a gyro sensor), thereby identifying the voice signal corresponding to the utterance of the user.

For example, the first VAD 521 and the second VAD 522 may be parallel processes. For example, the first VAD 521 may be configured to detect the utterance of the user independently of the second VAD 522. The second VAD 522 may be configured to detect a voice signal regardless of whether the user utters.

For example, the wireless audio device 202 may use different microphones to detect the utterance of the user and the utterance of an outsider. The wireless audio device 202 may use an external microphone (e.g., the first microphone 481a and the second microphone 481b of FIG. 4) to detect the utterance of an outsider. The wireless audio device 202 may use an internal microphone (e.g., the third microphone 481c of FIG. 4) to detect the utterance of the user. When an internal microphone is used, the wireless audio device 202 may determine whether the wearer utters based on a voice signal and motion information based on the internal microphone. The wireless audio device 202 may determine whether the user utters based on a voice signal introduced as a sensor input in order to detect the utterance of the user. The signal introduced as the sensor input may include at least one of an acceleration sensor and a gyro sensor inputs.

According to an embodiment, the dialog mode module 520 may determine the start of the dialog mode by using the first VAD 521 and/or the second VAD 522. In the dialog mode OFF state, the dialog mode module 520 may determine whether to start the dialog mode. For example, the dialog mode module 520 may determine the start of the dialog mode if the utterance of the user is maintained for a specified time interval (e.g., is in FIGS. 8, 9, and 10). For another example, the dialog mode module 520 may determine the start of the dialog mode if the utterance of the other person is maintained for a specified time interval after the end of the utterance of the user.

According to an embodiment, the dialog mode module 520 may determine whether to maintain or end the dialog mode by using the first VAD 521 and/or the second VAD 522. In the dialog mode ON state, the dialog mode module 520 may determine whether to maintain or end the dialog mode. For example, during the dialog mode, the dialog mode module 520 may determine the end of the dialog mode if no voice signal is detected for a specified time interval (e.g., te in FIGS. 8, 9, and 10). During the dialog mode, the dialog mode module 520 may determine that the dialog mode is maintained if a voice signal is detected within a specified time interval (e.g., te in FIGS. 8, 9, and 10) from the end of the previous voice signal.

According to an embodiment, the dialog mode module 520 may determine the start and/or end of the dialog mode based on the dialog mode function 523. The dialog mode function 523 may detect the start and/or end of the dialog mode based on a user input. For example, the user input may include a voice command of the user, a touch input of the user, or a button input of the user.

According to an embodiment, the dialog mode module 520 may determine the length of the specified time interval (e.g., to in FIGS. 8, 9, and 10) based on ambient sounds. For example, the dialog mode module 520 may determine the length of the specified time interval based on at least one of a sensitivity of a background noise of a sound obtained by using an external microphone, a value of an SNR, or a type of noise. In a noisy environment, the dialog mode module 520 may increase the length of the specified time interval.

According to an embodiment, the dialog mode module 520 may determine the start and/or end of the dialog mode based on the voice command of the user. In an example, a voice agent module 530 may detect a voice command indicating the initiation of the dialog mode of the user, and transmit information indicating the initiation of the dialog mode to the dialog mode function 523 in response to the detection of the voice command. The voice command indicating the initiation of the dialog mode may include a wake-up utterance (e.g., Hi Bixby) and a voice command for waking up the voice agent. For example, the voice command may have a form such as "Hi Bixby, start the dialog mode". For another example, the voice command indicating the initiation of the dialog mode may have a form, such as "start the dialog mode", which does not include a wake-up utterance. If the dialog mode function 523 receives information indicating the initiation of the dialog mode from the voice agent module 530, the dialog mode module 520 may determine the initiation of the dialog mode. In an example, a voice agent module 530 may detect a voice command indicating the end of the dialog mode of the user, and transmit information indicating the end of the dialog mode to the dialog mode function 523 in response to the detection of the voice command. For example, the voice command indicating the end of the dialog mode may include a wake-up utterance and a voice command for waking up the voice agent. The voice command may have a form such as "Hi Bixby, end the dialog mode". For example, the voice command indicating the end of the dialog mode may have a form, such as "end the dialog mode", which does not include the wake-up utterance. If the dialog mode function 523 receives information indicating the end of the dialog mode from the voice agent module 530, the dialog mode module 520 may determine the end of the dialog mode.

According to an embodiment, the dialog mode module 520 may determine the start and/or end (termination) of the dialog mode based on the touch input of the user. For example, the electronic device 201 may provide a UI for controlling the dialog mode of the wireless audio device 202. Through the UI, the electronic device 201 may receive a user input for setting activation or deactivation of the dialog mode. If a user input for giving an instruction to activate the dialog mode is received, the electronic device 201 may transmit, to the wireless audio device 202, a signal for instructing that the dialog mode be initiated. If the dialog mode function 523 obtains information indicating the initiation of the dialog mode from the signal, the dialog mode module 520 may determine the initiation of the dialog mode. If a user input for giving an instruction to deactivate the dialog mode is received through the UI, the electronic device 201 may transmit, to the wireless audio device 202, a signal for instructing that the dialog mode be ended. If the dialog mode function 523 obtains information indicating the end of the dialog mode from the signal, the dialog mode module 520 may determine the end of the dialog mode.

According to an embodiment, if the dialog mode module 520 determines the initiation or end of the dialog mode, the wireless audio device 202 may transmit, to the electronic device 201, a signal representing that the initiation or end of the dialog mode has been determined. The electronic device 201 may provide the information indicating that the start or end of the dialog mode is determined, which is obtained from the signal, through the UI for controlling the dialog mode of the wireless audio device 202.

According to an embodiment, the dialog mode module 520 may determine the start and/or end of the dialog mode based on the button input of the user. For example, the wireless audio device 202 may include at least one button (e.g., the button 413 in FIG. 4). The dialog mode function 523 may be configured to detect a specified input for the button (e.g., a double tap or a long press). If an input indicating initiation of the dialog mode is received through the button, the dialog mode module 520 may determine the initiation of the dialog mode. If an input for giving an instruction to end the dialog mode is received through the button, the dialog mode module 520 may determine the end of the dialog mode.

According to an embodiment, the dialog mode function 523 may be configured to interact with the voice agent module 530. For example, the dialog mode function 523 may obtain, from the voice agent module 530, information indicating whether the utterance relates to a voice agent call. For example, the utterance of the wearer maintained for a specified time or longer may be detected by the first VAD 521. In this case, the dialog mode module 520 may use the dialog mode function 523 to identify whether the utterance of the wearer relates to the voice agent call. If the dialog mode function 523 confirms, using the voice agent module 530, that the voice agent call is performed by the utterance, the dialog mode module 520 may ignore the corresponding utterance. For example, even if the utterance has lasted for a specified time or longer, the dialog mode module 520 may not determine to start the dialog mode only with the corresponding utterance. For example, the voice agent module 530 may identify a voice command indicating the initiation of the dialog mode from the utterance. In this case, the voice agent module 530 may transmit, to the dialog mode module 520, a signal for instructing that the dialog mode be initiated, and the dialog mode module 520 may determine the start of the dialog mode. That is, in this case, the dialog mode module 520 may determine the start of the dialog mode based on the instruction of the voice agent module 530 rather than the length of the utterance itself.

According to an embodiment, the dialog mode module 520 may determine the end of the dialog mode based on the operation time of the dialog mode. For example, if a predetermined time elapses after the dialog mode is turned on, the dialog mode module 520 may determine the end of the dialog mode.

According to an embodiment, the voice agent module 530 may include a wake-up utterance recognition module 531 and a voice agent control module 532. In an example, the voice agent module 530 may further include a voice command recognition module 533. The wake-up utterance recognition module 531 may obtain an audio signal by using the audio receiving circuits 481 and 482 and recognize a wake-up utterance (e.g., Hi Bixby) from the audio signal. If a specified voice command is recognized, the wake-up utterance recognition module 531 may control the voice agent by using the voice agent control module 532. For example, the voice agent control module 532 may transmit the received voice signal to the electronic device 201 and receive a task or command corresponding to the voice signal from the electronic device 201. For example, if the voice signal instructs that the volume be adjusted, the electronic device 201 may transmit, to the wireless audio device 202, a signal for instructing that the volume be adjusted. The voice command recognition module 533 may obtain an audio signal by using the audio receiving circuits 481 and 482 and recognize a specified voice command from the audio signal. In an example, the specified voice utterance may include a voice command (e.g., start the dialog mode, end the dialog mode) for controlling the dialog mode. The voice command recognition module 533 may perform a function corresponding to the specified voice command if the specified voice command is recognized without recognizing the wake-up utterance. For example, the voice command recognition module 533 may transmit, to the electronic device 201, a signal for instructing that the dialog mode be ended if the utterance of the specified command such as "end the dialog mode" is recognized. For example, the voice command recognition module 533 may perform a function corresponding to the specified voice command without interacting with the voice agent. The electronic device 201 may perform sound control of the wireless audio device 202, which will be described later, in response to the signal for instructing that the dialog mode be ended.

According to an embodiment, the dialog mode module 520 may transmit the determination as to the dialog mode (e.g., the end of the dialog mode or the start of the dialog mode) to a dialog mode control module 550. The dialog mode control module 550 may control the function of the wireless audio device 202 depending on activation and/or deactivation of the dialog mode. For example, the dialog mode control module 550 may control the output sound of the wireless audio device 202 by using a sound control module 540 depending on activation and/or deactivation of the dialog mode.

For example, the sound control module 540 may include an active noise canceling (ANC) module 541 and an ambient sound control module 542. The ANC module 541 may be configured to obtain an ambient sound and perform noise cancellation based on the ambient sound. For example, the ANC module 541 may obtain an ambient sound by using the external microphone and perform noise cancellation by using the obtained ambient sounds. The ambient sound control module 542 may be configured to provide an ambient sound to the wearer. For example, the ambient sound control module 542 may be configured to provide an ambient sound by obtaining the ambient sound by using the external microphone and outputting the obtained ambient sounds by using a speaker of the wireless audio device 202.

According to an embodiment, if the dialog mode is started, the dialog mode control module 550 may control the output sound of the wireless audio device 202 by using the sound control module 540. For example, the dialog mode control module 550 may deactivate ANC and activate an ambient sound in response to the start of the dialog mode. For another example, when music is being output from the wireless audio device 202, the dialog mode control module 550 may reduce a volume level of the music being output by a certain percentage or more or set the volume level to a maximum mute, in response to the start of the dialog mode. The user of the wireless audio device 202 may clearly hear the ambient sound with the initiation of the dialog mode.

According to an embodiment, if the dialog mode is ended, the dialog mode control module 550 may control the output sound of the wireless audio device 202 by using the sound control module 540. For example, the dialog mode control module 550 may return the ANC setting and/or the ambient sound setting back to the settings before the initiation of the dialog mode, in response to the end of the dialog mode, and may deactivate the ambient sounds. For example, before the start of the dialog mode, the dialog mode control module 550 may store ANC settings and/or ambient sound settings in the memory. If the dialog mode is ended, the dialog mode control module 550 may activate or deactivate the ANC and/or the ambient sound with the ANC setting and/or the ambient sound setting stored in the memory.

For another example, the dialog mode control module 550 may return the output sound of the wireless audio device 202 back to the setting before the initiation of the dialog mode, in response to the end of the dialog mode. For example, when music is being output from the wireless audio device 202 before the start of the dialog mode, the dialog mode control module 550 may store the music output sound setting in the memory. If the dialog mode is ended, the dialog mode control module 550 may return the music output sound back to the music output sound setting stored in the memory. The dialog mode control module 550 may reduce or mute the media output volume to a specified value according to a setting in the dialog mode. In the dialog mode, the wireless audio device 202 may output a notification of the voice agent (e.g., the response to the utterance of the user) independently of the volume set for the dialog mode. For example, the wireless audio device 202 may output a notification (e.g., a TTS-based response) of the voice agent at a specified volume value in the dialog mode.

According to an embodiment, the dialog mode control module 550 may control the output sound by using the sound control module 540 during the operation of the dialog mode. For example, the dialog mode control module 550 may control the intensity of the ANC and/or ambient sound. The dialog mode control module 550 may control a gain value of the ambient sound to amplify the intensity of the ambient sound. The dialog mode control module 550 may amplify only a section in which a voice exists or a frequency band corresponding to the voice in the ambient sound. In the dialog mode, the dialog mode control module 550 may reduce the intensity of the ANC. The dialog mode control module 550 may control the output volume of an audio signal.

Tables 1 and 2 below show examples of sound control of the dialog mode control module 550 depending on the start (e.g., ON) and end (e.g., OFF) of the dialog mode.

TABLE 1

| Sound control | Previous state | Dialog mode ON | Dialog mode OFF |
| --- | --- | --- | --- |
| ANC | ON | OFF | ON |
| Ambient sound | OFF | ON | OFF |

Referring to Table 1, the wearer of the wireless audio device 202 may be listening to music by using the wireless audio device 202. For example, the wireless audio device 202 may output music while performing ANC. For example, the wireless audio device 202 may output music at a first volume. With the start of the dialog mode, the dialog mode control module 550 may activate the ambient sound and deactivate the ANC. In this case, the dialog mode control module 550 may reduce the volume of the music being output to a specified value or less, or may reduce it by a specified ratio. For example, the dialog mode control module 550 may reduce the volume of the music being output to a second value in the dialog mode. With the end of the dialog mode, the dialog mode control module 550 may return settings related to the output sound back. For example, the dialog mode control module 550 may activate the ANC and deactivate ambient sounds. In addition, the dialog mode control module 550 may increase the volume of the music being output to the first value.

TABLE 2

| Sound control | Previous state | Dialog mode ON | Dialog mode OFF |
|---|---|---|---|
| ANC | OFF | OFF | OFF |
| Ambient sound | OFF | ON | OFF |

Referring to Table 2, the wearer of the wireless audio device 202 may be listening to music by using the wireless audio device 202. For example, the wireless audio device 202 may output music without applying the ANC. For example, the wireless audio device 202 may output music at the first volume. With the start of the dialog mode, the dialog mode control module 550 may activate the ambient sound and maintain the ANC in the deactivated state. In this case, the dialog mode control module 550 may reduce the volume of the music being output to a specified value or less, or may reduce it by a specified ratio. For example, the dialog mode control module 550 may reduce the volume of the music being output to the second value in the dialog mode. With the end of the dialog mode, the dialog mode control module 550 may return settings related to the output sound back. For example, the dialog mode control module 550 may maintain the ANC in the deactivated state and deactivate ambient sounds. In addition, the dialog mode control module 550 may increase the volume of the music being output to the first value.

In the examples of Tables 1 and 2, it has been described that the wireless audio device 202 deactivates the ambient sounds when the dialog mode is not set; however, embodiments of the disclosure are not limited thereto. For example, even if the dialog mode is not set, the wireless audio device 202 may activate the ambient sound depending on settings of the user.

According to an embodiment, an environment classification module 560 may obtain audio signals by using the audio receiving circuit and classify the environment based on the audio signals. For example, the environment classification module 560 may obtain at least one of a background noise, a signal to noise ratio (SNR), or a type of noise from the audio signals. The environment classification module 560 may detect the environment based on the intensity of the background noise, the SNR, or the type of noise. For example, the environment classification module 560 may identify the environment of the wireless audio device 202 by comparing the environment information stored in the memory with at least one of the intensity of the background noise, the SNR, and the type of noise. For example, the environment classification module 560 may control an output sound based on the identified environment.

For example, in a state in which the dialog mode is activated, the environment classification module 560 may control an output sound based on the identified environment. The environment classification module 560 may control the ambient sounds based on the intensity of the background noise and/or SNR. For example, the environment classification module 560 may determine the overall output of ambient sounds, the amplification of a voice band among the ambient sounds, or the amplification of a specified sound (e.g., an alarm or a siren) among ambient sounds. For example, the environment classification module 560 may determine the intensity of the ANC. For example, the environment classification module 560 may adjust a parameter (e.g., a coefficient) of a filter for the ANC. In the above-described example, the environment classification module 560 identifies the environment by using the audio signal; however, embodiments of the disclosure are not limited thereto. For example, the environment classification module 560 may identify the environment by using Wi-Fi information and/or GPS information.

According to an embodiment, the environment classification module 560 may control the dialog mode based on the identified environment. For example, the environment classification module 560 may activate the dialog mode based on the identified environment. If it is determined that the user is in an environment in which the user needs to hear the ambient sound, the environment classification module 560 may activate the dialog mode by using the dialog mode control module 550, and may provide the ambient sound to the user based on the dialog mode. For example, when the user is in a dangerous environment (e.g., an environment in which a siren sound is detected), the environment classification module 560 may activate the dialog mode.

According to an embodiment, the electronic device 201 may display the user interface indicating the end or start of the dialog mode on the display 360. The electronic device 201 may provide the user interface in a manner synchronized with the dialog mode of the wireless audio device 202. The electronic device 201 may display the user interface when the electronic device 201 determines the end or start of the dialog mode, or receives, from the wireless audio device 202, a signal for instructing that the dialog mode be ended or started. For example, if the dialog mode is started, the electronic device 201 may display a first user interface including information indicating that the dialog mode has been set. The first user interface (e.g., a user interface 2600 of FIG. 26) may include an interface (e.g., a volume interface 2610 of FIG. 26) for controlling output sound settings in the dialog mode. For example, if the dialog mode is ended, the electronic device 201 may display a second user interface (e.g., a user interface 2300 of FIG. 23) including information indicating that the dialog mode has been ended. The electronic device 201 may display the first user interface and the second user interface on an execution screen of an application (e.g., a wearable application) for controlling the wireless audio device 202.

According to an embodiment, the dialog mode module 520 may determine the initiation and end of the dialog mode further based on whether or not the wireless audio device 202 is worn. For example, when the wireless audio device 202 is worn by the user, the dialog mode module 520 may initiate the dialog mode based on the utterance or the user input of the user (e.g., wearer). When the wireless audio device 202 is not worn by the user, the dialog mode module 520 may not initiate the dialog mode even if the utterance of the user is detected.

For example, each of the first wireless audio device 202-1 and the second wireless audio device 202-2 may include the components of the wireless audio device 202 illustrated in FIG. 5. Each of the first wireless audio device 202-1 and the second wireless audio device 202-2 may be configured to determine whether to initiate the dialog mode. According to an embodiment, the first wireless audio device 202-1 and the second wireless audio device 202-2 may be configured to operate in the dialog mode if the first wireless audio device 202-1 or the second wireless audio device 202-2 has determined the initiation of the dialog mode. For example, the first wireless audio device 202-1 or the second wireless audio device 202-2 may be configured to transmit, to another wireless audio device and/or the electronic device 201, a signal for instructing that the dialog mode be initiated if the first wireless audio device 202-1 or the second wireless audio device 202-2 has determined the initiation of the dialog mode. According to an embodiment, the first wireless audio device 202-1 and the second wireless audio device 202-2 may be configured to operate in the dialog mode if both the first wireless audio device 202-1 and the second wireless audio device 202-2 have determined the initiation of the dialog mode. For example, the first wireless audio device 202-1 or the second wireless audio device 202-2, which has determined the initiation of the dialog mode, may check whether another wireless audio device has determined the initiation of the dialog mode, and the first wireless audio device 202-1 and the second wireless audio device 202-2 may operate in the dialog mode if both the wireless audio devices have determined the initiation of the dialog mode. For another example, the first wireless audio device 202-1 or the second wireless audio device 202-2, which have determined to initiation of the dialog mode may transmit, to the electronic device 201, a signal for instructing that the dialog mode be initiated. If the signal for instructing that the dialog mode be initiated is received from both the first wireless audio device 201-1 and the second wireless audio device 202-2 within a specified time, the electronic device 201 may transmit a signal for causing the first wireless audio device 202-1 and the second wireless audio device 202-2 to operate in the dialog mode.

A method of determining starting, maintaining, and/or ending of the dialog mode may be referred to by the following description with reference to FIGS. 6 to 19.

Figure 6:
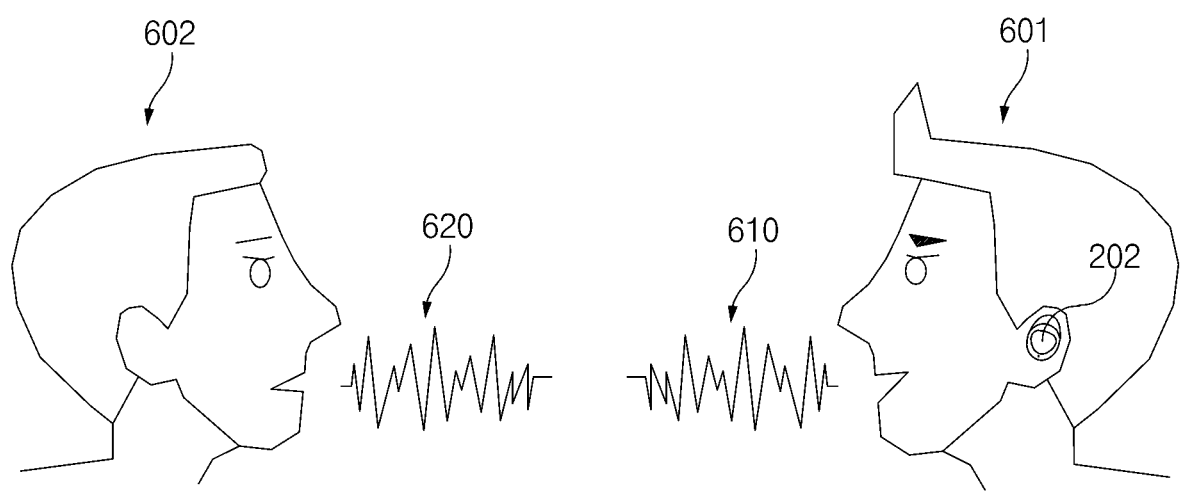
FIG. 6 illustrates a conversation environment according to an embodiment of the disclosure.

FIG. 6 illustrates a conversation environment according to an embodiment of the disclosure.

Figure 7:
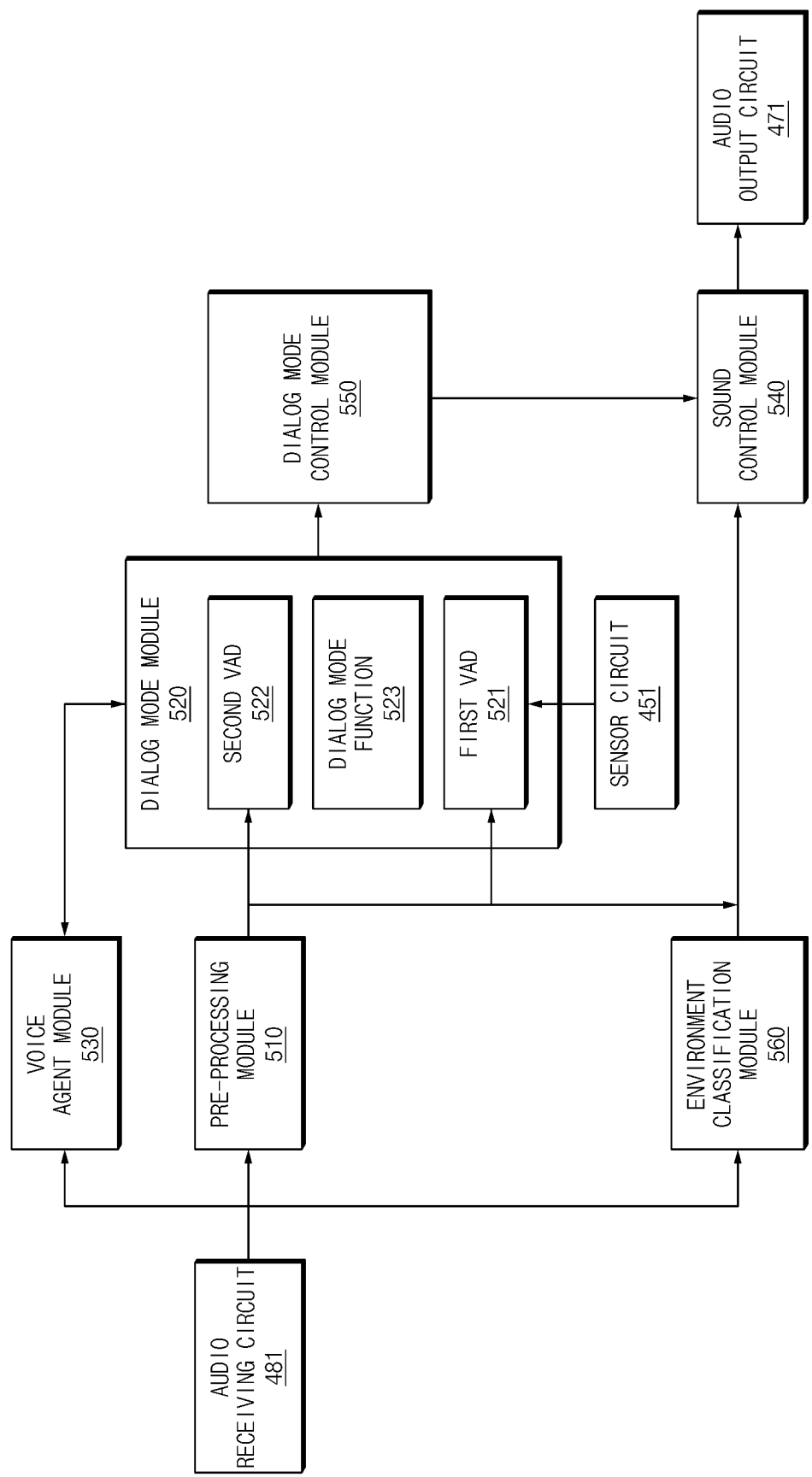
FIG. 7 illustrates a system configuration of the first wireless audio device according to an embodiment of the disclosure.

FIG. 7 illustrates a system configuration of the first wireless audio device according to an embodiment of the disclosure.

Referring to FIGS. 6 and 7, it may be assumed that a user 601 wearing the wireless audio device 202 and the other person 602 have a conversation. For example, an utterance made by the user 601 may be referred to as a user utterance 610, and an utterance made by the other person 602 may be referred to as the other person utterance 620. For example, the dialogue may be as in the example in Table 3.

TABLE 3

User: "Hi Bixby, start the dialog mode"
Voice agent: "Dialog mode started."
<Start Dialog Mode>
User: "Iced coffee, please"
Other person; "You can use the free coupon the next time you visit"
User: "Hi Bixby, save it in the reminder to use the coffee shop coupon tomorrow at 8:00"
Voice agent: "Yes, saved it to the reminder"
Other person: "Free coupons are here"
(Interval between the other person utterance and utterances is less than time te)
Other person: "Coffee is here"
User: "Thank you"
(Time te has passed since the end of the other person utterance)
<End Dialog Mode>

In the example of Table 3, the dialog mode may be started with the voice command of the user 601. The wireless audio device 202 may obtain an audio signal including the utterance of the user "Hi Bixby, start the dialog mode" by using the audio receiving circuits 481 and 482. The obtained audio signal may be transmitted to the voice agent module 530, the pre-processing module 510, and the environment classification module 560. The first VAD 521 may detect the utterance of the user 601 based on the voice signal of the audio signal and the motion detected by the sensor circuits 451 and 452. The voice agent module 530 may detect a wake-up word (e.g., Hi Bixby) from the audio signal, and transmit, to the dialog mode module 520, the fact that the user utterance 610 indicates the wake-up utterance. The dialog mode module 520 may not start the dialog mode since the audio signal relates to the voice agent call. The voice agent module 530 may transmit, to the dialog mode module 520, a signal for instructing that the dialog mode be started, based on a voice command ("Start the dialog mode") included in the user utterance 610. The dialog mode module 520 may start the dialog mode in response to the signal for instructing that the dialog mode be started.

The voice agent may output a sound indicating the start of the dialog mode ("Dialog mode started"). For example, the wireless audio device 202 may be configured to decrease or mute the volume of the media being output in the dialog mode. Even in this case, the wireless audio device 202 may output a notification of the voice agent (e.g., the response to the utterance of the user) independently of the volume of the dialog mode. For example, the wireless audio device 202 may output a notification (e.g., a TTS-based response) of the voice agent at a specified volume value in the dialog mode.

With the start of the dialog mode, the dialog mode control module 550 may control the sound by using the sound control module 540. For example, the dialog mode control module 550 may deactivate the ANC and activate the ambient sound.

Figure 8:
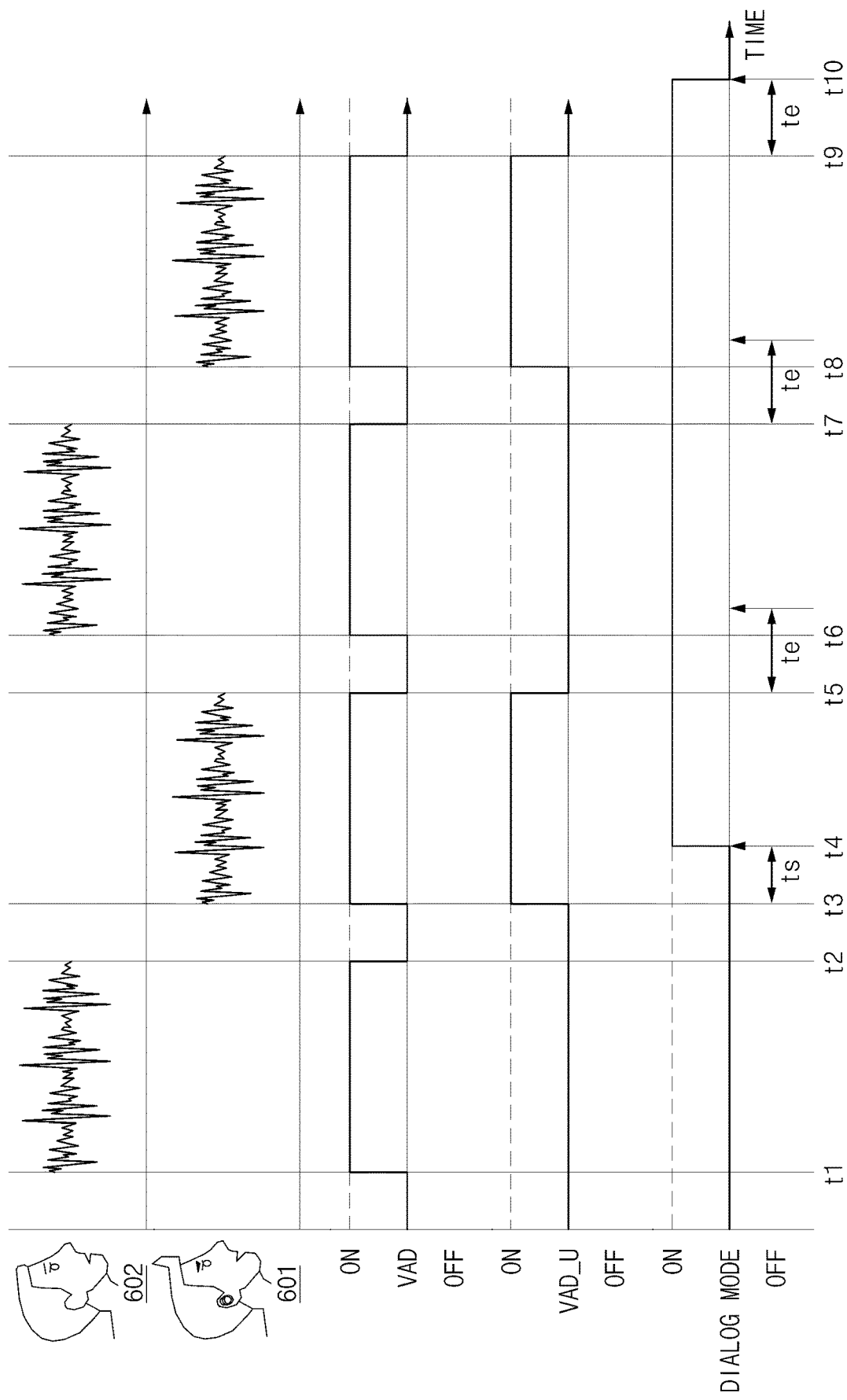
FIG. 8 illustrates dialog mode control according to an embodiment of the disclosure.
Figure 9:
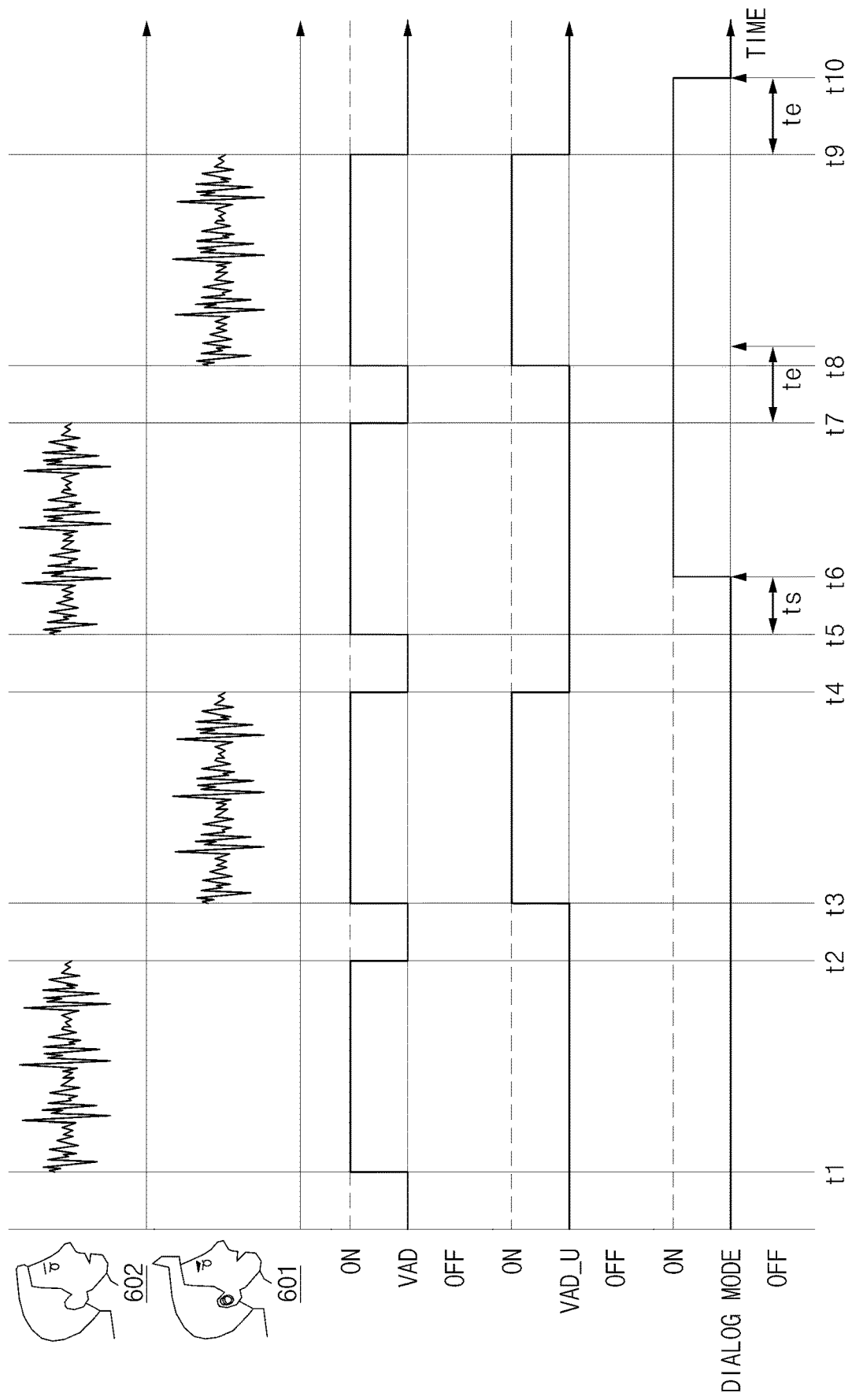
FIG. 9 illustrates a dialog mode control according to an embodiment of the disclosure.
Figure 10:
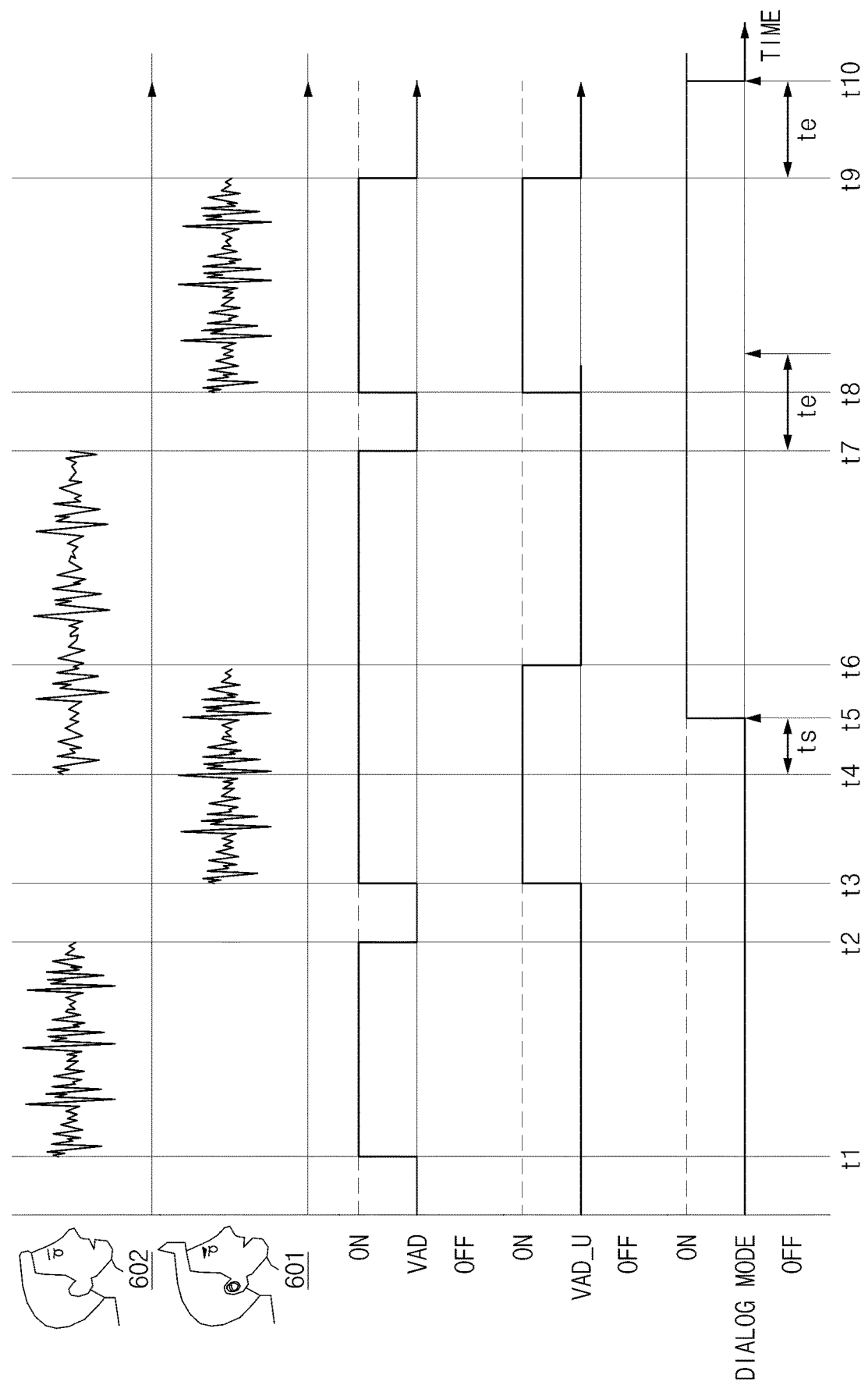
FIG. 10 illustrates a dialog mode control according to an embodiment of the disclosure.

The time interval between the utterance in which the dialog mode is maintained and the utterance may be shorter than a specified time interval (te in FIGS. 8, 9, and 10). In this case, the dialog mode module 520 may maintain the dialog mode.

For example, even during the dialog mode, the user 601 may call the voice agent. For example, the user utterance 610 may be "Hi Bixby, save it in the reminder to use the coffee shop coupon tomorrow at 8:00". For example, the specified time interval (te in FIGS. 8, 9, and 10) for determining whether to end the dialog mode may be started from the end time point of an utterance (e.g., user utterance 610 or the other person utterance 620). Even if the user utterance 610 relates to the voice agent, the specified time interval (te in FIGS. 8, 9, and 10) for determining whether to end the dialog mode may be started from the end time point of the user utterance 610.

In the example of Table 3, if the specified time te elapses from the last utterance ("Thank you") of the user 601, the dialog mode may be ended. In an example, the wireless audio device 202 may not provide a separate notification for the end of the dialog mode. For example, the wireless audio device 202 may provide a notification of the end of the dialog mode when the dialog mode is ended based on the explicit instruction of the user (e.g., a voice command, a button input, and/or a touch input), and may not provide the notification of the end of the dialog mode when the dialog mode is ended over time.

With the end of the dialog mode, the dialog mode control module 550 may control the sound by using the sound control module 540. For example, the dialog mode control module 550 may return the ANC and the ambient sounds back to a state before the initiation of the dialog mode.

FIG. 8 illustrates dialog mode control according to an embodiment of the disclosure.

According to an embodiment, the wireless audio device 202 may start the dialog mode based on the user utterance. For example, if the user utterance is detected, the dialog mode may be started.

Referring to FIG. 8, the utterance of the other person 602 may be started at time t1 and the utterance of the other person 602 may be ended at time t2. The wireless audio device 202 may detect the utterance of the other person 602. In this case, the wireless audio device 202 may detect a voice activity (VAD), but may not detect a voice activity of the user (VAD_U). The wireless audio device 202 may detect the utterance of the other person 602 as an ambient utterance.

At time t3, the utterance of the user 601 may be started and the utterance of the user 601 may be ended at time t5. The wireless audio device 202 may detect the utterance of the user by detecting the voice activity (VAD) and the voice activity of the user (VAD_U). If the utterance of the user 601 is detected and the utterance of the user 601 is maintained for a specified first time interval ts or longer, the wireless audio device 202 may start the dialog mode. At time t4 when the specified first time interval ts has elapsed from a starting point (t3) of the utterance of the user 601, the wireless audio device 202 may start the dialog mode.

The utterance of the other person 602 may be started at time t6 and the utterance of the other person 602 may be ended at time t7. Since a length between the end time (t5) of the previous utterance of the user 601 and the start time (t6) of the utterance of the other person 602 is shorter than a specified second time interval te, the wireless audio device 202 may maintain the dialog mode.

At time t8, the utterance of the user 601 may be started and the utterance of the user 601 may be ended at time t9. Since the length between the end time (t7) of the previous utterance of the other person 602 and the start time (t8) of the utterance of the user 601 is shorter than the specified second time interval te, the wireless audio device 202 may maintain the dialog mode.

After the end of the utterance of the user 601 (t9), the utterance of the user 601 or the other person 602 may not be detected within the specified second time interval te. At a time point (t10) when the specified second time interval has elapsed after the end of the utterance of the user 601, the wireless audio device 202 may end the dialog mode.

FIG. 9 illustrates a dialog mode control according to an embodiment of the disclosure.

According to an embodiment, the wireless audio device 202 may initiate the dialog mode based on the user utterance and the other person utterance. For example, if the dialog mode is started based on only the user utterance, the dialog mode may be started even when the user 601 speaks to himself or sings. Accordingly, the wireless audio device 202 may start the dialog mode if the utterance of the user 601 is detected after the ambient utterance (e.g., the utterance of the other person 602) is detected.

Referring to FIG. 9, the utterance of the other person 602 may be started at time t1 and the utterance of the other person 602 may be ended at time t2. The wireless audio device 202 may detect the utterance of the other person 602. In this case, the wireless audio device 202 may detect the voice activity (VAD), but may not detect the voice activity of the user (VAD_U). The wireless audio device 202 may detect the utterance of the other person 602 as an ambient utterance.

At time t3, the utterance of the user 601 may be started and the utterance of the user 601 may be ended at time t4. The wireless audio device 202 may detect the utterance of the user by detecting the voice activity (VAD) and the voice activity of the user (VAD_U).

The utterance of the other person 602 may be started at time t5 and the utterance of the other person 602 may be ended at time t7. If the utterance of the other person 602 (the ambient utterance) is detected after detecting the utterance of the user 601 and the utterance of the other person 602 is maintained for a specified first time interval ts or longer, the wireless audio device 202 may start the dialog mode. At time t6 when the specified first time interval ts has elapsed from the starting point (t6) of the utterance of the other person 602, the wireless audio device 202 may start the dialog mode.

At time t8, the utterance of the user 601 may be started and the utterance of the user 601 may be ended at time t9. Since a length between the end time (t7) of the previous utterance of the other person 602 and the start time (t8) of the utterance of the user 601 is shorter than a specified second time interval te, the wireless audio device 202 may maintain the dialog mode.

After the end of the utterance of the user 601 (t9), the utterance of the user 601 or the other person 602 may not be detected within the specified second time interval te. At a time point (t10) when the specified second time interval has elapsed after the end of the utterance of the user 601, the wireless audio device 202 may end the dialog mode.

According to an embodiment, the wireless audio device 202 may selectively apply the user utterance-based dialog mode control described above with reference to FIG. 8 and the other person utterance-based dialog mode control described above with reference to FIG. 9. For example, the wireless audio device 202 may perform a dialog mode control based on the user utterance or the other person utterance by a user selection (e.g., user setting). For another example, the wireless audio device 202 may selectively apply the user utterance-based dialog mode control or the other person utterance-based dialog mode control, depending on an environment. The wireless audio device 202 may perform the other person utterance-based dialog mode control if the noise is greater than a specified level, and may perform the user utterance-based dialog mode control if the noise is below the specified level.

FIG. 10 illustrates a dialog mode control according to an embodiment of the disclosure.

In the example of FIG. 10, the wireless audio device 202 may start the dialog mode by detecting the other person utterance after the user utterance, as described above with reference to FIG. 9.

Referring to FIG. 10, the utterance of the other person 602 may be started at time t1 and the utterance of the other person 602 may be ended at time t2. The wireless audio device 202 may detect the utterance of the other person 602. In this case, the wireless audio device 202 may detect the voice activity (VAD), but may not detect the voice activity of the user (VAD_U). The wireless audio device 202 may detect the utterance of the other person 602 as an ambient utterance.

At time t3, the utterance of the user 601 may be started and the utterance of the user 601 may be ended at time t6. The wireless audio device 202 may detect the utterance of the user by detecting the voice activity (VAD) and the voice activity of the user (VAD_U). During the utterance of the user 601, the utterance of the other person 602 may occur. For example, the utterance of the other person 602 may be started at time t4 and be ended at time t7.

In this case, if the utterance of the other person 602 is maintained for a specified first time interval ts or longer from the start time point t4 of the utterance of the other person, the wireless audio device 202 may start the dialog mode. At time t5 when the specified first time interval ts has elapsed from the start time point t4 of the utterance of the other person 602, the wireless audio device 202 may start the dialog mode. In various embodiments disclosed in the disclosure, the starting point of the utterance of the other person 602 may be understood as a point where only ambient utterances in which the utterance of the user 601 is not detected starts to be detected.

At time t8, the utterance of the user 601 may be started and the utterance of the user 601 may be ended at time t9. Since a length between the end time (t7) of the previous utterance of the other person 602 and the start time (t8) of the utterance of the user 601 is shorter than a specified second time interval te, the wireless audio device 202 may maintain the dialog mode.

After the end of the utterance of the user 601 (t9), the utterance of the user 601 or the other person 602 may not be detected within the specified second time interval te. At a time point (t10) when the specified second time interval has elapsed after the end of the utterance of the user 601, the wireless audio device 202 may end the dialog mode.

Figure 11:
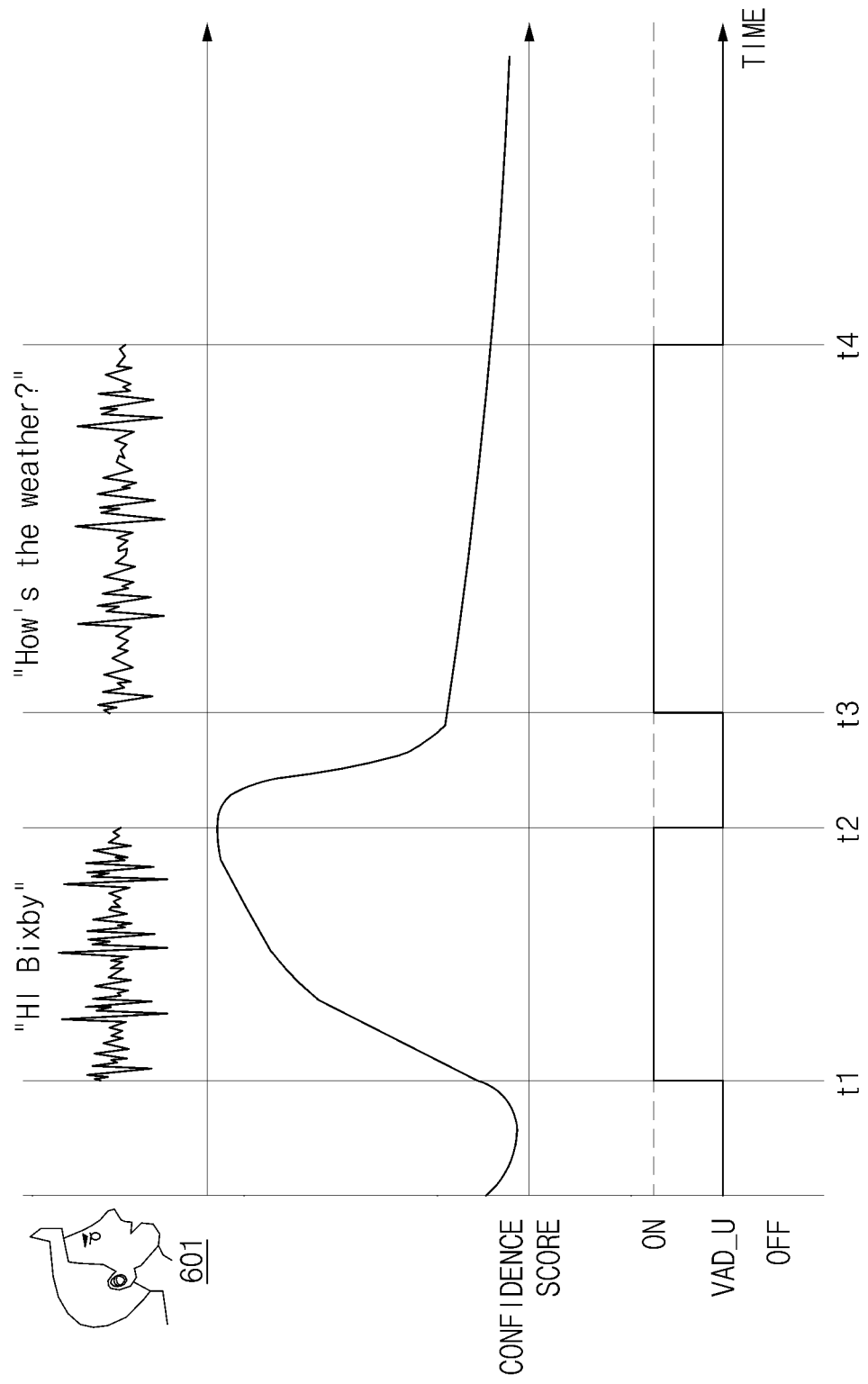
FIG. 11 illustrates wake-up utterance recognition according to an embodiment of the disclosure.

FIG. 11 illustrates wake-up utterance recognition according to an embodiment of the disclosure.

Referring to FIG. 11, according to an embodiment, the wireless audio device 202 may control the dialog mode based on a specified voice command. In an example, the specified voice command may include a wake-up utterance. In this case, if a voice command related to a dialog mode control follows after recognizing the wake-up utterance, the wireless audio device 202 may control the dialog mode based on the voice command. Even if the wake-up utterance is recognized, if the voice command for the dialog mode control is not received, the wireless audio device 202 may maintain the state of the dialog mode. In another example, the specified voice command may include a dialog mode control utterance. In this case, if the dialog mode control utterance is recognized, the wireless audio device 202 may control the dialog mode based on the dialog mode control utterance. For example, the voice agent module and the VAD of the wireless audio device 202 may operate independently of each other. When the voice agent module of the wireless audio device 202 recognizes the dialog mode control utterance or the wake-up utterance, the wireless audio device 202 may stop the dialog mode control based on the VAD. The voice agent module may provide a response to the user utterance. If a specified time has elapsed after the response is provided, the wireless audio device 202 may resume the dialog mode control based on the VAD.

As described above, the dialog mode control of the wireless audio device 202 may be linked with the voice agent call. Hereinafter, an utterance recognition method may be described with reference to FIG. 11.

In the example of FIG. 11, the user 601 may perform a wake-up utterance (Hi Bixby) between time t1 and time t2, and may perform a subsequent voice command (How's the weather?) between time t3 and t4. The wireless audio device 202 may detect the user utterance in a time interval between time t1 and time t2 and a time interval between time t3 and time t4.

The wireless audio device 202 may calculate a confidence score for a real-time voice call keyword (e.g., a wake-up word). For example, the wireless audio device 202 may cumulatively calculate the confidence score as the syllables of the voice call keyword increase. Since the confidence score is increased with the increase of the syllables, the confidence score may be at the highest at the end time t2 of the wake-up utterance of the user. For example, the wireless audio device 202 may calculate the confidence score for each frame over time.

According to an embodiment, the wireless audio device 202 may control the dialog mode based on the confidence score of the voice call keyword. For example, even if the user utterance is detected, the wireless audio device 202 may not use the user utterance to determine the start of the dialog mode if the confidence score of the voice call keyword is greater than or equal to a specified value. By handling the user utterance as exceptions, the wireless audio device 202 may prevent the dialog mode from being started by an utterance (e.g., a voice agent call utterance) that is not a conversational utterance. For another example, when the utterance of the user is detected, rather than the wake-up utterance, the confidence score increases as the number of syllables increases, but the confidence score of the voice call keyword is equal to or less than the specified value, and thus the wireless audio device 202 may use the utterance of the user to determine the start of the dialog mode. The above-described example will be described in detail with reference to FIG. 12.

Figure 12:
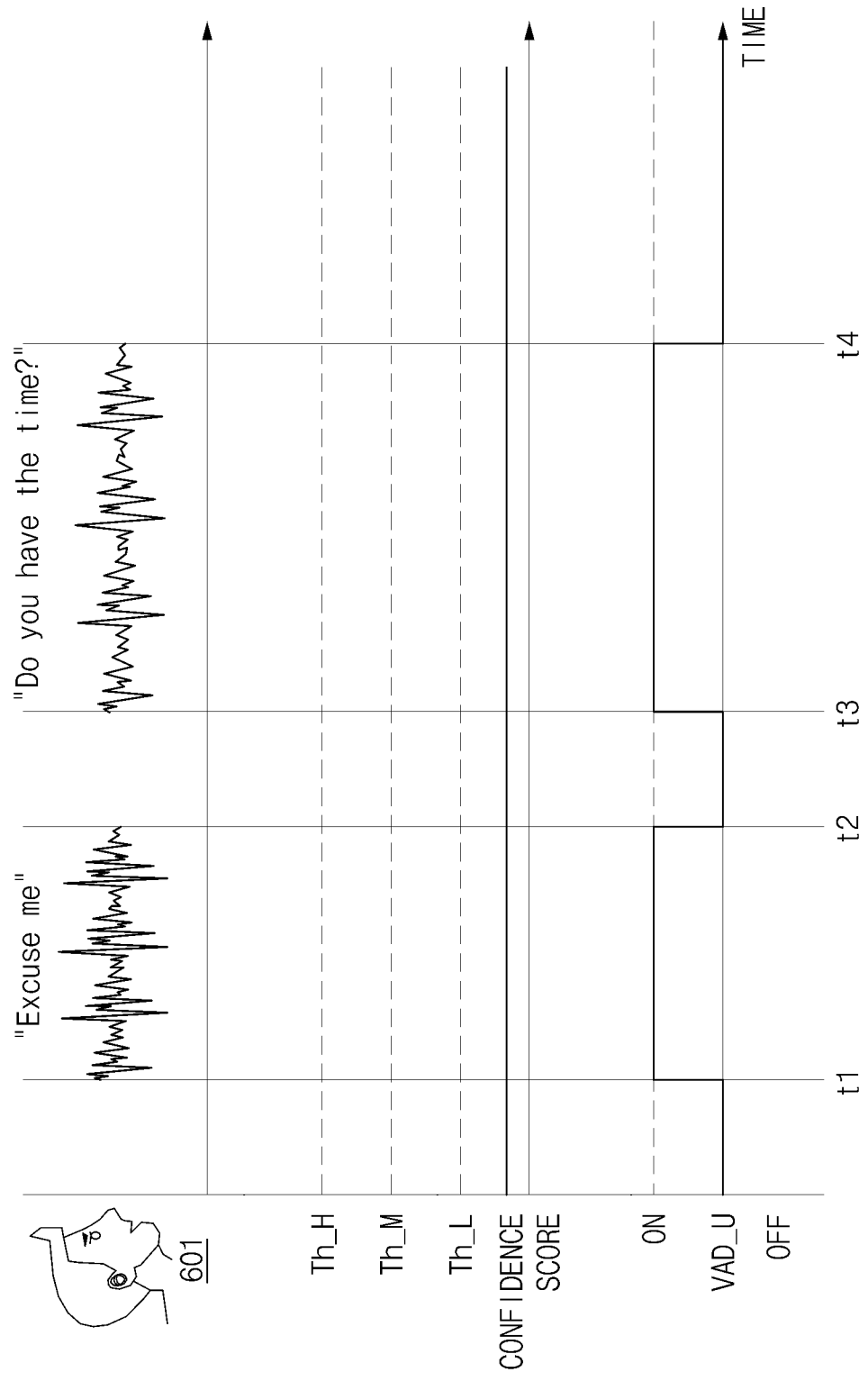
FIG. 12 illustrates utterance detection according to an embodiment of the disclosure.

FIG. 12 illustrates utterance detection according to an embodiment of the disclosure.

Referring to FIG. 12, the user 601 may perform a conversational utterance (Excuse me) between time t1 and time t2, and perform a subsequent conversational utterance (Do you have the time?) between time t3 and time t4. Since the confidence score of the voice call keyword is low if the conversational utterance is not the voice call keyword and subsequent utterance, the wireless audio device 202 may determine that the user utterance is an utterance for conversation. For example, the wireless audio device 202 may use the user utterance as the user utterance preceding the user utterance for the start of the dialog mode according to the embodiment of FIG. 8 or the other person utterance for the start of the dialog mode according to the embodiment of FIG. 9.

In the example of FIG. 12, the confidence score of the voice call keyword may be subdivided into three threshold values Th_L, Th_M, and Th_H. According to an embodiment, the wireless audio device 202 may control the dialog mode based on the confidence score. For example, the wireless audio device 202 may start the dialog mode based on the user utterance, as described above with reference to FIG. 8. The wireless audio device 202 may detect a user voice activity between time t1 and time t2. In response to detecting the user voice activity, the wireless audio device 202 may initiate a timer having a specified first length (e.g., ts in FIG. 8) for the start of the dialog mode. While the user voice activity is detected, the wireless audio device 202 may identify whether the confidence score of the corresponding voice (e.g., the confidence score of the voice call keyword) is less than the first threshold value Th_L. If the confidence score is less than the first threshold value Th_L, the wireless audio device 202 may continue to operate the timer. If the timer expires, the wireless audio device 202 may start the dialog mode at the time the timer expires.

Figure 13:
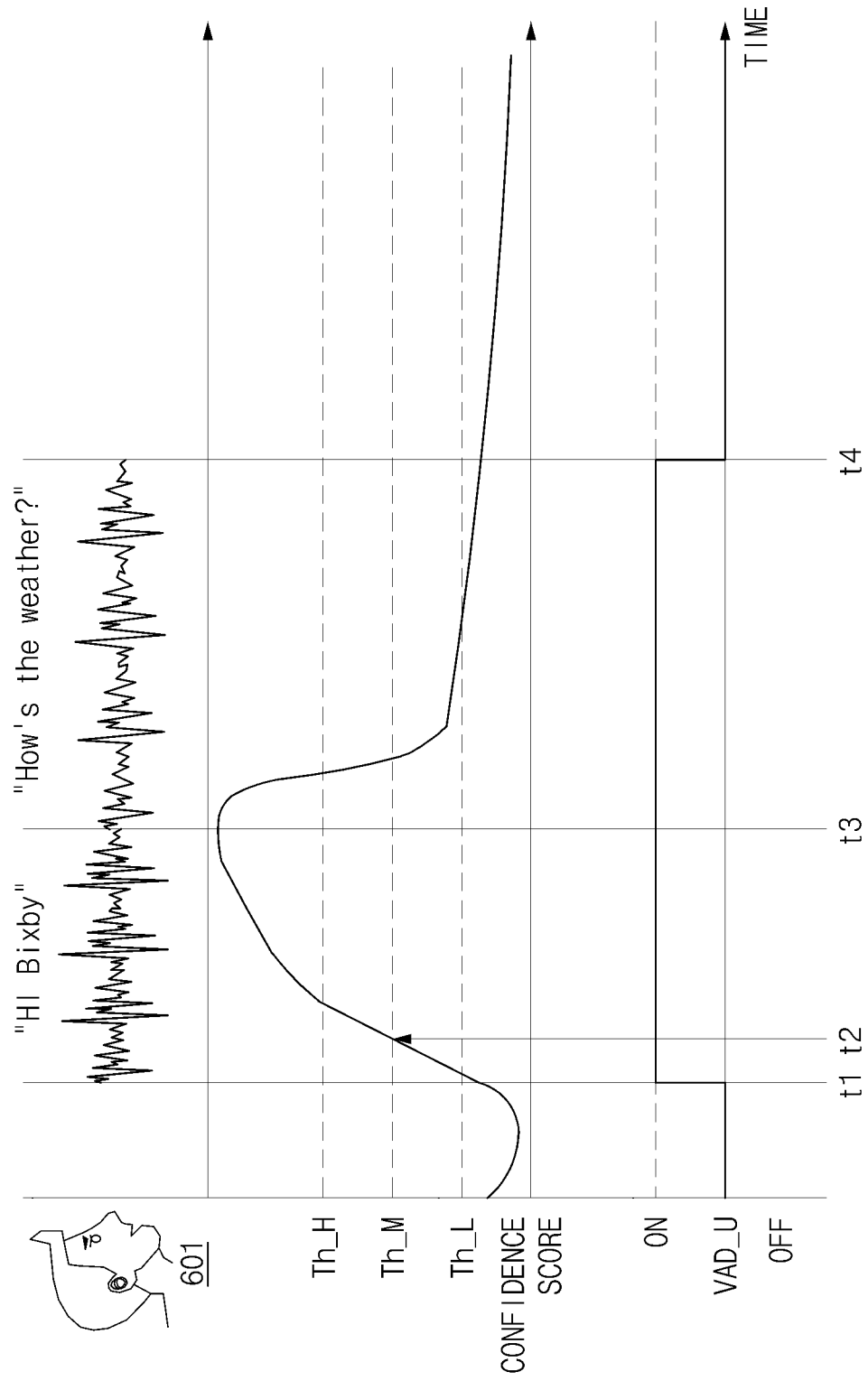
FIG. 13 illustrates wake-up utterance recognition according to an embodiment of the disclosure.

FIG. 13 illustrates wake-up utterance recognition according to an embodiment of the disclosure.

Referring to FIG. 13, the user 601 may perform a wake-up utterance (Hi Bixby) between time t1 and time t3, and may perform a subsequent utterance (How's the weather?) between time t3 and t4.

According to an embodiment, the wireless audio device 202 may control the dialog mode based on the confidence score. For example, the wireless audio device 202 may start the dialog mode based on the user utterance, as described above with reference to FIG. 8. The wireless audio device 202 may detect a user voice activity between time t1 and time t4. In response to detecting the user voice activity, the wireless audio device 202 may initiate a timer having a specified first length (e.g., ts in FIG. 8) for the start of the dialog mode. While the user voice activity is detected, the wireless audio device 202 may identify whether the confidence score of the corresponding voice (e.g., the confidence score of the voice call keyword) is less than the first threshold value Th_L.

In the example of FIG. 13, before expiration of the timer, the wireless audio device 202 may detect a voice frame having a confidence score equal to or greater than the first threshold value Th_L. In this case, the wireless audio device 202 may increase the length of the timer. For example, the wireless audio device 202 may increase the length ts of the timer by ta to set a timer to have a length of ts+ta. By setting the timer to be longer, the wireless audio device 202 may determine whether the utterance corresponds to the actual voice call keyword.

If a voice frame having the confidence score equal to or greater than the second threshold value Th_M is detected during the operation of the timer, the wireless audio device 202 may increase the length of the timer by a multiple of ta. For example, the length of the timer may be changed to ts+N*ta. Here, N may be a natural number of 2 or more. The N value may be preset or may be increased with the number of voice frames having a confidence score equal to or greater than the Th_M value. For example, at time t2, the wireless audio device 202 may increase the length of the timer.

For example, the third threshold value Th_H may be the confidence score of the wireless audio device 202 recognizing the wake-up utterance. If the confidence score equal to or higher than the third threshold value Th_H is detected, the wireless audio device 202 may recognize the utterance as the wake-up utterance. For example, if the wake-up utterance is recognized before the timer expires, the wireless audio device 202 may terminate the timer and not use the corresponding utterance and subsequent utterances (e.g., How's the weather) for dialog mode control.

Since the second threshold value Th_M is set to a value between the first threshold value Th_L and the third threshold value Th_H, the wireless audio device 202 may start the timer before recognizing the wake-up utterance.

According to an embodiment, the wireless audio device 202 may set the third threshold value Th_H based on a user setting. The second threshold value Th_M may be set to a value between the first threshold value Th_L and the third threshold value Th_H. For example, the second threshold value Th_M may be set to a value at a point at which a large change in the confidence score by a predetermined value or more occurs among the values between the first threshold value Th_L and the third threshold value Th_H. In an example, the wireless audio device 202 may change the second threshold value Th_M with the change of the third threshold value Th_H.

Figure 14:
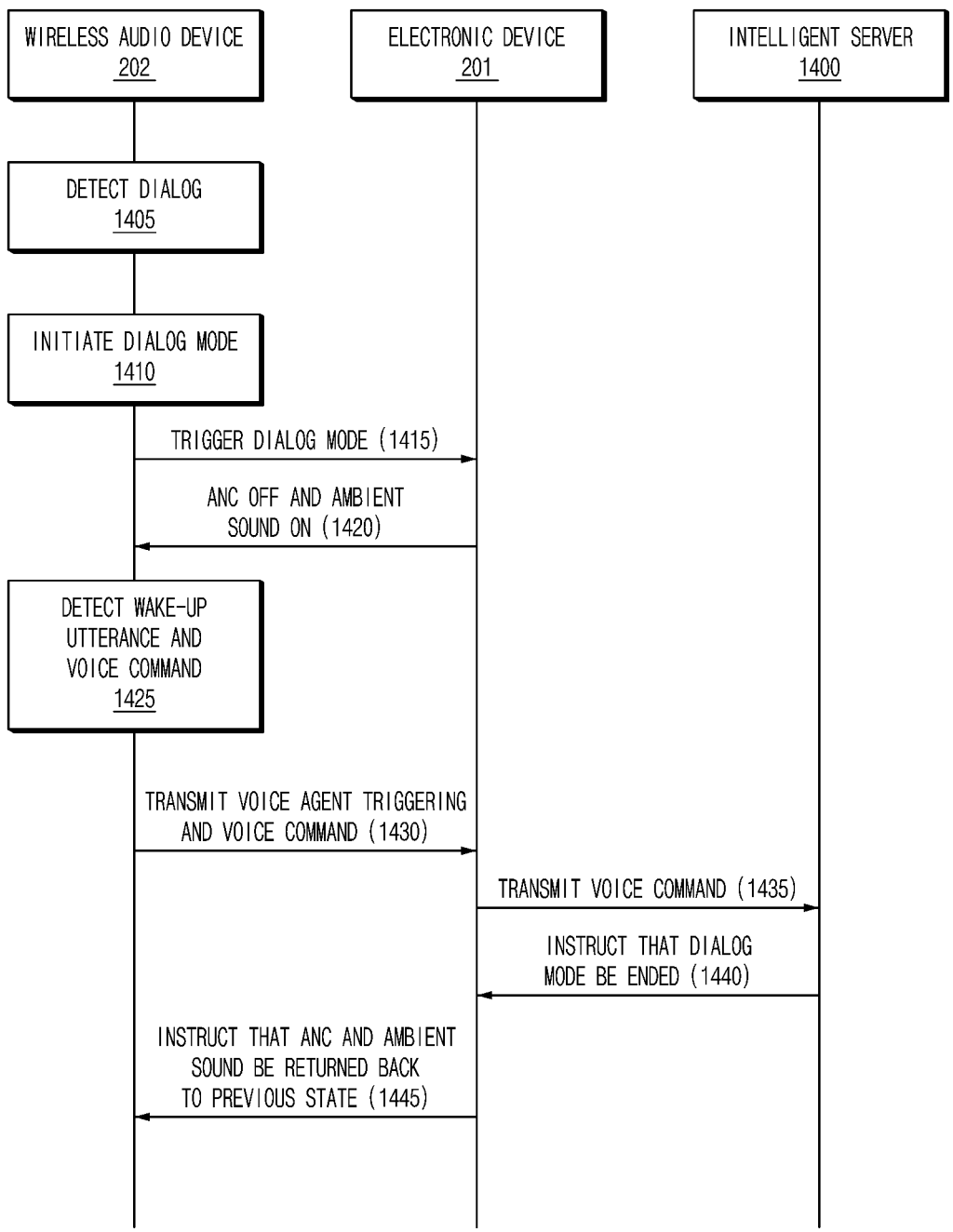
FIG. 14 illustrates a signal flow diagram of a method for ending a dialog mode using an intelligent server according to an embodiment of the disclosure.

FIG. 14 illustrates a signal flow diagram of a method for ending the dialog mode using an intelligent server according to an embodiment of the disclosure.

Figure 20:
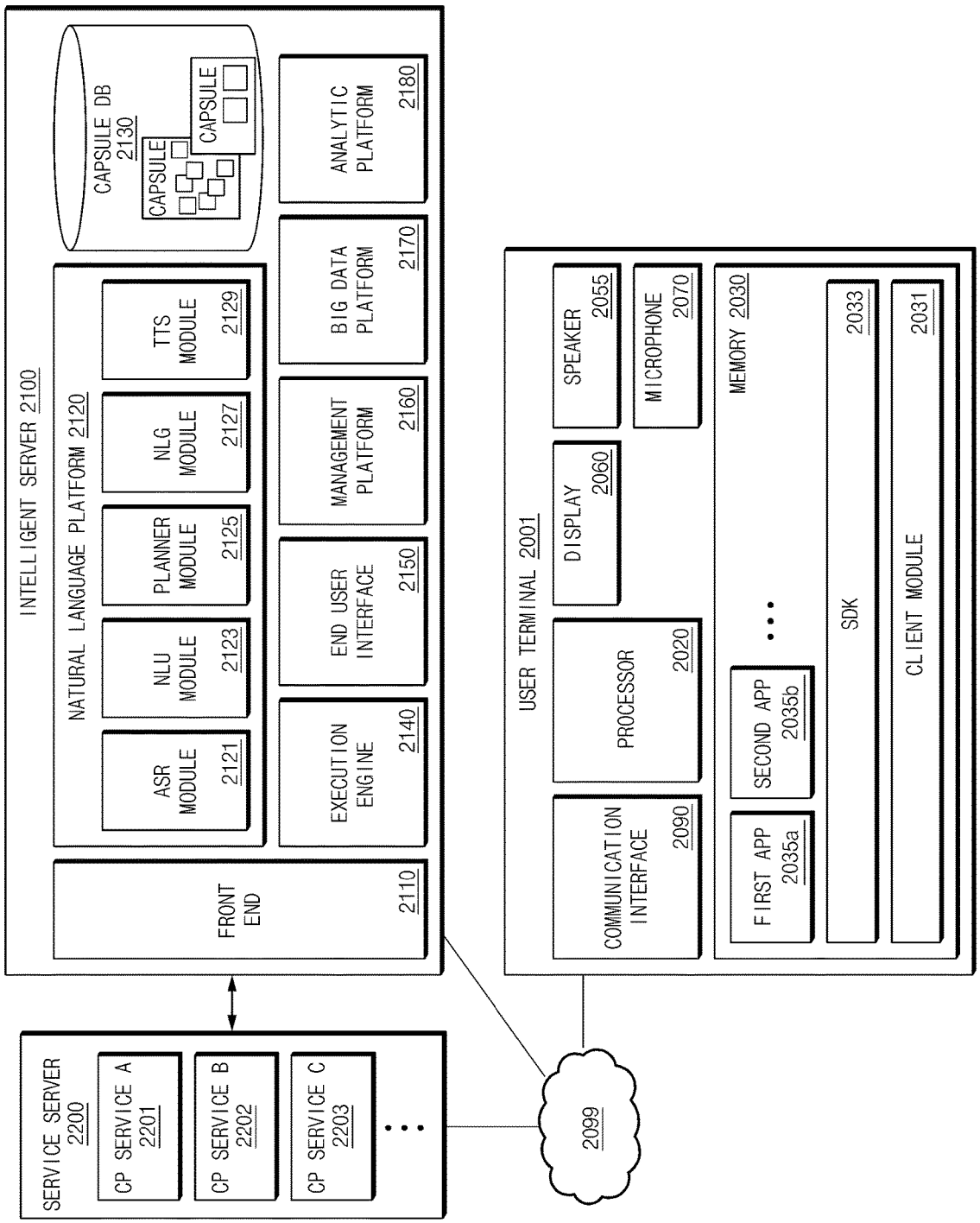
FIG. 20 is a block diagram illustrating an integrated intelligence system according to an embodiment of the disclosure.

Referring to FIG. 14, the electronic device 201 (e.g., a user terminal 2001 of FIG. 20) may operate a voice agent by using an intelligent server 1400 (e.g., an intelligent server 2100 of FIG. 20). For example, it may be assumed that the electronic device 201 and the wireless audio device 202 are wirelessly connected. For example, the electronic device 201 may include a media application for controlling media, a wearable application for controlling wearable devices including the wireless audio device 202, and a voice agent application for controlling the voice agent.

In the example of FIG. 14, the dialog mode may be started by detection of a dialog and may be ended based on a voice command. For example, the electronic device 201 may perform automatic speech recognition (ASR) and/or natural language understanding (NLU) by using the intelligent server 1400.

In operation 1405, the wireless audio device 202 may detect a dialog. For example, the wireless audio device 202 may detect a dialog by detecting an utterance of the user or an utterance of the other person that is maintained for a specified first time interval (e.g., is in FIGS. 8, 9, and 10) or longer.

In operation 1410, the wireless audio device 202 may initiate the dialog mode in response to detecting the dialog. For example, a dialog mode module (e.g., the dialog mode module 520 of FIG. 5) may determine the start of the dialog mode.

In operation 1415, the wireless audio device 202 may transmit, to the electronic device 201, a signal for triggering the dialog mode. For example, the wireless audio device 202 may transmit a signal including information indicating the start of the dialog mode through a wireless connection to the electronic device 201.

In operation 1420, the electronic device 201 may transmit, to the wireless audio device 202, a signal for instructing that ANC be OFF and the ambient sound be ON, with the start of the dialog mode. For example, the electronic device 201 may receive a signal for triggering the dialog mode by using the wearable application and transmit, to the wireless audio device 202, a signal for instructing that sound be controlled in the dialog mode. The wireless audio device 202 may control sounds based on the signal for instructing that sound be controlled. For example, the wireless audio device 202 may deactivate the ANC and activate the ambient sound.

In operation 1425, the wireless audio device 202 may detect a wake-up utterance and a voice command. For example, the wireless audio device 202 may detect a wake-up utterance according to the methods described above with reference to FIGS. 11, 12, and 13, and detect a subsequent voice as a voice command.

In operation 1430, the wireless audio device 202 may transmit a voice agent triggering and a voice command to the electronic device 201. For example, the wireless audio device 202 may transmit the voice agent triggering to the electronic device 201 in response to detecting the wake-up utterance. The electronic device 201 may receive the voice agent triggering and the voice command by using the wearable application. The wearable application may transmit the received voice agent triggering and voice command to the voice agent application of the electronic device 201.

In operation 1435, the electronic device 201 may transmit the voice command to the intelligent server 1400. The intelligent server 1400 may generate at least one task or pass rule based on voice recognition and natural language understanding of the received voice command. Voice recognition, natural language understanding, task generation, and pass rule generation of the intelligent server 1400 may be specifically described with reference to FIGS. 20, 21, and 22. For example, the intelligent server 1400 may generate a task or pass rule indicating the end of the dialog mode based on the received voice command.

In operation 1440, the intelligent server 1400 may transmit, to the electronic device 201, a signal indicating the end of the dialog mode. The voice agent application of the electronic device 201 may transmit, to the wearable application, information indicating the end of the dialog mode.

In operation 1445, the electronic device 201 may transmit, to the wireless audio device 202, a signal for instructing that the ANC and the ambient sound be returned back to a previous state (e.g., a state before operation 1410). For example, if information indicating the end of the dialog mode is obtained from the voice agent application, the wearable application of the electronic device 201 may transmit, to the wireless audio device 202, the signal for instructing that return back to the previous state be performed. In an example, the information on the previous state may be possessed by the wearable application of the electronic device 201. In an example, information on the previous state may be stored in the wireless audio device 202.

Figure 15:
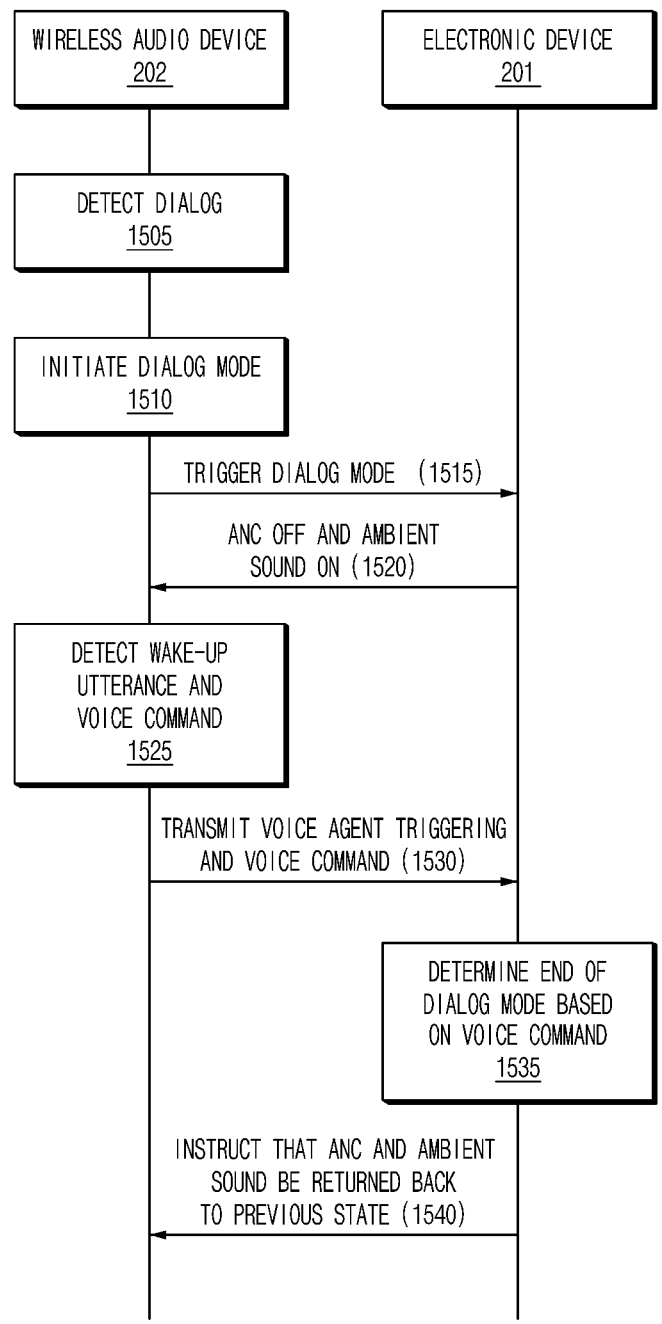
FIG. 15 illustrates a signal flow diagram of a method for ending a voice agent-based dialog mode according to an embodiment of the disclosure.

FIG. 15 illustrates a signal flow diagram of a method for ending a voice agent-based dialog mode according to an embodiment of the disclosure.

Referring to FIG. 15, the electronic device 201 (e.g., a user terminal 2001 of FIG. 20) may operate the voice agent without using the intelligent server 1400 (e.g., the intelligent server 2100 of FIG. 20). For example, the electronic device 201 may include at least some components of the intelligent server 1400 (e.g., a natural language platform 2120, an execution engine 2140, and a capsule database 2130 of FIG. 20). It may be assumed that the electronic device 201 and the wireless audio device 202 are wirelessly connected. For example, the electronic device 201 may include the media application for controlling media, the wearable application for controlling wearable devices including the wireless audio device 202, and the voice agent application for controlling the voice agent.

In the example of FIG. 15, the dialog mode may be started by detection of a dialog and may be ended based on a voice command.

In operation 1505, the wireless audio device 202 may detect a dialog. For example, the wireless audio device 202 may detect a dialog by detecting an utterance of the user or an utterance of the other person that is maintained for a specified first time interval (e.g., is in FIGS. 8, 9, and 10) or longer.

In operation 1510, the wireless audio device 202 may initiate the dialog mode in response to detecting the dialog. For example, a dialog mode module (e.g., the dialog mode module 520 of FIG. 5) may determine the start of the dialog mode.

In operation 1515, the wireless audio device 202 may transmit, to the electronic device 201, a signal for triggering the dialog mode. For example, the wireless audio device 202 may transmit a signal including information indicating the start of the dialog mode through a wireless connection to the electronic device 201.

In operation 1520, the electronic device 201 may transmit, to the wireless audio device 202, a signal for instructing that the ANC be OFF and the ambient sound be ON, with the initiation of the dialog mode. Description of operation 1520 may be referred to by description of operation 1420 of FIG. 14.

In operation 1525, the wireless audio device 202 may detect a wake-up utterance and a voice command. For example, the wireless audio device 202 may detect a wake-up utterance according to the methods described above with reference to FIGS. 11, 12, and 13, and detect a subsequent voice as a voice command.

In operation 1530, the wireless audio device 202 may transmit a voice agent triggering and a voice command to the electronic device 201. For example, the wireless audio device 202 may transmit the voice agent triggering to the electronic device 201 in response to detecting the wake-up utterance. The electronic device 201 may receive the voice agent triggering and the voice command by using the wearable application. The wearable application may transmit the received voice agent triggering and voice command to the voice agent application of the electronic device 201.

In operation 1535, the electronic device 201 may determine the end of the dialog mode based on the voice command. The voice agent application may perform voice recognition and natural language understanding for the voice command, and may determine the end of the dialog mode based on the voice recognition and natural language understanding. The voice agent application may generate at least one task or pass rule based on voice recognition and natural language understanding. For example, the voice agent application of the electronic device 201 may generate a task or pass rule indicating the end of the dialog mode based on the voice command. The voice agent application of the electronic device 201 may transmit, to the wearable application, information indicating the end of the dialog mode.

In operation 1540, the electronic device 201 may transmit, to the wireless audio device 202, a signal for instructing that the ANC and the ambient sound be returned back to a previous state (e.g., a state before operation 1510). For example, if information indicating the end of the dialog mode is obtained from the voice agent application, the wearable application of the electronic device 201 may transmit, to the wireless audio device 202, the signal for instructing that return back to the previous state be performed. In an example, the information on the previous state may be possessed by the wearable application of the electronic device 201. In an example, information on the previous state may be stored in the wireless audio device 202.

Figure 16:
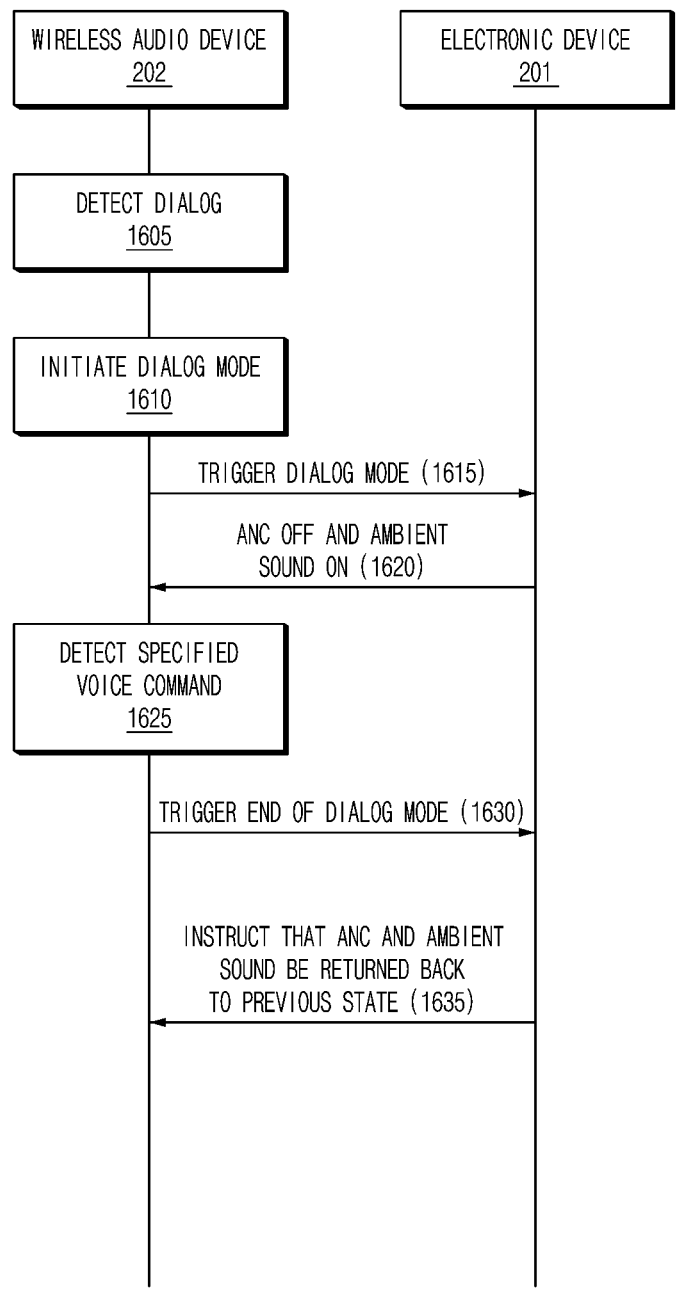
FIG. 16 illustrates a signal flow diagram of a method for ending a specified voice command-based dialog mode according to an embodiment of the disclosure.

FIG. 16 illustrates a signal flow diagram of a method for ending a specified voice command-based dialog mode according to an embodiment of the disclosure.

Referring to FIG. 16, the electronic device 201 (e.g., the user terminal 2001 of FIG. 20) may control the dialog mode of the wireless audio device 202 without using the intelligent server 1400 (e.g., the intelligent server 2100 of FIG. 20) or the voice agent. It may be assumed that the electronic device 201 and the wireless audio device 202 are wirelessly connected. For example, the electronic device 201 may include the media application for controlling media and the wearable application for controlling wearable devices including the wireless audio device 202.

In the example of FIG. 16, the dialog mode may be started by detection of a dialog and may be ended based on a specified voice command.

In operation 1605, the wireless audio device 202 may detect a dialog. For example, the wireless audio device 202 may detect a dialog by detecting an utterance of the user or an utterance of the other person that is maintained for a specified first time interval (e.g., is in FIGS. 8, 9, and 10) or longer.

In operation 1610, the wireless audio device 202 may initiate the dialog mode in response to detecting the dialog.

For example, a dialog mode module (e.g., the dialog mode module 520 of FIG. 5) may determine the start of the dialog mode.

In operation 1615, the wireless audio device 202 may transmit, to the electronic device 201, a signal for triggering the dialog mode. For example, the wireless audio device 202 may transmit a signal including information indicating the start of the dialog mode through a wireless connection to the electronic device 201.

In operation 1620, the electronic device 201 may transmit, to the wireless audio device 202, a signal for instructing that the ANC be OFF and the ambient sound be ON, with the initiation of the dialog mode. Description of operation 1620 may be referred to by description of operation 1420 of FIG. 14.

In operation 1625, the wireless audio device 202 may detect a specified voice command. For example, the wireless audio device 202 may be configured to detect a specified voice command (e.g., the end of the dialog mode). The wireless audio device 202 may store a voice model for the specified voice command in a memory (e.g., the memories 431 and 432 of FIG. 4), compare the stored voice model with the received voice, and detect the specified voice command. In the present example, the wireless audio device 202 may be configured to detect the specified voice command even if there is no wake-up utterance. For example, the voice model may be pre-trained to recognize (or detect) the specified voice command.

In operation 1630, the wireless audio device 202 may transmit, to the electronic device 201, triggering of the end of the dialog mode end. For example, the wireless audio device 202 may transmit a dialog mode end triggering to the electronic device 201 in response to detecting the specified voice command. The electronic device 201 may receive the dialog mode end triggering by using the wearable application.

In operation 1635, the electronic device 201 may transmit, to the wireless audio device 202, a signal for instructing that the ANC and the ambient sound be returned back to a previous state (e.g., a state before operation 1610). For example, if information indicating the end of the dialog mode is obtained, the wearable application of the electronic device 201 may transmit, to the wireless audio device 202, the signal for instructing that return back to the previous state be performed. In an example, the information on the previous state may be possessed by the wearable application of the electronic device 201. In an example, information on the previous state may be stored in the wireless audio device 202.

Figure 17:
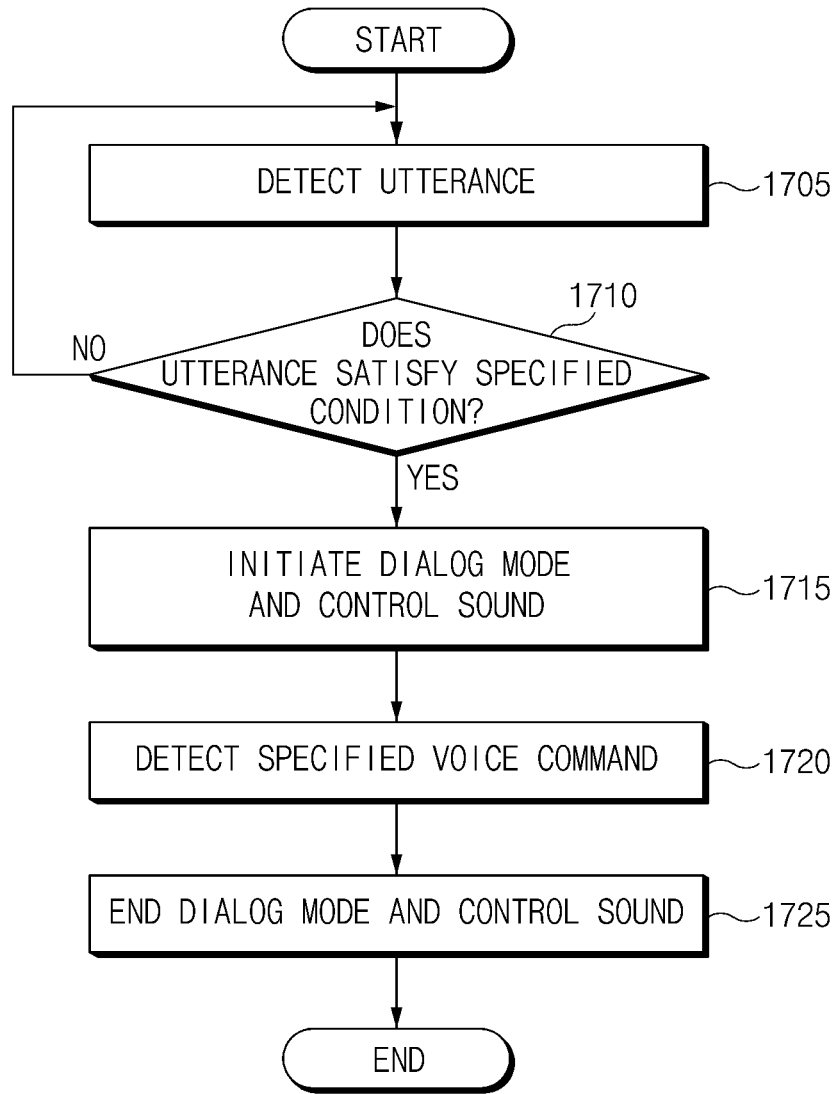
FIG. 17 shows a flowchart of a method for controlling a voice-based dialog mode according to an embodiment of the disclosure.

FIG. 17 shows a flowchart of a method for controlling a voice-based dialog mode according to an embodiment of the disclosure. According to an embodiment, operations described in FIG. 17 may be implemented as instructions loaded from the memory (e.g., the memories 431 and 432 of FIG. 3) of the wireless audio device 202 and executed by the processor (e.g., the processors 421 and 422 of FIG. 3).

Referring to FIG. 17, the wireless audio device 202 may control the dialog mode without intervention of the electronic device 201. For example, the wireless audio device 202 may be configured to recognize a specified voice command (e.g., operation 1625 of FIG. 16).

In the example of FIG. 17, the dialog mode may be started by detection of a dialog and may be ended based on a specified voice command.

In operation 1705, the wireless audio device 202 may detect an utterance.

In operation 1710, the wireless audio device 202 may determine whether the utterance satisfies a specified condition. For example, the wireless audio device 202 may determine that the specified condition is satisfied if an utterance of the user or an utterance of the other person that has been maintained for a specified first time interval (e.g., is in FIGS. 8, 9, and 10) or longer is detected. For example, the wireless audio device 202 may determine that the specified condition is satisfied if the utterance of the user or the utterance of the other person is detected that is maintained for a specified first time interval or longer and the utterance is not the wake-up utterance of the voice agent.

If the specified condition is not satisfied (NO in operation 1710), the wireless audio device 202 may continue to monitor the audio signal.

If the specified condition is satisfied (YES in operation 1710), in operation 1715, the wireless audio device 202 may initiate the dialog mode and perform sound control. The wireless audio device 202 may initiate the dialog mode in response to detecting the utterance that satisfies the specified condition. For example, a dialog mode module (e.g., the dialog mode module 520 of FIG. 5) may determine the start of the dialog mode. The wireless audio device 202 may control the sound with the initiation of the dialog mode. For example, the wireless audio device 202 may deactivate the ANC and activate the ambient sound.

In operation 1720, the wireless audio device 202 may detect a specified voice command. For example, the wireless audio device 202 may be configured to detect a specified voice command (e.g., the end of the dialog mode). The wireless audio device 202 may store a voice model for the specified voice command, compare the stored voice model with the received voice, and detect the specified voice command. In the example, the wireless audio device 202 may be configured to detect the specified voice command even if there is no wake-up utterance.

In operation 1725, the wireless audio device 202 may end the dialog mode and perform the sound control. For example, the wireless audio device 202 may end the dialog mode in response to detecting the specified voice command. The wireless audio device 202 may return the ANC and ambient sounds back to a previous state (e.g., a state before the start of the dialog mode (e.g., a state before operation 1715)) with the end of the dialog mode.

Figure 18:
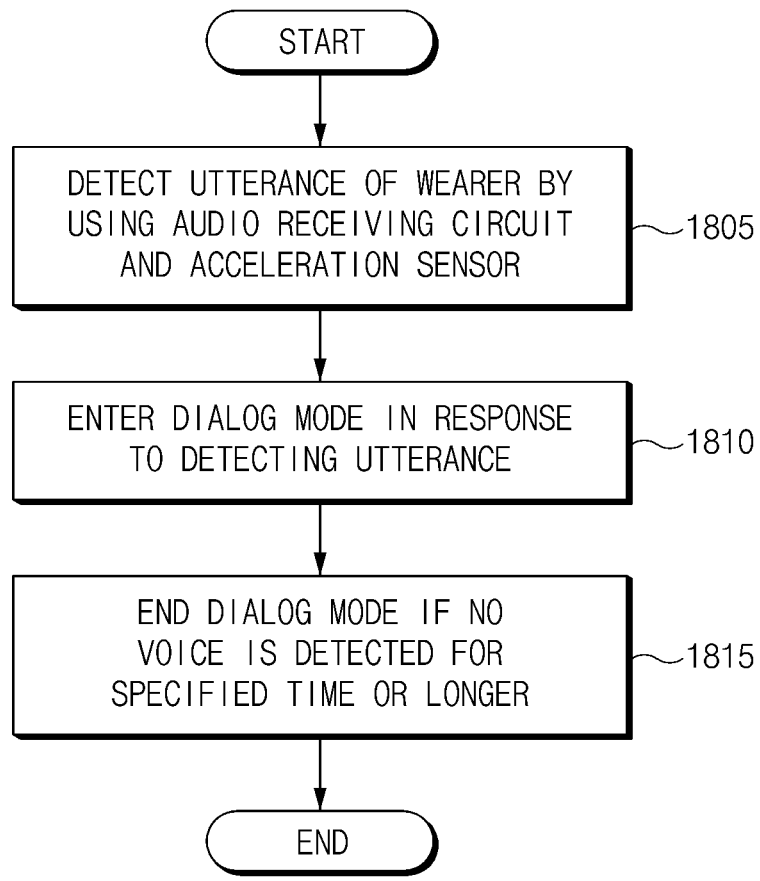
FIG. 18 shows a flowchart of a method for controlling a dialog mode according to an embodiment of the disclosure.

FIG. 18 shows a flowchart of a method for controlling a dialog mode according to an embodiment of the disclosure.

According to an embodiment, referring to operations described in FIG. 18 may be implemented as instructions loaded from the memory of the wireless audio device 202 (e.g., the memory 431 and/or the memory 432 of FIG. 3) and executed by the processor (e.g., the processor 421 and/or the processor 422 of FIG. 3). In operation 1805, the wireless audio device 202 may detect an utterance of the wearer by using an audio receiving circuit (e.g., the audio receiving circuit 481 and/or the audio receiving circuit 482 in FIG. 3) and an acceleration sensor (e.g., the sensor circuit 451 and/or the sensor circuit 452 in FIG. 3). For example, a method for detecting an utterance of a wearer may be described later with reference to FIG. 19.

In operation 1810, the wireless audio device 202 may enter the dialog mode in response to detecting the utterance. For example, the wireless audio device 202 may deactivate the ANC and activate the ambient sound in response to entering the dialog mode. For example, the wireless audio device 202 may start the dialog mode according to the methods described above with reference to FIGS. 14, 15, 16, and 17. For example, the wireless audio device 202 may start the dialog mode based on a signal received from the electronic device 201 or based on a determination of starting the dialog mode.

In operation 1815, the wireless audio device 202 may end the dialog mode if no voice is detected for a specified time or longer. In response to the end of the dialog mode, the wireless audio device 202 may return the ANC and ambient sounds back to a previous state. For example, the wireless audio device 202 may end the dialog mode according to the methods described above with reference to FIGS. 16 and 17.

Figure 19:
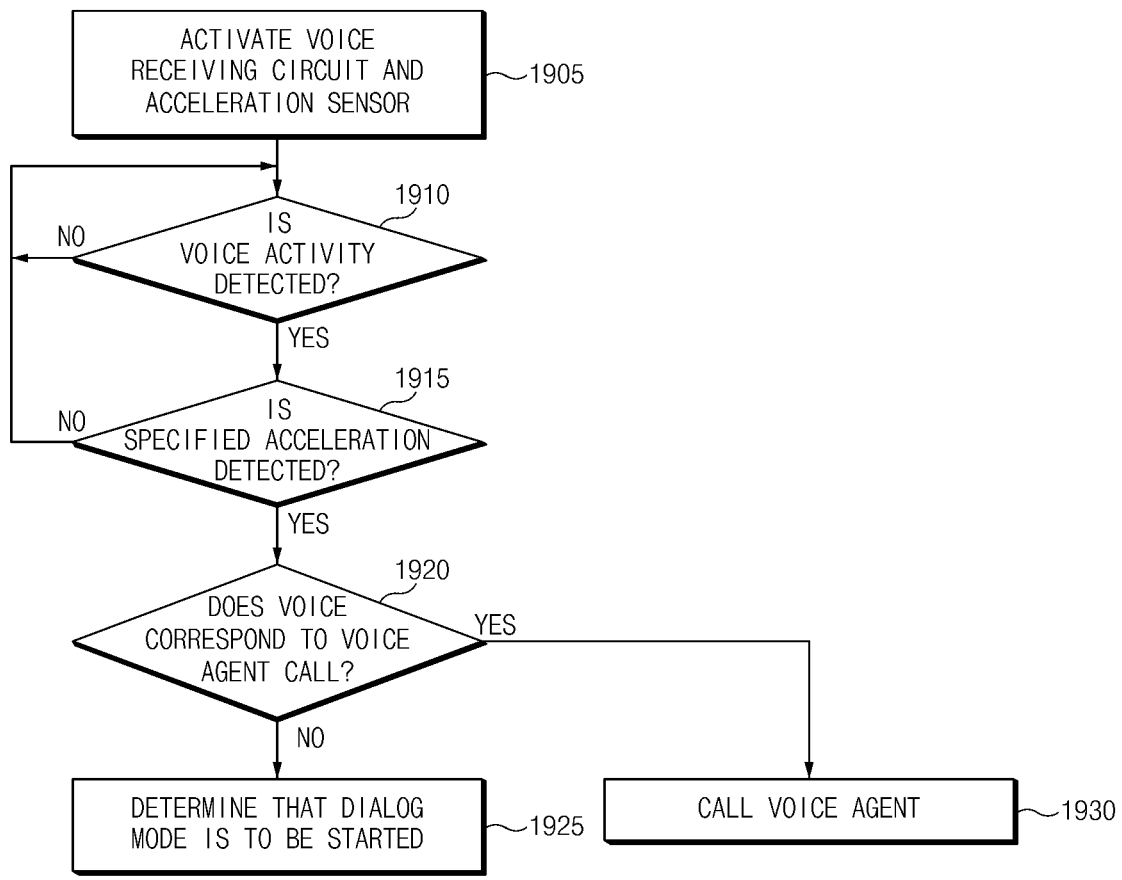
FIG. 19 shows a flowchart of a method for controlling a dialog mode in consideration of a voice agent call according to an embodiment of the disclosure.

FIG. 19 shows a flowchart of a method for controlling a dialog mode in consideration of a voice agent call according to an embodiment of the disclosure.

According to an embodiment, referring to operations described in FIG. 19 may be implemented as instructions loaded from the memory of the wireless audio device 202 (e.g., the memory 431 and/or the memory 432 of FIG. 3) and executed by the processor (e.g., the processor 421 and/or the processor 422 of FIG. 3).

In operation 1905 of FIG. 19, the wireless audio device 202 may activate the voice receiving circuit and the acceleration sensor. For example, the wireless audio device 202 may activate the voice receiving circuit in a state in which the wireless audio device 202 is worn. For example, the wireless audio device 202 may activate the acceleration sensor when the dialog mode control (e.g., voice detection-based dialog mode control) is activated. For another example, the wireless audio device 202 may activate the acceleration sensor in the state in which the wireless audio device 202 is worn.

In operation 1910, the wireless audio device 202 may detect whether a voice activity is detected. For example, the wireless audio device 202 may determine whether the voice activity is detected by using the VAD. If no voice activity is detected (e.g., NO in operation 1910), the wireless audio device 202 may continue to monitor whether voice activity is detected.

If the voice activity is detected (e.g., YES in operation 1910), in operation 1915, the wireless audio device 202 may determine whether a specified acceleration is detected. For example, the specified acceleration may include a specified magnitude and/or a specified acceleration pattern that may be detected through the utterance of the wearer. If no specified acceleration is detected (e.g., NO in operation 1915), the wireless audio device 202 may continue to monitor whether voice activity is detected.

If the specified acceleration is detected (e.g., YES in operation 1915), in operation 1920, the wireless audio device 202 may determine whether the voice corresponds to the voice agent call. For example, the wireless audio device 202 may determine that the voice corresponds to the voice agent call if the voice corresponds to the wake-up utterance. For example, the wireless audio device 202 may determine whether the voice corresponds to the voice agent call based on the confidence score described above with reference to FIG. 13. FIG. 19 illustrates that operation 1920 is performed after operation 1915; however, embodiments of the disclosure are not limited thereto. For example, operation 1920 may be performed in parallel with operation 1910 or operation 1915.

If the voice does not correspond to the voice agent call (e.g., NO in operation 1920), in operation 1925, the wireless audio device 202 may determine the start of the dialog mode.

If the voice corresponds to the voice agent call (e.g., YES in operation 1920), in operation 1930, the wireless audio device 202 may call the voice agent. For example, the wireless audio device 202 may call the voice agent of the wireless audio device 202. For another example, the wireless audio device 202 may transmit a signal for the voice agent call to the electronic device 201.

FIG. 20 is a block diagram illustrating an integrated intelligence system according to an embodiment of the disclosure.

Referring to FIG. 20, the integrated intelligent system according to an embodiment may include a user terminal 2001, an intelligent server 2100, and a service server 2200.

The user terminal 2001 (e.g., the electronic device 101 of FIG. 1) according to an embodiment may be a terminal device (or electronic device) connectable to the Internet, for example, a mobile phone, a smartphone, or a personal digital assistant (PDA), a laptop computer, a television (TV), a white home appliance, a wearable device, a head mounted device (HMD), or a smart speaker.

According to the illustrated embodiment, the user terminal 2001 may include a communication interface 2090, a microphone 2070, a speaker 2055, a display 2060, a memory 2030, and/or a processor 2020. The components listed above may be operatively or electrically connected to each other.

The communication interface 2090 (e.g., the communication module 190 of FIG. 1) may be configured to be connected to an external device to transmit/receive data. The microphone 2070 (e.g., the audio module 170 of FIG. 1) may receive a sound (e.g., an utterance of the user) and convert the sound into an electrical signal. The speaker 2055 (e.g., the sound output module 155 of FIG. 1) may output the electrical signal as a sound (e.g., voice). The display 2060 (e.g., the display module 160 of FIG. 1) may be configured to display an image or video. The display 2060 according to an embodiment may also display a graphic user interface (GUI) of an executed app (or an application program).

The memory 2030 (e.g., the memory 130 of FIG. 1) according to an embodiment may store a client module 2031, a software development kit (SDK) 2033, and a plurality of applications. The client module 2031 and the SDK 2033 may constitute a framework (or a solution program) for performing general functions. In addition, the client module 2031 or the SDK 2033 may constitute a framework for processing a voice input.

The plurality of applications (e.g., 2035a and 2035b) may be programs for performing a specified function. According to an embodiment, the plurality of applications may include a first app 2035a and/or a second app 2035b. According to an embodiment, each of the plurality of applications may include a plurality of operations for performing a specified function. For example, the applications may include an alarm app, a message app, and/or a schedule app. According to an embodiment, the plurality of applications may be executed by the processor 2020 to sequentially execute at least some of the plurality of operations.

The processor 2020 according to an embodiment may control the overall operations of the user terminal 2001. For example, the processor 2020 may be electrically connected to the communication interface 2090, the microphone 2070, the speaker 2055, and the display 2060 to perform a specified operation. For example, the processor 2020 may include at least one processor.

The processor 2020 according to an embodiment may also execute a program stored in the memory 2030 to perform a specified function. For example, the processor 2020 may execute at least one of the client module 2031 and the SDK 2033 to perform the following operations for processing a voice input. The processor 2020 may control operations of a plurality of applications through, for example, the SDK 2033. The following operations described as operations of the client module 2031 or SDK 2033 may be operations performed by execution of the processor 2020.

The client module 2031 according to an embodiment may receive a voice input. For example, the client module 2031 may receive a voice signal corresponding to an utterance of the user detected through the microphone 2070. The client module 2031 may transmit the received voice input (e.g., voice signal) to the intelligent server 2100. The client module 2031 may transmit, to the intelligent server 2100, state information of the user terminal 2001 together with the received voice input. The state information may be, for example, execution state information of an app.

The client module 2031 according to an embodiment may receive a result corresponding to the received voice input from the intelligent server 2100. For example, if the intelligent server 2100 may calculate a result corresponding to the received voice input, the client module 2031 may receive a result corresponding to the received voice input. The client module 2031 may display the received result on the display 2060.

The client module 2031 according to an embodiment may receive a plan corresponding to the received voice input. The client module 2031 may display, on the display 2060, execution results of a plurality of actions of the app according to the plan. The client module 2031 may, for example, sequentially display, on the display, the execution results of the plurality of actions. For another example, the user terminal 2001 may display only some execution results of the plurality of actions (e.g., the result of the last action) on the display.

According to an embodiment, the client module 2031 may receive a request for obtaining information necessary for calculating a result corresponding to the voice input from the intelligent server 2100. According to an embodiment, the client module 2031 may transmit the necessary information to the intelligent server 2100 in response to the request.

The client module 2031 according to an embodiment may transmit, to the intelligent server 2100, result information obtained by executing the plurality of actions according to the plan. The intelligent server 2100 may confirm that the voice input received by using the result information has been correctly processed.

The client module 2031 according to an embodiment may include a voice recognition module. According to an embodiment, the client module 2031 may recognize a voice input to perform a limited function through the voice recognition module. For example, the client module 2031 may execute an intelligent app for processing a specified voice input (e.g., wake up!) by performing an organic operation in response to the voice input.

The intelligent server 2100 according to an embodiment may receive information related to the voice input of the user from the user terminal 2001 through a network 2099 (e.g., the first network 198 and/or the second network 199 of FIG. 1). According to an embodiment, the intelligent server 2100 may change data related to the received voice input into text data. According to an embodiment, the intelligent server 2100 may generate at least one plan for performing a task corresponding to the voice input of the user based on the text data.

According to one embodiment, the plan may be generated by an artificial intelligent (AI) system. The artificial intelligence system may be a rule-based system, and may be a neural network-based system (e.g., a feedforward neural network (FNN), and/or a recurrent neural network (RNN)). Alternatively, the artificial intelligence system may be a combination of the above, or another artificial intelligence system other than the above. According to an embodiment, the plan may be selected from a set of predefined plans or may be generated in real time in response to a user request. For example, the artificial intelligence system may select at least one plan from among a plurality of predefined plans.

The intelligent server 2100 according to an embodiment may transmit a result according to the generated plan to the user terminal 2001 or transmit the generated plan to the user terminal 2001. According to an embodiment, the user terminal 2001 may display a result according to the plan on the display. According to an embodiment, the user terminal 2001 may display, on the display, a result obtained by executing actions according to the plan.

The intelligent server 2100 according to an embodiment may include a front end 2110, a natural language platform 2120, a capsule database 2130, an execution engine 2140, an end user interface 2150, a management platform 2160, a big data platform 2170, or an analytics platform 2180.

The front end 2110 according to an embodiment may receive a voice input received by the user terminal 2001 from the user terminal 2001. The front end 2110 may transmit a response corresponding to the voice input to the user terminal 2001.

According to an embodiment, the natural language platform 2120 may include an automatic speech recognition module (ASR module) 2121, a natural language understanding module (NLU module) 2123, a planner module 2125, a natural language generator module (NLG module) 2127, and/or a text to speech module (TTS module) 2129.

The automatic voice recognition module 2121 according to an embodiment may convert the voice input received from the user terminal 2001 into text data. The natural language understanding module 2123 according to an embodiment may determine the user's intention by using text data of the voice input. For example, the natural language understanding module 2123 may determine the user's intention by performing syntactic analysis and/or semantic analysis. The natural language understanding module 2123 according to an embodiment may identify the meaning of words by using linguistic features (e.g., grammatical elements) of morphemes or phases, and determine the user's intention by matching the meaning of the identified word with the intention.

The planner module 2125 according to an embodiment may generate a plan by using the intention and parameters determined by the natural language understanding module 2123. According to an embodiment, the planner module 2125 may determine a plurality of domains required to perform a task based on the determined intention. The planner module 2125 may determine a plurality of actions included in each of the plurality of domains determined based on the intention. According to an embodiment, the planner module 2125 may determine parameters required to execute the determined plurality of actions or a result value output by the execution of the plurality of actions. The parameter and the result value may be defined as a concept of a specified format (or class). Accordingly, the plan may include a plurality of actions and/or a plurality of concepts determined by the user's intention. The planner module 2125 may determine the relationship between the plurality of actions and the plurality of concepts in stages (or hierarchically). For example, the planner module 2125 may determine an execution order of the plurality of actions determined based on the user's intention based on the plurality of concepts. In other words, the planner module 2125 may determine the execution order of the plurality of actions based on parameters required for execution of the plurality of actions and results output by the execution of the plurality of actions. Accordingly, the planner module 2125 may generate a plan including relation information (e.g., ontology) between a plurality of actions and a plurality of concepts. The planner module 2125 may generate the plan by using information stored in the capsule database 2130 in which a set of relationships between concepts and actions is stored.

The natural language generator module 2127 according to an embodiment may change specified information into a text format. The information changed to the text format may be in the form of natural language utterance. The text to speech module 2129 according to an embodiment may change information in a text format into information in a voice format.

According to an embodiment, some or all of the functions of the natural language platform 2120 may be implemented in the user terminal 2001 as well. For example, the user terminal 2001 may include an automatic speech recognition module and/or a natural language understanding module. After the user terminal 2001 recognizes a voice command of the user, text information corresponding to the recognized voice command may be transmitted to the intelligent server 2100. For example, the user terminal 2001 may include a text-to-speech module. The user terminal 2001 may receive text information from the intelligent server 2100 and output the received text information as voice.

The capsule database 2130 may store information on relationships between a plurality of concepts and actions corresponding to a plurality of domains. A capsule according to an embodiment may include a plurality of action objects (or action information) and/or concept objects (or concept information) included in the plan. According to an embodiment, the capsule database 2130 may store a plurality of capsules in the form of a concept action network (CAN). According to an embodiment, the plurality of capsules may be stored in a function registry included in the capsule database 2130.

The capsule database 2130 may include a strategy registry in which strategy information necessary for determining a plan corresponding to a voice input is stored. The strategy information may include reference information for determining one plan when there are a plurality of plans corresponding to the voice input. According to an embodiment, the capsule database 2130 may include a follow up registry in which information on a subsequent action for suggesting a subsequent action to the user in a specified situation is stored. The subsequent action may include, for example, a subsequent utterance. According to an embodiment, the capsule database 2130 may include a layout registry that stores layout information regarding information output through the user terminal 2001. According to an embodiment, the capsule database 2130 may include a vocabulary registry in which vocabulary information included in the capsule information is stored. According to an embodiment, the capsule database 2130 may include a dialog registry in which information regarding a dialog (or interaction) with a user is stored. The capsule database 2130 may update a stored object through a developer tool. The developer tool may include, for example, a function editor for updating an action object or a concept object. The developer tool may include a vocabulary editor for updating the vocabulary. The developer tool may include a strategy editor for generating and registering strategies for determining plans. The developer tool may include a dialog editor for generating a dialog with the user. The developer tool may include a follow up editor that may edit follow-up utterances that activate subsequent goals and provide hints. The subsequent goal may be determined based on a currently set goal, a user's preference, or an environmental condition. In an embodiment, the capsule database 2130 may be implemented in the user terminal 2001 as well.

The execution engine 2140 according to an embodiment may calculate a result by using the generated plan. The end user interface 2150 may transmit the calculated result to the user terminal 2001. Accordingly, the user terminal 2001 may receive the result and provide the received result to the user. The management platform 2160 according to an embodiment may manage information used in the intelligent server 2100. The big data platform 2170 according to an embodiment may collect user data. The analytics platform 2180 according to an embodiment may manage the quality of service (QoS) of the intelligent server 2100. For example, the analytics platform 2180 may manage the components and processing speed (or efficiency) of the intelligent server 2100.

The service server 2200 according to an embodiment may provide a specified service (e.g., food order or hotel reservation) to the user terminal 2001. According to an embodiment, the service server 2200 may be a server operated by a third party. The service server 2200 according to an embodiment may provide, to the intelligent server 2100, information for generating a plan corresponding to the received voice input. The provided information may be stored in the capsule database 2130. In addition, the service server 2200 may provide result information according to the plan to the intelligent server 2100. The service server 2200 may communicate with the intelligent server 2100 and/or the user terminal 2001 through the network 2099. The service server 2200 may communicate with the intelligent server 2100 through a separate connection. Although the service server 2200 is illustrated as one server in FIG. 20, embodiments of the disclosure are not limited thereto. At least one of the respective services 2201, 2202, and 2203 of the service server 2200 may be implemented as a separate server.

In the integrated intelligent system described above, the user terminal 2001 may provide various intelligent services to the user in response to a user input. The user input may include, for example, an input through a physical button, a touch input, or a voice input.

In an embodiment, the user terminal 2001 may provide a voice recognition service through an intelligent app (or a voice recognition app) stored therein. In this case, for example, the user terminal 2001 may recognize a user utterance or a voice input received through the microphone, and provide a service corresponding to the recognized voice input to the user.

In an embodiment, the user terminal 2001 may perform a specified operation alone or together with the intelligent server and/or the service server, based on the received voice input. For example, the user terminal 2001 may execute an app corresponding to the received voice input and perform a specified operation through the executed app.

In an embodiment, when the user terminal 2001 provides a service together with the intelligent server 2100 and/or the service server, the user terminal may detect a user utterance by using the microphone 2070 and generate a signal (or voice data) corresponding to the detected user utterance. The user terminal may transmit the voice data to the intelligent server 2100 by using the communication interface 2090.

In response to the voice input received from the user terminal 2001, the intelligent server 2100 according to an embodiment may generate a plan for performing a task corresponding to the voice input, or a result of performing an action according to the plan. The plan may include, for example, a plurality of actions for performing a task corresponding to the voice input of the user and/or a plurality of concepts related to the plurality of actions. The concepts may define parameters input to the execution of the plurality of actions or result values output by the execution of the plurality of actions. The plan may include relation information between a plurality of actions and/or a plurality of concepts.

The user terminal 2001 according to an embodiment may receive the response by using the communication interface 2090. The user terminal 2001 may output a voice signal generated in the user terminal 2001 by using the speaker 2055 to the outside, or output an image generated in the user terminal 2001 by using the display 2060 to the outside.

Figure 21:
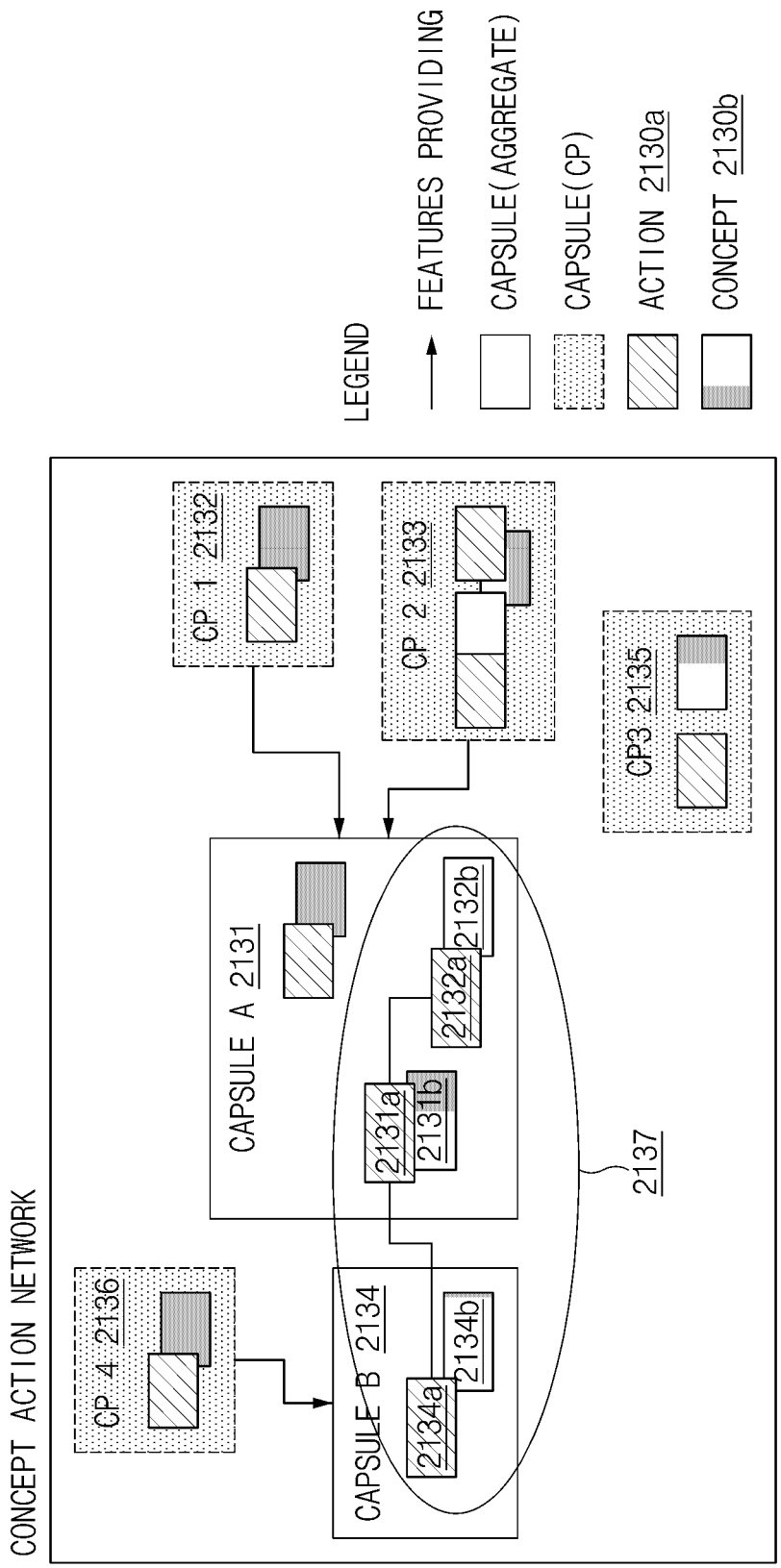
FIG. 21 is a diagram illustrating a form in which relation information between concepts and actions is stored in a database, according to an embodiment of the disclosure.

FIG. 21 is a diagram illustrating a form in which relation information between concepts and actions is stored in a database, according to an embodiment of the disclosure.

Referring to FIG. 21, a capsule database (e.g., the capsule database 2130) of the intelligent server 2100 may store a capsule in the form of a concept action network (CAN). The capsule database may store an action for processing a task corresponding to a voice input of the user and a parameter necessary for the action in the form of the concept action network (CAN).

The capsule database may store a plurality of capsules (a capsule A 2131 and a capsule B 2134) corresponding to a plurality of domains (e.g., applications), respectively. According to an embodiment, one capsule (e.g., the capsule A 2131) may correspond to one domain (e.g., location (geo), application). In addition, one capsule may correspond to a capsule of at least one service provider for performing a function for a domain related to the capsule (e.g., CP 1 2132, CP 2 2133, CP3 2135, and/or CP4 2136). According to an embodiment, one capsule may include at least one action 2130a and at least one concept 2130b for performing a specified function.

The natural language platform 2120 may generate a plan for performing a task corresponding to the voice input received by using a capsule stored in the capsule database 2130. For example, the planner module 2125 of the natural language platform may generate a plan by using a capsule stored in the capsule database. For example, a plan 2137 may be generated by using actions 2131a and 2132a and concepts 2131b and 2132b of the capsule A 2131 and an action 2134a and a concept 2134b of the capsule B 2134.

Figure 22:
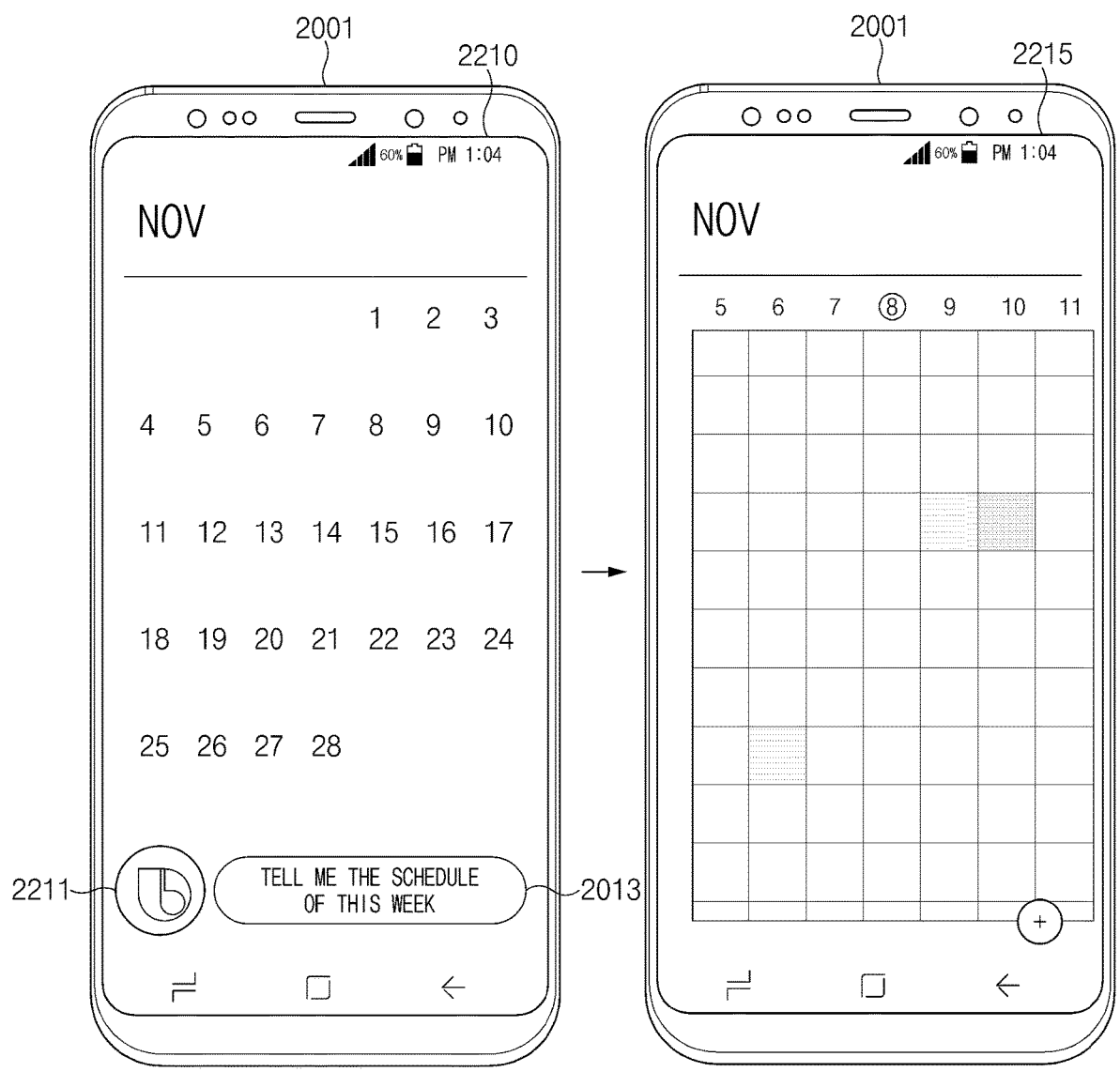
FIG. 22 is a diagram illustrating a user terminal displaying a screen for processing a voice input received through an intelligent app, according to an embodiment of the disclosure.

FIG. 22 is a diagram illustrating a screen in which the user terminal processes a voice input received through the intelligent app, according to an embodiment of the disclosure.

The user terminal 2001 may execute an intelligent app to process the user input through the intelligent server 2100.

Referring to FIG. 22, according to an embodiment, if a specified voice input (e.g., wake up!) is recognized or an input is received through a hardware key (e.g., dedicated hardware key), on a first screen 2210, the user terminal 2001 may execute the intelligent app to process the voice input. The user terminal 2001 may, for example, execute the intelligent app in a state in which the schedule app is being executed. According to an embodiment, the user terminal 2001 may display an object (e.g., an icon) 2211 corresponding to the intelligent app on the display 2060. According to an embodiment, the user terminal 2001 may receive a voice input by a user utterance. For example, the user terminal 2001 may receive a voice input saying "Tell me the schedule of the week!". According to an embodiment, the user terminal 2001 may display a user interface (UI) 2013 (e.g., an input window) of the intelligent app in which text data of the received voice input is displayed on the display.

According to an embodiment, on the second screen 2215, the user terminal 2001 may display a result corresponding to the received voice input on the display. For example, the user terminal 2001 may receive a plan corresponding to the received user input, and display 'schedule of this week' on the display according to the plan.

Figure 23:
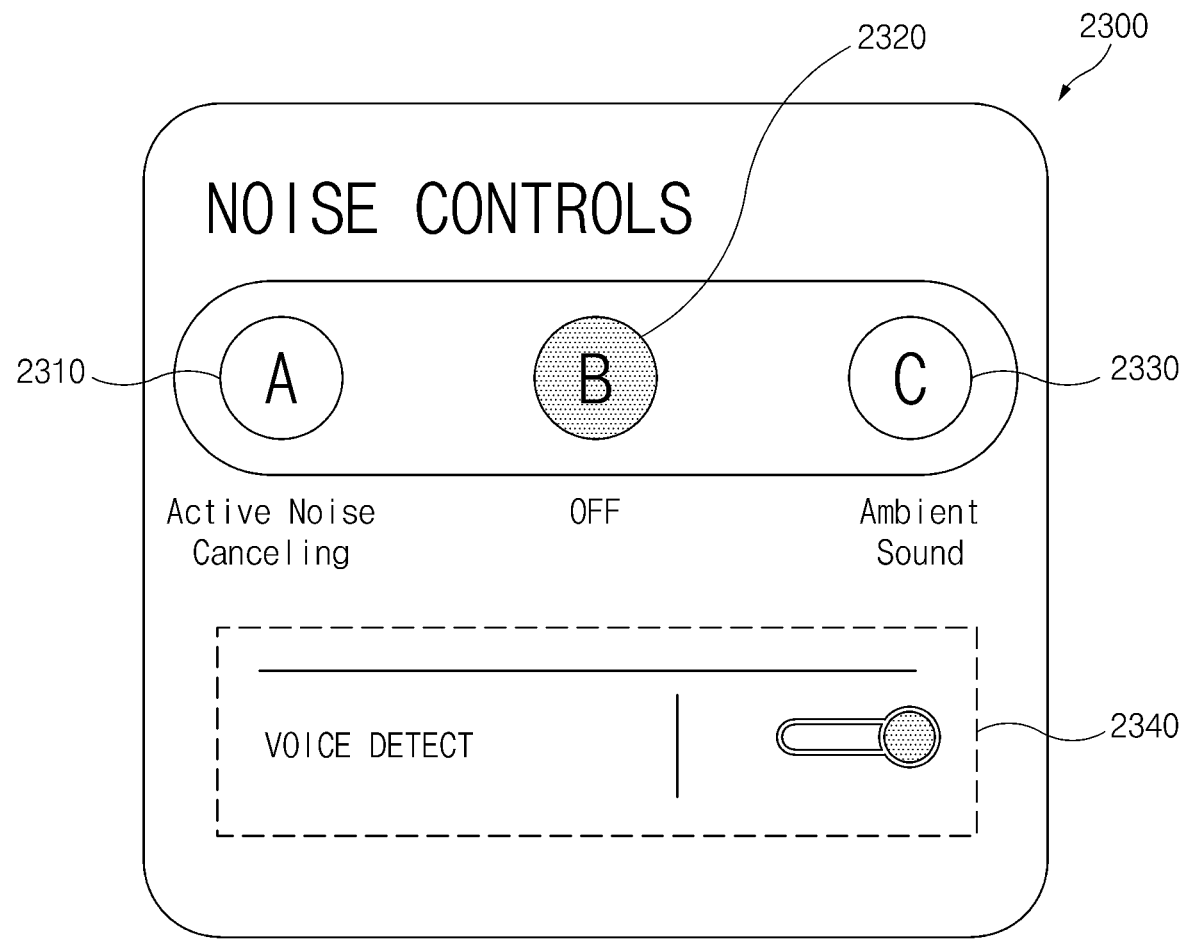
FIG. 23 illustrates a user interface according to an embodiment of the disclosure.

FIG. 23 illustrates a user interface according to an embodiment of the disclosure.

Referring to FIG. 23, according to an embodiment, an electronic device (e.g., the electronic device 201 of FIG. 2) may provide a user interface 2300 for noise control. For example, the electronic device 201 may display the user interface 2300 on the display 360 of the electronic device 201. The electronic device 201 may provide the user interface 2300 based on a user input.

According to an embodiment, the user interface 2300 may include a first icon 2310, a second icon 2320, and a third icon 2330. The first icon 2310 may indicate that the ANC function is activated. For example, if the first icon 2310 is displayed in the first state, the first icon 2310 may indicate that the ANC function is activated. If the first icon 2310 is displayed in the second state, the first icon 2310 may indicate that the ANC function is deactivated. The second icon 2320 may indicate that the ANC function is deactivated. For example, if the second icon 2320 is displayed in the first state, the second icon 2320 may indicate that the ANC function is deactivated. If the second icon 2320 is displayed in the second state, the second icon 2320 may indicate that the ANC function is activated. The third icon 2330 may indicate whether ambient sounds are activated. If the third icon 2330 is displayed in the first state, the third icon 2330 may indicate that the ambient sounds are activated. If the third icon 2330 is displayed in the second state, the third icon 2330 may indicate that the ambient sounds are deactivated. The first state and the second state may be different in at least one display characteristic. For example, the first state and the second state may be different from each other in saturation, shape, color, and/or size. In the example of FIG. 23, the first icon 2310 and the third icon 2330 may be displayed in the second state, and the second icon 2320 may be displayed in the first state. In the example of FIG. 23, the electronic device 201 may indicate, through the user interface 2300, that the ANC function and the ambient sounds of the wireless audio device 202 are deactivated.

According to an embodiment, the electronic device 201 may display a voice detection setting interface 2340 for activating a voice detection-based dialog mode on the user interface 2300. For example, based on an input to the voice detection setting interface 2340, the electronic device 201 may change the voice-based dialog mode activation setting. The wireless audio device 202 may be configured to detect the voice of the wearer when the voice detection setting is enabled. The wireless audio device 202 may dynamically activate or deactivate the dialog mode based on whether the voice of the wearer is detected. The wireless audio device 202 may not perform voice detection for activating the dialog mode when the voice detection configuration is disabled. In the example of FIG. 23, the electronic device 201 may indicate, through the user interface 2300, that the activation function of the voice detection-based dialog mode of the wireless audio device 202 is activated.

According to an embodiment, the wireless audio device 202 may activate the dialog mode based on the voice of the wearer when the activation function of the voice detection-based dialog mode is activated. For example, the wireless audio device 202 detects whether the wireless audio device 202 is worn by the user, and if the wireless audio device 202 is worn by the user, activates the dialog mode based on detecting the voice of the user. For example, if it is detected that both the first wireless audio device 202_1 and the second wireless audio device 202_2 are worn by the user and the voice of the user is detected, the wireless audio device 202 may activate the dialog mode according to the methods described above with reference to FIGS. 5 to 19. For another example, if it is detected that only one of the first wireless audio device 202_1 and the second wireless audio device 202_2 is worn by the user, the wireless audio device 202 may not activate the dialog mode even if the voice of the user is detected. For another example, if both the first wireless audio device 202_1 and the second wireless audio device 202_2 are not worn by the user, the wireless audio device 202 may not activate the dialog mode.

In an example, the ambient sound function of the wireless audio device 202 may be activated. In this case, the electronic device 201 may display the third icon 2330 in the first state. For example, when the dialog mode is initiated, the electronic device 201 may display the third icon 2330 in the first state. For another example, the ambient sound function may be in an activated state before the initiation of the dialog mode. In this case, the electronic device 201 may display the third icon 2330 in the first state regardless of the start or end of the dialog mode. The wireless audio device 202 may perform sound control (e.g., decrease the volume of the media being output) with the initiation of the dialog mode.

Hereinafter, various user interfaces may be described with reference to FIGS. 24 to 26. Hereinafter, descriptions of components having the same reference numerals as those described above with reference to FIG. 23 may be omitted for convenience of description.

Figure 24:
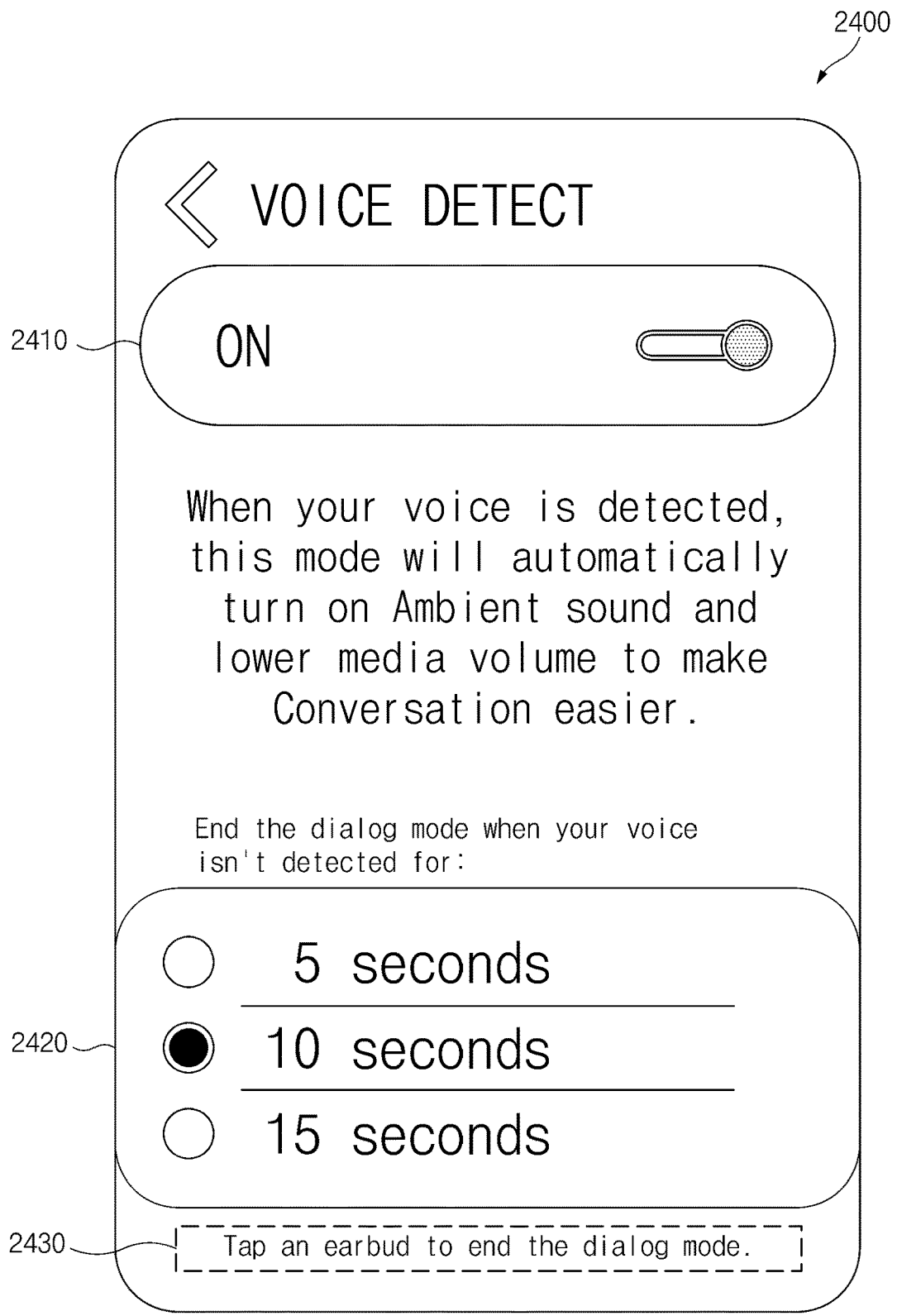
FIG. 24 illustrates a dialog mode control user interface according to an embodiment of the disclosure.

FIG. 24 illustrates a dialog mode control user interface according to an embodiment of the disclosure.

When a voice detection-based dialog mode activation function is activated, the wireless audio device 202 may initiate the dialog mode by detecting an utterance of a wearer (e.g., the user). For example, as described above with reference to FIGS. 1 to 19, if an utterance of the wearer is detected, the wireless audio device 202 may automatically initiate the dialog mode. When the voice detection-based dialog mode activation function is deactivated, the wireless audio device 202 may not initiate the dialog mode even if an utterance of the wear is detected.

According to an embodiment, the electronic device 201 may provide a dialog mode control user interface 2400 for controlling the voice detection-based dialog mode activation function of the wireless audio device 202. For example, if an input for activating the voice detection-based dialog mode activation function (e.g., a touch input to the voice detection setting interface 2340 of the user interface 2300 of FIG. 23) is received, the electronic device 201 may display the dialog mode control user interface 2400.

Referring to FIG. 24, for example, the dialog mode control user interface 2400 may include a setting bar 2410 indicating the state of the voice detection-based dialog mode activation function. The electronic device 201 may be configured to control activation or deactivation of the voice detection-based dialog mode activation function based on an input to the setting bar 2410.

For example, the dialog mode control user interface 2400 may include an interface 2420 for setting a time for the end of the dialog mode (e.g., to in FIGS. 8, 9, and 10). The user of the electronic device 201 may set a time for the end of the dialog mode by performing an input to the interface 2420. The wireless audio device 202 may end the dialog mode if no voice is detected for a set time. For example, the user may set the time for the end of the dialog mode to 5 seconds, 10 seconds, or 15 seconds. The time for the end of the dialog mode shown in the dialog mode control user interface 2400 is exemplary, and embodiments of the disclosure are not limited thereto.

For example, the dialog mode control user interface 2400 may include guide information 2430 for the end of the dialog mode. Guide information 2430 may include information for guiding that the dialog mode may be ended based on an input to the wireless audio device 202.

In the examples of FIGS. 23 and 24, it may be assumed that in the wireless audio device 202, the voice detection-based dialog mode activation function is in the activated state. In this case, the wireless audio device 202 may dynamically apply the dialog mode by detecting a voice of the wearer. For example, the wireless audio device 202 may deactivate the ANC function in the dialog mode. The wireless audio device 202 may end the dialog mode if no voice is detected for a set time in the dialog mode. In this case, the wireless audio device 202 may return the ANC function back to the state before the dialog mode, in response to the end of the dialog mode. If the ANC function is activated in the state before the dialog mode, for example, the wireless audio device 202 may activate the ANC function in response to the end of the dialog mode.

Figure 25:
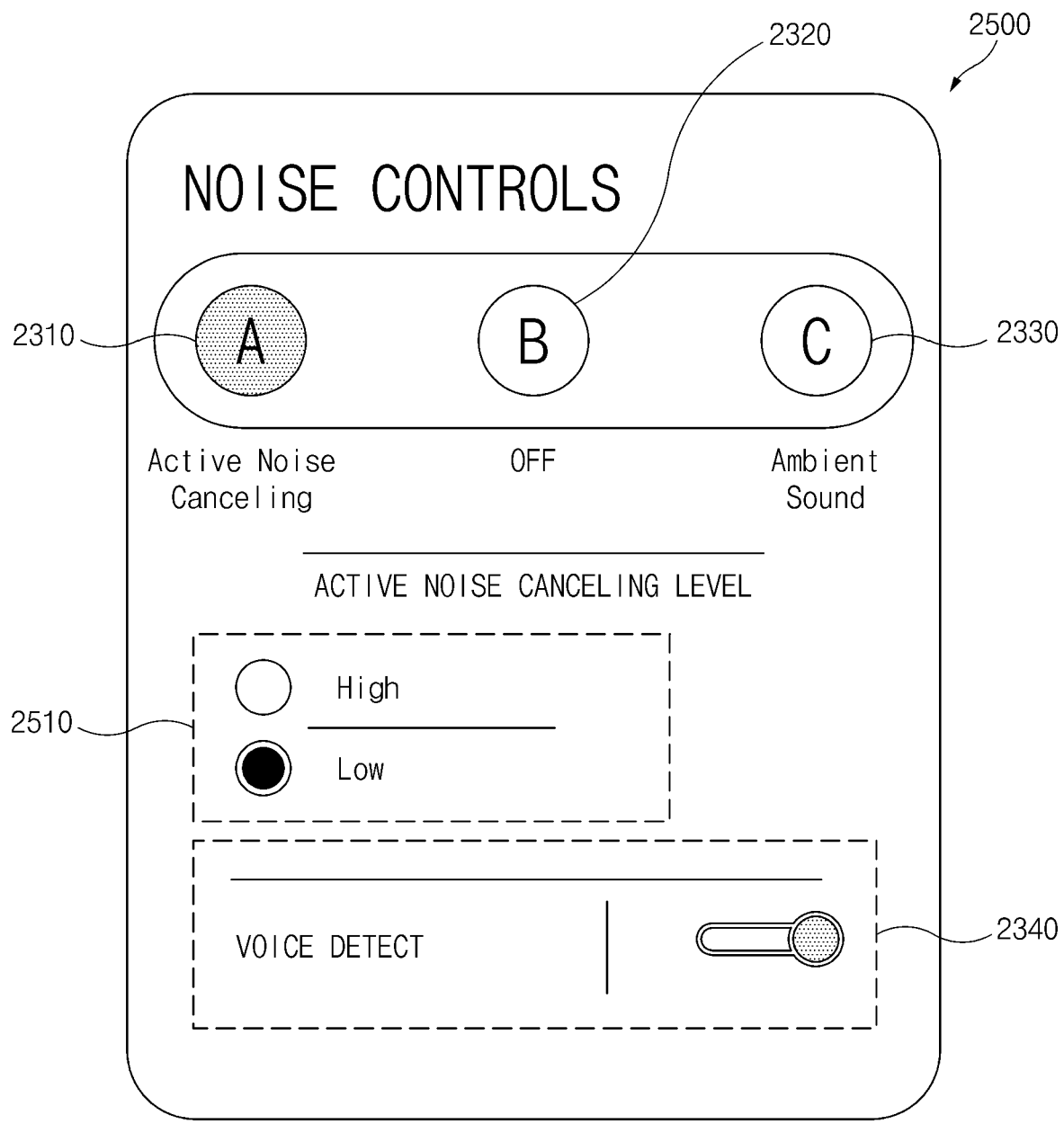
FIG. 25 illustrates a dynamic noise cancellation control user interface according to an embodiment of the disclosure.

FIG. 25 illustrates a dynamic noise cancellation control user interface according to an embodiment of the disclosure.

In the example of FIG. 25, the electronic device 201 may provide a user interface 2500 for controlling dynamic noise cancellation. For example, the electronic device 201 may activate the ANC function by returning the ANC function back to the state before the dialog mode in response to the end of the dialog mode. For another example, the electronic device 201 may activate the ANC function based on a touch input to the first icon 2310. In response to the activation of the ANC function, the electronic device 201 may display the first icon 2310 in the first state and the second icon 2320 in the second state.

Referring to FIG. 25, according to an embodiment, the user interface 2500 may include a control interface 2510 for ANC intensity control. For example, the electronic device 201 may be configured to control an ANC intensity of the wireless audio device 202 based on a user input to the control interface 2510. The wireless audio device 202 may be configured to control the ANC intensity (e.g., an ANC-related gain value) based on a signal from the electronic device 201. For example, the electronic device 201 may display the control interface 2510 when the ANC function is activated.

With the dynamic change of the dialog mode, the electronic device 201 may dynamically change the display states of the first icon 2310 and the second icon 2320. For example, it may be assumed that in the wireless audio device 202, the voice detection-based dialog mode activation function and the ANC function are in the activated state and the ambient sound function is in the deactivated state. In this case, before the initiation of the dialog mode, the electronic device 201 may display the first icon 2310 in the first state and display the second icon 2320 and the third icon 2330 in the second state. If the wireless audio device 202 is in a worn state and a voice of the wearer is detected, the wireless audio device 202 may determine the initiation of the dialog mode. In this case, the electronic device 201 may display the first icon 2310 in the second state and display the second icon 2320 and the third icon 2330 in the first state. In the dialog mode, if the voice of the user is not detected for a specified time, the wireless audio device 202 may end the dialog mode. In response to the end of the dialog mode, the electronic device 201 may display the first icon 2310 in the first state and display the second icon 2320 and the third icon 2330 in the second state.

For another example, it may be assumed that in the wireless audio device 202, the voice detection-based dialog mode activation function and the ANC function are in the activated state and the ambient sound function is in the deactivated state. In this case, before the initiation of the dialog mode, the electronic device 201 may display the first icon 2310 in the first state and display the second icon 2320 and the third icon 2330 in the second state. If the wireless audio device 202 is in the worn state and a voice of the wearer is detected, the wireless audio device 202 may determine the initiation of the dialog mode. For example, the voice of the wearer may be an utterance (e.g., wake-up utterance) for the voice agent call. In this case, the electronic device 201 may activate the ambient sound for a while in response to the utterance. The electronic device 201 may display the third icon 2330 in the first state for a while. If the utterance is an utterance for the voice agent call, the electronic device 201 may execute the voice agent and deactivate the ambient sound. The electronic device 201 may display the third icon 2330 again in the second state. In response to the execution of the voice agent, the electronic device 201 may display a user interface associated with the voice agent. The electronic device 201 may be configured to display the screen of the previous state (e.g., the user interface 2500 of FIG. 25) if the voice agent is ended.

Figure 26:
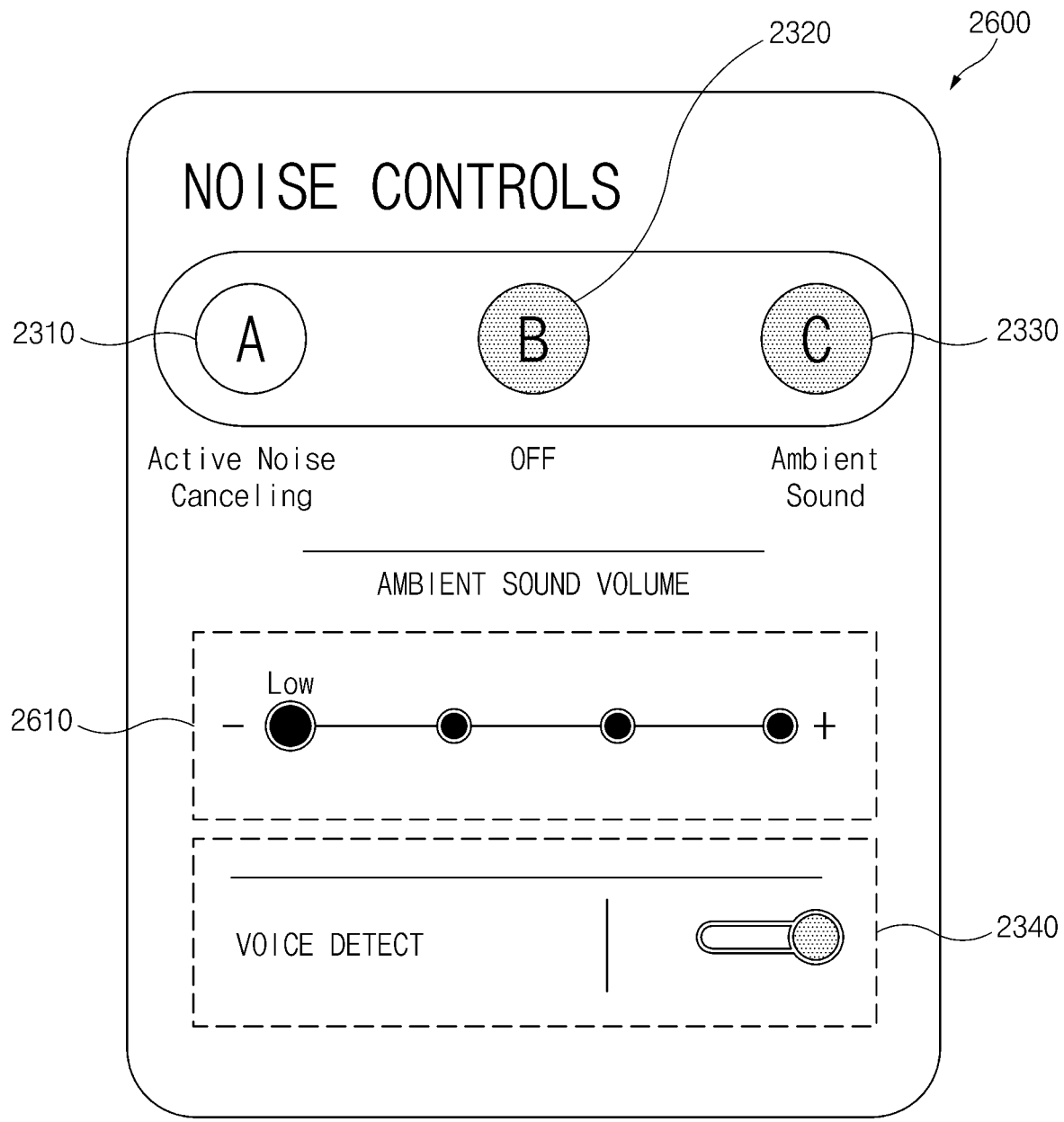
FIG. 26 illustrates an ambient sound control user interface according to an embodiment of the disclosure.

FIG. 26 illustrates an ambient sound control user interface according to an embodiment of the disclosure.

In the example of FIG. 26, the electronic device 201 may provide a user interface 2600 for controlling ambient sounds. For example, if an ambient sound function is activated (e.g., if the dialog mode is activated), the electronic device 201 may display the user interface 2600. The user interface 2600 may include a volume interface 2610 for controlling an ambient sound volume. For example, the electronic device 201 may control the ambient sound volume of the wireless audio device 202 based on a user input to the volume interface 2610.

Referring to FIGS. 23 to 26, for example, if the first wireless audio device 202-1 and the second wireless audio device 202-2 are not worn, the electronic device 201 may display the user interface 2300 of FIG. 23. If both the first wireless audio device 202-1 and the second wireless audio device 202-2 are worn by the wearer, the electronic device 201 may activate the ANC function according to the user setting, and display the user interface 2500 of FIG. 25. If one of the first wireless audio device 202-1 and the second wireless audio device 202-2 is detached from the ear of the user, the electronic device 201 may activate the ambient sound and display the user interface 2600 of FIG. 26.

Referring to FIGS. 3 and 4, the wireless audio device 202-1 or 202-2 according to an embodiment may include the audio receiving circuit 461 or 462, the audio output circuits 471 or 472, the acceleration sensor (e.g., the sensor circuit 451 or 452), the communication circuit 491 or 492, the processor 421 or 422, and the memory 431 or 432. The memory may store instructions that, when executed by the processor, cause the wireless audio device to detect an utterance of a user of the wireless audio device by using the acceleration sensor, enter a dialog mode in which at least some of ambient sounds received by the audio receiving circuit are output through the audio output circuit, in response to detecting the utterance of the user, and end the dialog mode if no voice is detected for a specified time or longer by using the audio receiving circuit in the dialog mode.

According to an embodiment, when executed by the processor, the instructions may cause the wireless audio device to detect a voice by using the audio receiving circuit, detect an acceleration corresponding to an utterance of the voice by using the acceleration sensor, and detect the utterance of the user in response to the detection of the voice and the detection of the acceleration. For example, the acceleration corresponding to the utterance of the voice may be generated by the utterance of the user.

For example, the audio receiving circuit may include at least one internal microphone (e.g., 481c of FIG. 4) facing the user and at least one external microphone (e.g., 481a and/or 481b of FIG. 4) exposed to an outside, when the audio receiving circuit is worn. When executed by the processor, the instructions may cause the wireless audio device to detect the utterance of the user by using the at least one internal microphone, and determine whether a voice is detected during the specified time by using the at least one external microphone. For example, when executed by the processor, the instructions may cause the wireless audio device to acquire an audio signal by using the at least one external microphone, and control the output ambient sounds based on a noise intensity of the audio signal. When executed by the processor, the instructions may cause the wireless audio device to emphasize a frequency band corresponding to a voice among the ambient sounds for a section in which the voice is detected among the ambient sounds. When executed by the processor, the instructions may cause the wireless audio device to acquire the ambient sounds by using the at least one external microphone, and set a length of the specified time based on a noise of the ambient sounds.

According to an embodiment, when executed by the processor, the instructions may cause the wireless audio device to enter the dialog mode if the utterance of the user does not correspond to a wake-up utterance for calling a voice agent, and not to enter the dialog mode if the utterance of the user corresponds to the wake-up utterance.

According to an embodiment, when executed by the processor, the instructions may cause the wireless audio device to deactivate active noise cancelling (ANC) if the dialog mode is entered. When executed by the processor, the instructions may cause the wireless audio device to return the ANC to a state before entering the dialog mode if the dialog mode is ended.

A method for controlling a dialog mode of a wireless audio device according to an embodiment may include detecting an utterance of a user of the wireless audio device based on an acceleration of the wireless audio device, entering a dialog mode for outputting at least some of ambient sounds, in response to detecting the utterance of the user, and ending the dialog mode if no voice is detected for a specified time or longer in the dialog mode.

For example, the detecting of the utterance of the user of the wireless audio device may include detecting a voice by using an audio receiving circuit of the wireless audio device, detecting an acceleration corresponding to an utterance of the voice by using an acceleration sensor of the wireless audio device, and detecting the utterance of the user in response to detecting the voice and the detecting of the acceleration. For example, the acceleration corresponding to the utterance of the voice may be generated by the utterance of the user. The method may further include acquiring the ambient sounds in the dialog mode and controlling the output ambient sounds based on a noise intensity of the ambient sounds.

The controlling of the output ambient sounds may include emphasizing a frequency band corresponding to a voice among the ambient sounds for a section in which the voice is detected among the ambient sounds.

The method may further include setting a length of a specified time based on the noise intensity of the ambient sounds.

The detecting of the utterance of the user of the wireless audio device may include detecting the voice signal as the utterance of the user based on the acceleration if the voice signal does not correspond to a wake-up utterance for calling a voice agent.

Referring to FIGS. 3 and 4, a wireless audio device 202-1 or 202-2 according to an embodiment may include at least one internal microphone 481c facing a user when the wireless audio device is worn, at least one external microphone 481a and/or 481b exposed to an outside when the wireless audio device is worn, an audio output circuit 471 or 472, an acceleration sensor (e.g., the sensor circuit 451 or 452), a communication circuit 491 or 492, a processor 421 or 422, and a memory 431 or 432. The memory may store instructions that, when executed by the processor, cause the wireless audio device to detect an utterance of a user of the wireless audio device by using the at least one internal microphone and the acceleration sensor, determine whether the utterance of the user corresponds to an utterance for calling a voice agent, enter a dialog mode in which at least some of ambient sounds received by the at least one external microphone are output through the audio output circuit, if the utterance of the user does not correspond to the utterance for calling the voice agent, and end the dialog mode if no voice is detected for a specified time or longer through the at least one external microphone in the dialog mode.

Wen executed by the processor, the instructions may cause the wireless audio device to detect a voice by using the at least one internal microphone, detect an acceleration by an utterance of the voice of the user by using the acceleration sensor, and detect the utterance of the user in response to the detection of the voice and the detection of the acceleration.

When executed by the processor, the instructions may cause the wireless audio device to acquire the ambient sounds by using the at least one external microphone, and set a length of the specified time based on a noise of the ambient sounds.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A wireless audio device comprising:
an audio receiving circuit;
an audio output circuit;
an acceleration sensor;
a communication circuit;
one or more processors; and
memory storing one or more computer programs including computer-executable instructions that, when executed by the one or more processors, cause the wireless audio device to:
detect an utterance of a user of the wireless audio device by using the acceleration sensor and at least one internal microphone facing the user,
in response to detecting the utterance of the user, enter into a dialog mode in which at least some of ambient sounds received by the audio receiving circuit are output through the audio output circuit,
determine whether a voice is detected during a specified time by using at least one external microphone exposed to an outside, and
based on no voice being detected for the specified time or longer by using the audio receiving circuit in the dialog mode, end the dialog mode.

2. The wireless audio device of claim 1, wherein the one or more computer programs further include instructions that, when executed by the one or more processors, cause the wireless audio device to:
detect a voice by using the audio receiving circuit;
detect an acceleration corresponding to an utterance of the voice by using the acceleration sensor; and
in response to detecting the voice and detecting the acceleration, detect the utterance of the user.

3. The wireless audio device of claim 2, wherein the acceleration corresponding to the utterance of the voice is generated by the utterance of the user.

4. The wireless audio device of claim 1, wherein, based on the user wearing the audio receiving circuit, the audio receiving circuit includes the at least one internal microphone facing the user and the at least one external microphone exposed to the outside.

5. The wireless audio device of claim 4, wherein the one or more computer programs further include instructions that, when executed by the one or more processors, cause the wireless audio device to:
acquire an audio signal by using the at least one external microphone; and
control an output of ambient sounds based on a noise intensity of the audio signal.

6. The wireless audio device of claim 5,
wherein the one or more computer programs further include instructions that, when executed by the one or more processors, cause the wireless audio device to:
emphasize a frequency band corresponding to a voice among the ambient sounds for a section in which the voice is detected among the ambient sounds.

7. The wireless audio device of claim 4,
wherein the one or more computer programs further include instructions that, when executed by the one or more processors, cause the wireless audio device to:
acquire the ambient sounds by using the at least one external microphone; and
set a length of the specified time based on a noise of the ambient sounds.

8. The wireless audio device of claim 1, wherein the one or more computer programs further include instructions that, when executed by the one or more processors, cause the wireless audio device to:
based on the utterance of the user not corresponding to a wake-up utterance for calling a voice agent, enter the dialog mode; and
based on the utterance of the user corresponding to the wake-up utterance, refrain from entering the dialog mode.

9. The wireless audio device of claim 1, wherein the one or more computer programs further include instructions that, when executed by the one or more processors, cause the wireless audio device to:

based on entering the dialog mode, deactivate active noise cancelling (ANC).

10. The wireless audio device of claim 9, wherein the one or more computer programs further include instructions that, when executed by the one or more processors, cause the wireless audio device to:
based on ending the dialog mode, return the ANC to a state before entering the dialog mode.

11. A method for controlling a dialog mode of a wireless audio device, the method comprising:
detecting, by the wireless audio device, an utterance of a user of the wireless audio device based on an acceleration of the wireless audio device and at least one internal microphone facing the user;
in response to detecting the utterance of the user, entering, by the wireless audio device, into a dialog mode for outputting at least some of ambient sounds;
determining, by the wireless audio device, whether a voice is detected during a specified time by using at least one external microphone exposed to an outside; and
based on no voice is-being detected for the specified time or longer in the dialog mode, ending, by the wireless audio device, the dialog mode.

12. The method of claim 11, wherein the detecting of the utterance of the user of the wireless audio device includes:
detecting, by the wireless audio device, a voice by using an audio receiving circuit of the wireless audio device;
detecting, by the wireless audio device, an acceleration corresponding to an utterance of the voice by using an acceleration sensor of the wireless audio device; and
in response to detecting the voice and detecting the acceleration, detecting, by the wireless audio device, the utterance of the user.

13. The method of claim 12, wherein the acceleration corresponding to the utterance of the voice is generated by the utterance of the user.

14. The method of claim 11, further comprising:
acquiring, by the wireless audio device, the ambient sounds in the dialog mode; and
controlling, by the wireless audio device, an output of ambient sounds based on a noise intensity of the ambient sounds.

15. The method of claim 14, wherein the controlling of the output of ambient sounds includes emphasizing, by the wireless audio device, a frequency band corresponding to a voice among the ambient sounds for a section in which the voice is detected among the ambient sounds.

16. The method of claim 14, further comprising:
setting, by the wireless audio device, a length of the specified time based on the noise intensity of the ambient sounds.

17. The method of claim 11, wherein the detecting of the utterance of the user of the wireless audio device comprises:
determining, by the wireless audio device, whether a voice signal from the user includes a wake-up utterance for calling a voice agent; and
based on the voice signal not corresponding to the wake-up utterance for calling the voice agent, detecting, by the wireless audio device, the voice signal as the utterance of the user based on the acceleration.

18. A wireless audio device comprising:
at least one internal microphone facing a user when the wireless audio device is worn;
at least one external microphone exposed to an outside when the wireless audio device is worn;
an audio output circuit;
an acceleration sensor;
a communication circuit;
one or more processors; and
memory storing one or more computer programs including computer-executable instructions that, when executed by the one or more processors, cause the wireless audio device to:
detect an utterance of a user of the wireless audio device by using the at least one internal microphone and the acceleration sensor,
determine whether the utterance of the user corresponds to an utterance for calling a voice agent,
based on the utterance of the user not corresponding to the utterance for calling the voice agent, enter into a dialog mode in which at least some of ambient sounds received by the at least one external microphone are output through the audio output circuit, and
based on no voice being detected for a specified time or longer through the at least one external microphone in the dialog mode, end the dialog mode.

19. The wireless audio device of claim 18, wherein the one or more computer programs further include instructions that, when executed by the one or more processors, cause the wireless audio device to:
detect a voice by using the at least one internal microphone;
detect an acceleration by an utterance of the voice of the user by using the acceleration sensor; and
in response to detecting the voice and detecting the acceleration, detect the utterance of the user.

20. The wireless audio device of claim 19, wherein the one or more computer programs further include instructions that, when executed by the one or more processors, cause the wireless audio device to:
acquire the ambient sounds by using the at least one external microphone; and
set a length of the specified time based on a noise of the ambient sounds.

\* \* \* \* \*